(12) United States Patent
Berkovich et al.

(10) Patent No.: US 12,244,936 B2
(45) Date of Patent: Mar. 4, 2025

(54) ON-SENSOR IMAGE PROCESSOR UTILIZING CONTEXTUAL DATA

(71) Applicant: Meta Platforms Technologies, LLC, Menlo Park, CA (US)

(72) Inventors: Andrew Samuel Berkovich, Bellevue, WA (US); Xinqiao Liu, Medina, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 41 days.

(21) Appl. No.: 18/148,834

(22) Filed: Dec. 30, 2022

(65) Prior Publication Data

US 2023/0239582 A1    Jul. 27, 2023

Related U.S. Application Data

(60) Provisional application No. 63/303,214, filed on Jan. 26, 2022.

(51) Int. Cl.
*H04N 23/84* (2023.01)
*G02B 27/01* (2006.01)
(Continued)

(52) U.S. Cl.
CPC ........... *H04N 23/84* (2023.01); *G02B 27/017* (2013.01); *H01L 27/14641* (2013.01);
(Continued)

(58) Field of Classification Search
CPC ...... H04N 25/78; H04N 25/772; H04N 23/84; G02B 27/017; G02B 2027/0178; H01L 27/14641; H01L 27/14645
(Continued)

(56) References Cited

U.S. PATENT DOCUMENTS

| 4,121,896 A | 10/1978 | Shepherd |
| 6,384,905 B1 | 5/2002 | Barrows |

(Continued)

FOREIGN PATENT DOCUMENTS

| CN | 102665049 A | 9/2012 |
| CN | 103207716 A | 7/2013 |

(Continued)

OTHER PUBLICATIONS

Advisory Action mailed Oct. 1, 2021 for U.S. Appl. No. 17/083,920, filed Oct. 29, 2020, 4 pages.
(Continued)

*Primary Examiner* — Pritham D Prabhakher
(74) *Attorney, Agent, or Firm* — Kilpatrick Townsend & Stockton LLP

(57) ABSTRACT

In some examples, a sensor apparatus comprises: an array of pixel cells each including one or more photodiodes configured to generate a charge in response to light, and a charge storage device to convert the charge to output a voltage of an array of voltages, one or more an analog-to-digital converter (ADC) configured the convert the array of voltages to first pixel data, and an on-sensor controller configured to input the first pixel data into a machine-learning model to generate output data comprising prediction data associated with one or more features of the first pixel data, generate, based on the prediction data, second pixel data, the second pixel data associated with one or more transformed features of the first pixel data, and send, from the sensor apparatus to a separate receiving apparatus, the second pixel data.

20 Claims, 32 Drawing Sheets

(51) Int. Cl.
*H01L 27/146* (2006.01)
*H04N 25/772* (2023.01)

(52) U.S. Cl.
CPC ..... *H01L 27/14645* (2013.01); *H04N 25/772* (2023.01); *G02B 2027/0178* (2013.01)

(58) Field of Classification Search
USPC .......................................................... 348/272
See application file for complete search history.

(56) References Cited

U.S. PATENT DOCUMENTS

| | | |
|---|---|---|
| 6,853,579 B1 | 2/2005 | Chou |
| 7,359,275 B1 | 4/2008 | Wu |
| 7,362,355 B1 | 4/2008 | Yang et al. |
| 7,659,925 B2 | 2/2010 | Krymski |
| 7,920,409 B1 | 4/2011 | Clark et al. |
| 7,956,914 B2 | 6/2011 | Xu |
| 7,969,759 B1 | 6/2011 | Thummalapally et al. |
| 8,134,623 B2 | 3/2012 | Purcell et al. |
| 8,441,535 B2 | 5/2013 | Morin |
| 8,675,110 B2 | 3/2014 | Hirai et al. |
| 8,779,346 B2 | 7/2014 | Fowler et al. |
| 9,094,629 B2 | 7/2015 | Ishibashi |
| 9,210,330 B2 | 12/2015 | Seo |
| 9,282,264 B2 | 3/2016 | Park et al. |
| 9,363,454 B2 | 6/2016 | Ito et al. |
| 9,560,296 B2 | 1/2017 | Hseih et al. |
| 9,646,681 B1 | 5/2017 | Jung et al. |
| 9,723,233 B2 | 8/2017 | Grauer et al. |
| 9,743,024 B2 | 8/2017 | Tyrrell et al. |
| 9,826,175 B2 | 11/2017 | Isobe |
| 9,832,370 B2 | 11/2017 | Cho et al. |
| 9,912,885 B2 | 3/2018 | Isobe |
| 9,955,091 B1 | 4/2018 | Dai et al. |
| 10,007,350 B1 | 6/2018 | Holz et al. |
| 10,090,342 B1 | 10/2018 | Gambino et al. |
| 10,096,631 B2 | 10/2018 | Ishizu |
| 10,154,221 B2 | 12/2018 | Ogino et al. |
| 10,157,951 B2 | 12/2018 | Kim et al. |
| 10,274,730 B2 | 4/2019 | Jepsen et al. |
| 10,321,081 B2 | 6/2019 | Watanabe et al. |
| 10,345,447 B1 | 7/2019 | Hicks |
| 10,419,701 B2 | 9/2019 | Liu |
| 10,484,628 B2 | 11/2019 | Zhang et al. |
| 10,515,284 B2 | 12/2019 | Gousev et al. |
| 10,594,974 B2 | 3/2020 | Ivarsson et al. |
| 10,607,413 B1 | 3/2020 | Marcolina et al. |
| 10,715,824 B2 | 7/2020 | Tall et al. |
| 10,726,627 B2 | 7/2020 | Liu |
| 10,764,574 B2 * | 9/2020 | Teo ...................... H04N 19/103 |
| 10,867,655 B1 | 12/2020 | Harms et al. |
| 10,897,586 B2 | 1/2021 | Liu et al. |
| 10,915,995 B2 | 2/2021 | Moloney |
| 10,939,062 B2 | 3/2021 | Ogawa et al. |
| 10,970,619 B1 | 4/2021 | Xiao et al. |
| 10,984,235 B2 | 4/2021 | Gousev et al. |
| 10,999,539 B2 | 5/2021 | Wendel et al. |
| 11,057,581 B2 | 7/2021 | Liu |
| 11,126,497 B2 | 9/2021 | Oh et al. |
| 11,204,835 B2 | 12/2021 | Lu et al. |
| 11,315,330 B1 | 4/2022 | Liu |
| 11,449,977 B2 * | 9/2022 | Steiman ................. G06N 3/048 |
| 11,568,609 B1 | 1/2023 | Liu et al. |
| 11,630,724 B2 | 4/2023 | Shin et al. |
| 11,825,228 B2 | 11/2023 | Berkovich et al. |
| 11,888,002 B2 | 1/2024 | Berkovich et al. |
| 11,910,114 B2 | 2/2024 | Berkovich |
| 11,935,291 B2 | 3/2024 | Berkovich et al. |
| 11,948,089 B2 | 4/2024 | Berkovich et al. |
| 11,960,638 B2 | 4/2024 | Berkovich et al. |
| 11,962,928 B2 | 4/2024 | Reyserhove et al. |
| 12,015,835 B2 * | 6/2024 | Galor Gluskin ....... H04N 23/16 |
| 2002/0113886 A1 | 8/2002 | Hynecek |
| 2003/0005231 A1 | 1/2003 | Ooi et al. |
| 2003/0020100 A1 | 1/2003 | Guidash |
| 2005/0057389 A1 | 3/2005 | Krymski |
| 2005/0058773 A1 | 3/2005 | Hasei et al. |
| 2005/0073874 A1 | 4/2005 | Chan et al. |
| 2005/0237380 A1 | 10/2005 | Kakii et al. |
| 2006/0224792 A1 | 10/2006 | Ooi |
| 2007/0076109 A1 | 4/2007 | Krymski |
| 2007/0222881 A1 | 9/2007 | Mentzer |
| 2008/0007731 A1 | 1/2008 | Botchway et al. |
| 2008/0055736 A1 | 3/2008 | Tsuji et al. |
| 2008/0226170 A1 | 9/2008 | Sonoda |
| 2009/0033588 A1 | 2/2009 | Kajita et al. |
| 2009/0245637 A1 | 10/2009 | Barman et al. |
| 2010/0182468 A1 | 7/2010 | Posch et al. |
| 2010/0194956 A1 | 8/2010 | Yuan et al. |
| 2010/0197821 A1 | 8/2010 | Jeong et al. |
| 2010/0197876 A1 | 8/2010 | Lyu et al. |
| 2010/0245600 A1 | 9/2010 | Chang et al. |
| 2010/0276572 A1 | 11/2010 | Iwabuchi et al. |
| 2011/0055461 A1 | 3/2011 | Steiner et al. |
| 2011/0075470 A1 | 3/2011 | Liaw |
| 2011/0155892 A1 | 6/2011 | Neter et al. |
| 2011/0254986 A1 | 10/2011 | Nishimura et al. |
| 2011/0267362 A1 | 11/2011 | Handschy et al. |
| 2012/0002459 A1 | 1/2012 | Rimondi et al. |
| 2012/0002460 A1 | 1/2012 | Rimondi et al. |
| 2012/0044399 A1 | 2/2012 | Hirai et al. |
| 2012/0086082 A1 | 4/2012 | Malinge et al. |
| 2012/0105475 A1 | 5/2012 | Tseng |
| 2012/0105668 A1 | 5/2012 | Velarde et al. |
| 2012/0113119 A1 | 5/2012 | Massie |
| 2012/0133807 A1 | 5/2012 | Wu et al. |
| 2012/0161088 A1 | 6/2012 | Choi et al. |
| 2012/0198312 A1 | 8/2012 | Kankani et al. |
| 2012/0200499 A1 | 8/2012 | Osterhout et al. |
| 2012/0212465 A1 | 8/2012 | White et al. |
| 2012/0240007 A1 | 9/2012 | Barndt et al. |
| 2012/0262616 A1 | 10/2012 | Sa et al. |
| 2013/0056809 A1 | 3/2013 | Mao et al. |
| 2013/0057742 A1 | 3/2013 | Nakamura et al. |
| 2013/0068929 A1 | 3/2013 | Solhusvik et al. |
| 2013/0069787 A1 | 3/2013 | Petrou |
| 2013/0120642 A1 | 5/2013 | Kim |
| 2013/0141619 A1 | 6/2013 | Lim et al. |
| 2013/0185609 A1 | 7/2013 | Park et al. |
| 2013/0187027 A1 | 7/2013 | Qiao et al. |
| 2013/0198577 A1 | 8/2013 | Oh et al. |
| 2013/0207219 A1 | 8/2013 | Ahn |
| 2013/0215290 A1 | 8/2013 | Solhusvik et al. |
| 2013/0293753 A1 | 11/2013 | Keelan et al. |
| 2013/0299674 A1 | 11/2013 | Fowler et al. |
| 2013/0300009 A1 | 11/2013 | Oganesian et al. |
| 2013/0314591 A1 | 11/2013 | Eromaki |
| 2013/0326116 A1 | 12/2013 | Goss et al. |
| 2014/0042299 A1 | 2/2014 | Wan et al. |
| 2014/0055635 A1 | 2/2014 | Seo |
| 2014/0063250 A1 | 3/2014 | Park |
| 2014/0170345 A1 | 6/2014 | Aoshima et al. |
| 2014/0247382 A1 | 9/2014 | Moldovan et al. |
| 2014/0368687 A1 | 12/2014 | Yu et al. |
| 2015/0050479 A1 | 2/2015 | Nakamura et al. |
| 2015/0050480 A1 | 2/2015 | Suzuki et al. |
| 2015/0085134 A1 | 3/2015 | Novotny et al. |
| 2015/0158259 A1 | 6/2015 | Yamamoto et al. |
| 2015/0189209 A1 | 7/2015 | Yang et al. |
| 2015/0201142 A1 | 7/2015 | Smith et al. |
| 2015/0222827 A1 | 8/2015 | Isobe |
| 2015/0229859 A1 | 8/2015 | Guidash et al. |
| 2015/0279884 A1 | 10/2015 | Kusumoto |
| 2015/0309311 A1 | 10/2015 | Cho |
| 2015/0309316 A1 | 10/2015 | Osterhout et al. |
| 2015/0312502 A1 | 10/2015 | Borremans |
| 2015/0358571 A1 | 12/2015 | Dominguez Castro et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0028974 A1 | 1/2016 | Guidash et al. |
| 2016/0032074 A1 | 2/2016 | Aizenberg et al. |

(56) References Cited

U.S. PATENT DOCUMENTS

| | | |
|---|---|---|
| 2016/0048964 A1 | 2/2016 | Kruglick |
| 2016/0078614 A1 | 3/2016 | Ryu et al. |
| 2016/0088253 A1 | 3/2016 | Tezuka |
| 2016/0100115 A1 | 4/2016 | Kusano |
| 2016/0105656 A1 | 4/2016 | Lin et al. |
| 2016/0117829 A1 | 4/2016 | Yoon et al. |
| 2016/0165160 A1 | 6/2016 | Hseih et al. |
| 2016/0210785 A1 | 7/2016 | Balachandreswaran et al. |
| 2016/0256039 A1 | 9/2016 | Fukunaga |
| 2016/0295148 A1 | 10/2016 | Lin et al. |
| 2016/0344965 A1 | 11/2016 | Grauer et al. |
| 2016/0360127 A1 | 12/2016 | Dierickx et al. |
| 2017/0039906 A1 | 2/2017 | Jepsen |
| 2017/0041571 A1 | 2/2017 | Tyrrell et al. |
| 2017/0117310 A1 | 4/2017 | Tatani et al. |
| 2017/0154909 A1 | 6/2017 | Ishizu |
| 2017/0161579 A1 | 6/2017 | Gousev et al. |
| 2017/0228345 A1 | 8/2017 | Gupta et al. |
| 2017/0248789 A1 | 8/2017 | Yokoyama |
| 2017/0270664 A1 | 9/2017 | Hoogi et al. |
| 2017/0272768 A1 | 9/2017 | Tall et al. |
| 2017/0280031 A1 | 9/2017 | Price et al. |
| 2017/0293799 A1 | 10/2017 | Skogö et al. |
| 2017/0307887 A1 | 10/2017 | Stenberg et al. |
| 2017/0310910 A1 | 10/2017 | Smith et al. |
| 2017/0338262 A1 | 11/2017 | Hirata |
| 2017/0339327 A1 | 11/2017 | Koshkin et al. |
| 2018/0027174 A1 | 1/2018 | Sengoku |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0167575 A1 | 6/2018 | Watanabe et al. |
| 2018/0176545 A1 | 6/2018 | Aflaki Beni |
| 2018/0192046 A1* | 7/2018 | Teo .............. H04N 19/176 |
| 2018/0204867 A1 | 7/2018 | Kim et al. |
| 2018/0211582 A1 | 7/2018 | Sakariya et al. |
| 2018/0224658 A1 | 8/2018 | Teller |
| 2018/0239108 A1 | 8/2018 | Ishii et al. |
| 2018/0241953 A1 | 8/2018 | Johnson |
| 2018/0252857 A1 | 9/2018 | Glik et al. |
| 2018/0270436 A1 | 9/2018 | Ivarsson et al. |
| 2018/0276841 A1 | 9/2018 | Krishnaswamy et al. |
| 2018/0284594 A1 | 10/2018 | Gao |
| 2018/0288344 A1 | 10/2018 | Chu et al. |
| 2018/0376090 A1 | 12/2018 | Liu |
| 2019/0019023 A1 | 1/2019 | Konttori et al. |
| 2019/0027454 A1 | 1/2019 | Chen et al. |
| 2019/0035154 A1 | 1/2019 | Liu |
| 2019/0046044 A1 | 2/2019 | Tzvieli et al. |
| 2019/0098232 A1 | 3/2019 | Mori et al. |
| 2019/0110039 A1 | 4/2019 | Linde et al. |
| 2019/0123088 A1 | 4/2019 | Kwon |
| 2019/0149751 A1 | 5/2019 | Wise |
| 2019/0172227 A1 | 6/2019 | Kasahara |
| 2019/0191116 A1 | 6/2019 | Madurawe |
| 2019/0199946 A1 | 6/2019 | Wendel et al. |
| 2019/0204527 A1 | 7/2019 | Nakajima |
| 2019/0230306 A1 | 7/2019 | Liu |
| 2019/0246036 A1 | 8/2019 | Wu et al. |
| 2019/0253650 A1 | 8/2019 | Kim |
| 2019/0307313 A1 | 10/2019 | Wade |
| 2019/0331914 A1 | 10/2019 | Lee et al. |
| 2019/0361250 A1 | 11/2019 | Lanman et al. |
| 2019/0363118 A1 | 11/2019 | Berkovich et al. |
| 2020/0035661 A1 | 1/2020 | Yu et al. |
| 2020/0053299 A1 | 2/2020 | Zhang et al. |
| 2020/0098096 A1 | 3/2020 | Moloney |
| 2020/0193206 A1 | 6/2020 | Turkelson et al. |
| 2020/0195828 A1 | 6/2020 | Reyserhove et al. |
| 2020/0195875 A1 | 6/2020 | Berkovich et al. |
| 2020/0228740 A1 | 7/2020 | Otaka |
| 2020/0273784 A1 | 8/2020 | Mallik et al. |
| 2020/0280689 A1 | 9/2020 | Takahashi et al. |
| 2020/0351492 A1* | 11/2020 | Teo ................ H04N 19/14 |
| 2021/0026796 A1 | 1/2021 | Graif et al. |
| 2021/0044742 A1 | 2/2021 | Berkovich et al. |
| 2021/0075982 A1 | 3/2021 | Wojciechowski et al. |
| 2021/0084249 A1 | 3/2021 | Nakazawa et al. |
| 2021/0110187 A1 | 4/2021 | Pillai et al. |
| 2021/0118847 A1 | 4/2021 | Chuang et al. |
| 2021/0133452 A1 | 5/2021 | Berkovich et al. |
| 2021/0142086 A1 | 5/2021 | Berkovich et al. |
| 2021/0144326 A1 | 5/2021 | Sato et al. |
| 2021/0152758 A1 | 5/2021 | Muraoka |
| 2021/0152764 A1* | 5/2021 | Hayashi .............. H04N 25/779 |
| 2021/0185199 A1 | 6/2021 | Schneider, Jr. et al. |
| 2021/0185264 A1 | 6/2021 | Wong et al. |
| 2021/0227159 A1 | 7/2021 | Sambonsugi |
| 2021/0264679 A1 | 8/2021 | Liu et al. |
| 2021/0281794 A1 | 9/2021 | Yoda |
| 2021/0283871 A1 | 9/2021 | Lee et al. |
| 2021/0289156 A1 | 9/2021 | Hanzawa et al. |
| 2021/0306586 A1 | 9/2021 | Yamamoto et al. |
| 2021/0337148 A1 | 10/2021 | Powell |
| 2021/0368124 A1 | 11/2021 | Berkovich et al. |
| 2021/0377496 A1 | 12/2021 | Kim et al. |
| 2021/0409625 A1 | 12/2021 | Zhu et al. |
| 2022/0021833 A1 | 1/2022 | Berkovich |
| 2022/0036538 A1* | 2/2022 | Steiman ................ G06N 3/047 |
| 2022/0076726 A1 | 3/2022 | Hulton et al. |
| 2022/0083807 A1* | 3/2022 | Zhang .................. G06N 3/084 |
| 2022/0198677 A1* | 6/2022 | Bisain .................. G06T 7/174 |
| 2022/0397419 A1* | 12/2022 | Stenneth ............ G01C 21/3885 |
| 2023/0080288 A1 | 3/2023 | Berkovich et al. |
| 2023/0143034 A1* | 5/2023 | Wu .................... G06T 17/00 |
| | | 345/423 |
| 2023/0146181 A1* | 5/2023 | Meshkin ................ G06N 3/04 |
| | | 382/274 |
| 2023/0234233 A1* | 7/2023 | Goyal .................. G06T 7/269 |
| 2023/0239582 A1 | 7/2023 | Berkovich et al. |

FOREIGN PATENT DOCUMENTS

| | | |
|---|---|---|
| CN | 103907133 A | 7/2014 |
| CN | 104204904 A | 12/2014 |
| CN | 106233188 A | 12/2016 |
| CN | 106255978 A | 12/2016 |
| CN | 106791504 A | 5/2017 |
| CN | 107005641 A | 8/2017 |
| CN | 108139799 A | 6/2018 |
| CN | 109298528 A | 2/2019 |
| DE | 102015122055 A1 | 6/2017 |
| EP | 0775591 A2 | 5/1997 |
| EP | 1603170 A1 | 12/2005 |
| EP | 1746820 A1 | 1/2007 |
| EP | 1788802 A1 | 5/2007 |
| EP | 2037505 A1 | 3/2009 |
| EP | 2228846 A1 | 9/2010 |
| EP | 2330173 A2 | 6/2011 |
| EP | 2357679 A2 | 8/2011 |
| EP | 2804074 A2 | 11/2014 |
| EP | 3229457 A1 | 10/2017 |
| EP | 3595296 A1 | 1/2020 |
| EP | 3833005 A1 | 6/2021 |
| JP | H10143122 A | 5/1998 |
| JP | 2003319262 A | 11/2003 |
| JP | 2005129139 A | 5/2005 |
| JP | 2006113139 A | 4/2006 |
| JP | 2006348085 A | 12/2006 |
| JP | 2008507874 A | 3/2008 |
| JP | 2008228232 A | 9/2008 |
| JP | 2008270500 A | 11/2008 |
| JP | 2013043383 A | 3/2013 |
| JP | 2014531820 A | 11/2014 |
| JP | 2016504890 A | 2/2016 |
| JP | 2017060155 A | 3/2017 |
| JP | 2019110409 A | 7/2019 |
| KR | 20110100974 A | 9/2011 |
| WO | WO-2006022077 A1 | 3/2006 |
| WO | WO-2014055391 A2 | 4/2014 |
| WO | WO-2016042734 A1 | 3/2016 |
| WO | WO-2016088840 A1 | 6/2016 |
| WO | WO-2016095057 A1 | 6/2016 |
| WO | WO-2017003477 A1 | 1/2017 |

(56) References Cited

FOREIGN PATENT DOCUMENTS

| WO | WO-2017013806 A1 | 1/2017 |
|---|---|---|
| WO | WO-2017047010 A1 | 3/2017 |
| WO | WO-2018163554 A1 | 9/2018 |
| WO | WO-2018231962 A1 | 12/2018 |
| WO | WO-2019018084 A1 | 1/2019 |
| WO | WO-2019111528 A1 | 6/2019 |
| WO | WO-2019145578 A1 | 8/2019 |
| WO | WO-2019178060 A1 | 9/2019 |
| WO | WO-2019244142 A2 | 12/2019 |
| WO | WO-2020077283 A1 | 4/2020 |

OTHER PUBLICATIONS

Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Amir M.F., et al., "NeuroSensor: A 3D Image Sensor with Integrated Neural Accelerator," IEEE SOI-3D-Subthreshold Microelectronics Technology Unified Conference (S3S), Oct. 2016, pp. 1-2.
Cho K., et al., "A Low Power Dual CDS for a Column-Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architecture for Deep Convolutional Neural Networks Approximate Computation," Journal of Computer Research and Development, Jun. 30, 2017, vol. 54 (6), pp. 1367-1380.
Corrected Notice of Allowability mailed Apr. 9, 2021 for U.S. Appl. No. 16/255,528, filed Jan. 23, 2019, 5 Pages.
Corrected Notice of Allowance mailed Oct. 13, 2023 for U.S. Appl. No. 17/324,803, filed May 19, 2021, 2 pages.
Corrected Notice of Allowance mailed Apr. 18, 2023 for U.S. Appl. No. 17/127,670, filed Mar. 5, 2021, 2 pages.
Corrected Notice of Allowance mailed Mar. 22, 2022 for U.S. Appl. No. 16/716,050, filed Dec. 16, 2019, 2 Pages.
Devlin N.R., et al., "Patterning Decomposable Polynorbornene with Electron Beam Lithography to Create Nanochannels," Journal of Vacuum Science and Technology, vol. 27, No. 6,Dec. 1, 2009, pp. 2508-2511.
Dong J., et al., "Self-Assembly of Highly Stable Zirconium(IV) Coordination Cages with Aggregation Induced Emission Molecular Rotors for Live-Cell Imaging," Angewandte Chemie International Edition, vol. 59, No. 25,Jun. 15, 2020,10 pages.
Extended European Search Report for European Application No. 18179846.3, mailed Dec. 7, 2018, 10 Pages.
Extended European Search Report for European Application No. 18179851.3, mailed Dec. 7, 2018, 8 Pages.
Extended European Search Report for European Application No. 19743908.6, mailed Sep. 30, 2020, 9 Pages.
Final Office Action mailed Oct. 6, 2022 for U.S. Appl. No. 17/127,670, filed Dec. 18, 2020, 20 pages.
Final Office Action mailed Apr. 12, 2023 for U.S. Appl. No. 16/983,863, filed Aug. 3, 2020, 21 pages.
Final Office Action mailed Oct. 18, 2021 for U.S. Appl. No. 16/716,050, filed Dec. 16, 2019, 18 Pages.
Final Office Action mailed Oct. 21, 2021 for U.S. Appl. No. 16/421,441, filed May 23, 2019, 23 Pages.
Final Office Action mailed Sep. 25, 2023 for U.S. Appl. No. 17/469,258, filed Sep. 8, 2021, 17 pages.
Final Office Action mailed Jan. 27, 2021 for U.S. Appl. No. 16/255,528, filed Jan. 23, 2019, 31 Pages.
Final Office Action mailed Jul. 28, 2021 for U.S. Appl. No. 17/083,920, filed Oct. 29, 2020,19 Pages.
International Preliminary Report on Patentability for International Application No. PCT/US2020/044807, mailed Feb. 17, 2022, 10 pages.
International Preliminary Report on Patentability for International Application No. PCT/US2020/058439, mailed Jun. 23, 2022, 11 pages.
International Preliminary Report on Patentability for International Application No. PCT/US2020/059560, mailed Jun. 16, 2022, 8 pages.
International Preliminary Report on Patentability for International Application No. PCT/US2020/061218, mailed Jun. 9, 2022, 9 pages.
International Preliminary Report on Patentability for International Application No. PCT/US2020/062991, mailed Jul. 7, 2022, 8 pages.
International Preliminary Report on Patentability for International Application No. PCT/US2020/066992, mailed Jul. 7, 2022, 27 pages.
International Preliminary Report on Patentability for International Application No. PCT/US2021/014970, mailed Sep. 9, 2022, 7 pages.
International Preliminary Report on Patentability for International Application No. PCT/US2021/016158, mailed Aug. 18, 2022, 7 pages.
International Preliminary Report on Patentability for International Application No. PCT/US2023/011630, mailed Aug. 8, 2024, 9 pages.
International Search Report and Written Opinion for International Application No. PCT/US2018/039350, mailed Nov. 15, 2018, 11 Pages.
International Search Report and Written Opinion for International Application No. PCT/US2018/039352, mailed Oct. 26, 2018, 8 Pages.
International Search Report and Written Opinion for International Application No. PCT/US2018/039431, mailed Nov. 7, 2018, 12 Pages.
International Search Report and Written Opinion for International Application No. PCT/US2019/034007, mailed Oct. 28, 2019, 18 Pages.
International Search Report and Written Opinion for International Application No. PCT/US2019/066805, mailed Mar. 6, 2020, 9 Pages.
International Search Report and Written Opinion for International Application No. PCT/US2019/066831, mailed Feb. 27, 2020, 11 Pages.
International Search Report and Written Opinion for International Application No. PCT/US2020/044807, mailed Sep. 30, 2020, 12 Pages.
International Search Report and Written Opinion for International Application No. PCT/US2020/056758, mailed Feb. 17, 2021, 11 Pages.
International Search Report and Written Opinion for International Application No. PCT/US2020/058097, mailed Feb. 12, 2021,09 Pages.
International Search Report and Written Opinion for International Application No. PCT/US2020/058439, mailed Apr. 6, 2021, 16 Pages.
International Search Report and Written Opinion for International Application No. PCT/US2020/059560, mailed Feb. 9, 2021, 9 Pages.
International Search Report and Written Opinion for International Application No. PCT/US2020/059636, mailed Feb. 11, 2021, 18 Pages.
International Search Report and Written Opinion for International Application No. PCT/US2020/061218, mailed Feb. 16, 2021, 11 pages.
International Search Report and Written Opinion for International Application No. PCT/US2020/062991, mailed Feb. 24, 2021, 9 Pages.
International Search Report and Written Opinion for International Application No. PCT/US2020/066992, mailed May 17, 2021, 31 Pages.
International Search Report and Written Opinion for International Application No. PCT/US2021/014970, mailed Apr. 26, 2021,8 Pages.
International Search Report and Written Opinion for International Application No. PCT/US2021/031201, mailed Aug. 2, 2021, 13 Pages.

(56) References Cited

OTHER PUBLICATIONS

International Search Report and Written Opinion for International Application No. PCT/US2021/033321, mailed Sep. 6, 2021, 11 pages.
International Search Report and Written Opinion for International Application No. PCT/US2022/034259, mailed Oct. 21, 2022, 10 pages.
International Search Report and Written Opinion for International Application No. PCT/US2023/011630, mailed Apr. 6, 2023, 10 pages.
Invitation to Pay Additional Fees and Where Applicable, Protest Fee for International Application No. PCT/US2021/041775, Oct. 8, 2021, 12 pages.
Khaled S.R., "A Review of Piezoelectric Polymers as Functional Materials for Electromechanical Transducers," Smart Materials and Structures, IOP Publishing LTD, Bristol, GB, Jan. 20, 2014 [retrieved on Jan. 20, 2014], vol. 23 (3), Article 33001,29 pages, XP020258249, ISSN: 0964-1726, DOI: 10.1088/0964-1726/23/3/033001.
Levola T., "Diffractive Optics for Virtual Reality Displays," Journal of the Society for Information Display—SID, May 2006, vol. 14 (5), pp. 467-475, XP008093627.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action mailed Jan. 1, 2021 for U.S. Appl. No. 16/715,792, filed Dec. 16, 2019, 15 Pages.
Non-Final Office Action mailed Feb. 2, 2023 for U.S. Appl. No. 17/469,258, filed Sep. 8, 2021,17 pages.
Non-Final Office Action mailed Mar. 2, 2022 for U.S. Appl. No. 17/127,670, filed Dec. 18, 2020, 18 pages.
Non-Final Office Action mailed Nov. 2, 2022 for U.S. Appl. No. 16/983,863, filed Aug. 3, 2020, 20 pages.
Non-Final Office Action mailed Sep. 2, 2021 for U.S. Appl. No. 16/910,844, filed Jun. 24, 2020, 7 Pages.
Non-Final Office Action mailed Mar. 6, 2023 for U.S. Appl. No. 17/992,648, filed Nov. 22, 2022,24 pages.
Non-Final Office Action mailed May 7, 2021 for U.S. Appl. No. 16/421,441, filed May 23, 2019, 17 Pages.
Non-Final Office Action mailed Dec. 8, 2023 for U.S. Appl. No. 17/645,904, filed Dec. 23, 2021, 19 pages.
Non-Final Office Action mailed Jul. 10, 2020 for U.S. Appl. No. 16/255,528, filed Jan. 23, 2019, 27 Pages.
Non-Final Office Action mailed May 14, 2021 for U.S. Appl. No. 16/716,050, filed Dec. 16, 2019, 16 Pages.
Non-Final Office Action mailed Nov. 14, 2023 for U.S. Appl. No. 16/983,863, filed Aug. 3, 2020, 10 pages.
Non-Final Office Action mailed Apr. 21, 2021 for U.S. Appl. No. 17/083,920, filed Oct. 29, 2020, 17 Pages.
Non-Final Office Action mailed Oct. 21, 2021 for U.S. Appl. No. 17/083,920, filed Oct. 29, 2020, 19 Pages.
Non-Final Office Action mailed Jul. 22, 2021 for U.S. Appl. No. 16/834,605, filed Mar. 30, 2020, 12 pages.
Non-Final Office Action mailed Nov. 23, 2018 for U.S. Appl. No. 15/847,517, filed Dec. 19, 2017, 21 Pages.
Non-Final Office Action mailed Jul. 25, 2019 for U.S. Appl. No. 15/909,162, filed Mar. 1, 2018, 20 Pages.
Non-Final Office Action mailed Jun. 30, 2023 for U.S. Appl. No. 17/556,436, filed Dec. 20, 2021,25 pages.
Notice of Allowance mailed Apr. 1, 2021 for U.S. Appl. No. 16/255,528, filed Jan. 23, 2019, 7 Pages.
Notice of Allowance mailed Nov. 1, 2023 for U.S. Appl. No. 17/091,331, filed Nov. 6, 2020, 7 pages.
Notice of Allowance mailed Sep. 2, 2022 for U.S. Appl. No. 16/715,792, filed Dec. 16, 2019, 9 pages.
Notice of Allowance mailed Jan. 3, 2023 for U.S. Appl. No. 16/421,441, filed May 23, 2019,11 pages.
Notice of Allowance mailed Jan. 3, 2023 for U.S. Appl. No. 16/715,792, filed Dec. 16, 2019, 9 pages.
Notice of Allowance mailed Mar. 6, 2024 for U.S. Appl. No. 17/127,670, filed Dec. 18, 2020, 9 pages.
Notice of Allowance mailed Sep. 6, 2022 for U.S. Appl. No. 16/421,441, filed May 23, 2019, 17 pages.
Notice of Allowance mailed Feb. 7, 2022 for U.S. Appl. No. 17/324,803, filed May 19, 2021,8 pages.
Notice of Allowance mailed Feb. 7, 2023 for U.S. Appl. No. 17/083,920, filed Oct. 29, 2020,10 pages.
Notice of Allowance mailed Jun. 7, 2023 for U.S. Appl. No. 16/716,050, filed Dec. 16, 2019, 18 pages.
Notice of Allowance mailed Mar. 7, 2022 for U.S. Appl. No. 16/421,441, filed May 23, 2019, 18 pages.
Notice of Allowance mailed Feb. 8, 2023 for U.S. Appl. No. 17/324,803, filed May 19, 2021,8 pages.
Notice of Allowance mailed Sep. 8, 2022 for U.S. Appl. No. 17/324,803, filed May 19, 2021,8 pages.
Notice of Allowance mailed Sep. 9, 2022 for U.S. Appl. No. 17/083,920, filed Oct. 29, 2020, 10 pages.
Notice of Allowance mailed Sep. 9, 2022 for U.S. Appl. No. 17/091,331, filed Nov. 6, 2020, 2 pages.
Notice of Allowance mailed Mar. 11, 2022 for U.S. Appl. No. 16/716,050, filed Dec. 16, 2019, 13 pages.
Notice of Allowance mailed Dec. 12, 2023 for U.S. Appl. No. 17/992,648, filed Nov. 22, 2022, 10 pages.
Notice of Allowance mailed Sep. 12, 2023 for U.S. Appl. No. 17/324,803, filed May 19, 2021,2 pages.
Notice of Allowance mailed Oct. 13, 2023 for U.S. Appl. No. 16/421,441, filed May 23, 2019, 11 pages.
Notice of Allowance mailed Feb. 14, 2022 for U.S. Appl. No. 16/715,792, filed Dec. 16, 2019, 9 pages.
Notice of Allowance mailed Dec. 15, 2022 for U.S. Appl. No. 17/091,331, filed Nov. 6, 2020, 8 pages.
Notice of Allowance mailed May 15, 2023 for U.S. Appl. No. 16/421,441, filed May 23, 2019,10 pages.
Notice of Allowance mailed Nov. 15, 2023 for U.S. Appl. No. 17/083,920, filed Oct. 29, 2020, 12 pages.
Notice of Allowance mailed Sep. 15, 2023 for U.S. Appl. No. 16/716,050, filed Dec. 16, 2019, 18 pages.
Notice of Allowance mailed Apr. 16, 2021 for U.S. Appl. No. 16/715,792, filed Dec. 16, 2019, 10 Pages.
Notice of Allowance mailed Aug. 16, 2023 for U.S. Appl. No. 16/715,792, filed Dec. 16, 2019, 9 pages.
Notice of Allowance mailed Nov. 16, 2023 for U.S. Appl. No. 17/556,436, filed Dec. 20, 2021, 8 pages.
Notice of Allowance mailed Jun. 17, 2022 for U.S. Appl. No. 16/715,792, filed Dec. 16, 2019, 2 pages.
Notice of Allowance mailed Jul. 18, 2023 for U.S. Appl. No. 17/091,331, filed Nov. 6, 2020, 7 pages.
Notice of Allowance mailed Mar. 18, 2020 for U.S. Appl. No. 15/909,162, filed Mar. 1, 2018, 9 Pages.
Notice of Allowance mailed Apr. 19, 2023 for U.S. Appl. No. 16/715,792, filed Dec. 16, 2019, 9 pages.
Notice of Allowance mailed Apr. 19, 2024 for U.S. Appl. No. 17/469,258, filed Sep. 8, 2021, 9 pages.
Notice of Allowance mailed Sep. 19, 2022 forU.S. Appl. No. 16/716,050, filed Dec. 16, 2019, 13 pages.
Notice of Allowance mailed Jun. 2, 2022 for U.S. Appl. No. 16/716,050, filed Dec. 16, 2019, 13 pages.
Notice of Allowance mailed Apr. 20, 2022 for U.S. Appl. No. 17/083,920, filed Oct. 29, 2020, 06 pages.
Notice of Allowance mailed Aug. 22, 2023 for U.S. Appl. No. 17/992,648, filed Nov. 22, 2022, 10 pages.
Notice of Allowance mailed Dec. 22, 2021 for U.S. Appl. No. 16/910,844, filed Jun. 24, 2020, 7 pages.
Notice of Allowance mailed Feb. 22, 2022 for U.S. Appl. No. 17/083,920, filed Oct. 29, 2020, 10 pages.
Notice of Allowance mailed Mar. 22, 2022 for U.S. Appl. No. 16/834,605, filed Mar. 30, 2020, 8 pages.
Notice of Allowance mailed May 22, 2023 for U.S. Appl. No. 17/324,803, filed May 19, 2021,5 pages.
Notice of Allowance mailed May 22, 2024 for U.S. Appl. No. 16/983,863, filed Aug. 3, 2020, 10 pages.

(56) References Cited

OTHER PUBLICATIONS

Notice of Allowance mailed May 23, 2022 for U.S. Appl. No. 17/324,803, filed May 19, 2021,9 pages.
Notice of Allowance mailed Aug. 24, 2022 for U.S. Appl. No. 17/091,331, filed Nov. 6, 2020, 9 pages.
Notice of Allowance mailed Jun. 24, 2022 for U.S. Appl. No. 16/421,441, filed May 23, 2019, 17 pages.
Notice of Allowance mailed May 24, 2022 for U.S. Appl. No. 16/715,792, filed Dec. 16, 2019, 9 pages.
Notice of Allowance mailed Nov. 24, 2021 for U.S. Appl. No. 16/910,844, filed Jun. 24, 2020, 8 pages.
Notice of Allowance mailed Aug. 25, 2021 for U.S. Appl. No. 16/715,792, filed Dec. 16, 2019, 9 Pages.
Notice of Allowance mailed Jan. 26, 2023 for U.S. Appl. No. 16/716,050, filed Dec. 16, 2019,14 pages.
Notice of Allowance mailed Mar. 27, 2023 for U.S. Appl. No. 17/127,670, filed Dec. 18, 2020,9 pages.
Notice of Allowance mailed Feb. 28, 2024 for U.S. Appl. No. 16/421,441, filed May 23, 2019, 18 pages.
Notice of Allowance mailed Mar. 28, 2023 for U.S. Appl. No. 17/091,331, filed Nov. 6, 2020, 5 pages.
Notice of Allowance mailed Sep. 28, 2022 for U.S. Appl. No. 16/716,050, filed Dec. 16, 2019, 6 pages.
Notice of Allowance mailed Jun. 3, 2022 for U.S. Appl. No. 17/324,803, filed May 19, 2021, 6 pages.
Notice of Allowance mailed Aug. 30, 2023 for U.S. Appl. No. 17/324,803, filed May 19, 2021, 5 pages.
Notice of Allowance mailed May 31, 2022 for U.S. Appl. No. 16/706,859, filed Dec. 9, 2019, 13 pages.
Office Action mailed Jul. 3, 2020 for Chinese Application No. 201810821296, filed Jul. 24, 2018, 17 Pages.
Office Action mailed Sep. 3, 2024 for Japanese Patent Application No. 2022-520220, filed on Nov. 9, 2020, 9 pages.
Office Action mailed Sep. 5, 2023 for Japanese Patent Application No. 2020-561752, filed on Nov. 2, 2020, 5 pages.
Office Action mailed Aug. 6, 2024 for Japanese Patent Application No. 2021-571319, filed on Aug. 4, 2020, 6 pages.
Office Action mailed Dec. 7, 2023 for Chinese Application No. 201980092371.8, filed Dec. 17, 2019, 7 pages.
Office Action mailed Dec. 7, 2023 for Chinese Application No. 202080047086.7, filed Aug. 4, 2020, 7 pages.
Office Action mailed Mar. 9, 2021 for Chinese Application No. 201810821296, filed Jul. 24, 2018, 10 Pages.
Office Action mailed Aug. 11, 2022 for European Patent Application No. 19731047.7, filed May 24, 2019, 10 pages.
Office Action mailed Feb. 11, 2023 for Chinese Application No. 201980048866.0, filed May 24, 2019, 20 Pages.
Office Action mailed Dec. 12, 2023 for Japanese Patent Application No. 2021-526520, filed on Dec. 17, 2019, 5 pages.
Office Action mailed Feb. 13, 2023 for Taiwan Application No. 108146255, filed Dec. 17, 2019, 30 pages.
Office Action mailed Mar. 14, 2023 for Taiwan Application No. 108146257, filed Dec. 17, 2019, 25 pages.
Office Action mailed Aug. 17, 2022 for Chinese Application No. 201980083991.5, filed Jun. 17, 2021,24 pages.
Office Action mailed Jul. 18, 2024 for Chinese Application No. 202080047086.7, filed Aug. 4, 2020, 6 pages.
Office Action mailed Sep. 20, 2023 for Taiwan Application No. 109139740, filed Nov. 13, 2020, 17 pages.
Office Action mailed Mar. 22, 2024 for European Patent Application No. 20757783.4, filed on Aug. 4, 2020, 6 pages.
Office Action mailed Mar. 23, 2023 for Chinese Application No. 201980083991.5, filed Jun. 17, 2021,21 pages.
Office Action mailed Jan. 25, 2024 for Chinese Application No. 202080073982.0, filed Oct. 30, 2020, 9 pages.
Office Action mailed Dec. 26, 2023 for Japanese Patent Application No. 2021-531109, filed on May 31, 2021, 2 pages.
Office Action mailed Jun. 28, 2020 for Chinese Application No. 201810821296, filed Jul. 24, 2018, 2 Pages.
Office Action mailed Jan. 29, 2024 for European Patent Application No. 19731047.7, filed on May 24, 2019, 5 pages.
Office Action mailed Jul. 29, 2022 for Taiwan Application No. 108118209, filed May 27, 2019, 15 pages.
Office Action mailed Jan. 31, 2024 for Korean Application No. 10-2020-7037369, filed May 24, 2019, 20 pages.
Office Action mailed Apr. 5, 2022 for European Patent Application No. 19731047.7, filed May 24, 2019,7 pages.
Partial European Search Report for European Application No. 18179838.0, mailed Dec. 5, 2018, 13 Pages.
Restriction Requirement mailed Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.

* cited by examiner

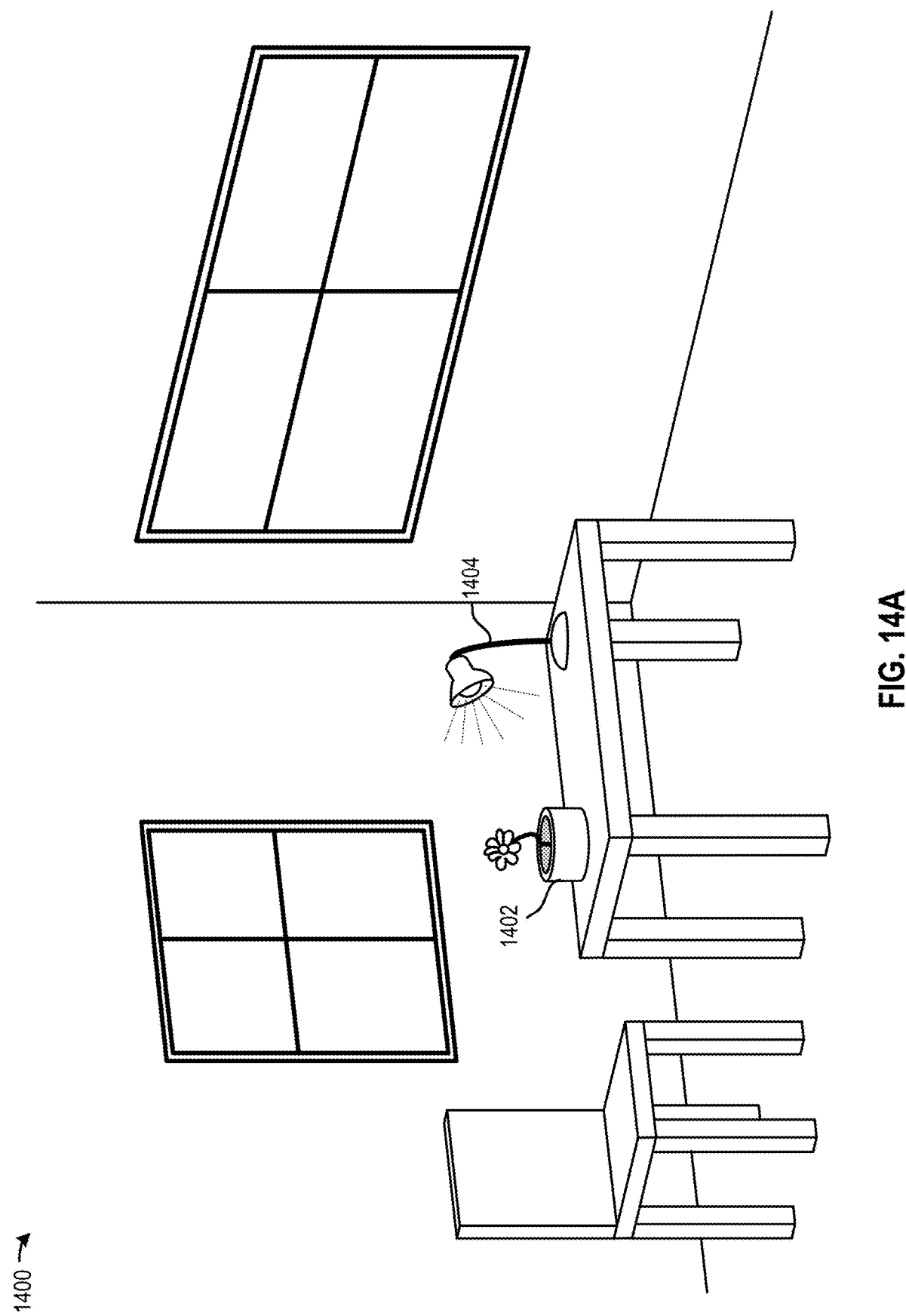

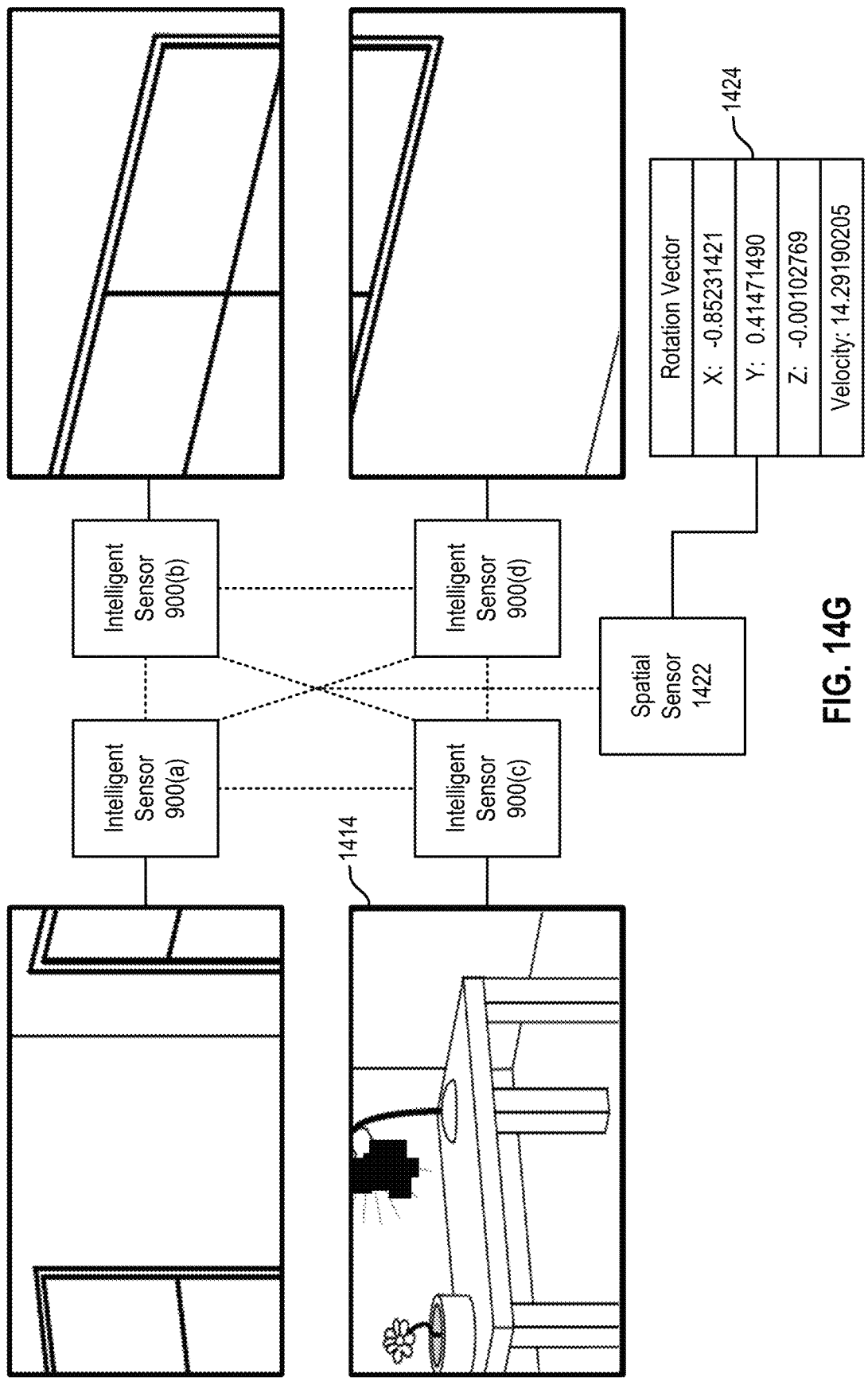

ON-SENSOR IMAGE PROCESSOR UTILIZING CONTEXTUAL DATA

CROSS-REFERENCE TO RELATED APPLICATIONS

This application claims priority to U.S. Provisional Patent Application 63/303,214, filed Jan. 26, 2022, titled "ON-SENSOR IMAGE PROCESSOR UTILIZING CONTEXTUAL DATA," the entirety of which is hereby incorporated by reference.

BACKGROUND

A typical image sensor includes an array of pixel cells. Each pixel cell may include a photodiode to sense light by converting photons into charge (e.g., electrons or holes). The charge generated by the array of photodiodes can then be quantized by an analog-to-digital converter (ADC) into digital values to generate a digital image. The digital image may be exported from the sensor to another system (e.g., a viewing system for viewing the digital image, a processing system for interpreting the digital image, a compilation system for compiling a set of digital images, etc.).

SUMMARY

The present disclosure relates to image sensors. More specifically, and without limitation, this disclosure relates to an image sensor having an on-sensor controller for altering the off-sensor transfer of all, or a portion of, a digital image.

In some examples, an apparatus is provided. The apparatus includes: an array of pixel cells, each pixel cell of the array of pixel cells including one or more photodiodes configured to generate a charge in response to light, and a charge storage device of one or more charge storage devices to convert the charge to output a voltage of an array of voltages; one or more analog-to-digital converters (ADC) configured the convert the array of voltages to first pixel data; and a controller. The controller is configured to: receive, from the ADC, the first pixel data; input the first pixel data into a machine-learning model to generate output data comprising prediction data associated with one or more features of the first pixel data; generate, based on the prediction data, second pixel data, the second pixel data associated with one or more transformed features of the first pixel data; and send, from the sensor apparatus to a separate receiving apparatus, the second pixel data.

In some aspects, the sensor apparatus is a first sensor apparatus; the controller is further configured to receive, from a second sensor apparatus, pixel metadata, the pixel metadata associated one or more aspects of third pixel data; generating the second pixel data is further based on the pixel metadata.

In some aspects, the pixel metadata is input to the machine-learning model to generate the output data.

In some aspects, the one or more aspects of the third pixel data include one or more features of the third pixel data.

In some aspects, the sensor apparatus is a first sensor apparatus and the controller is further configured to: generate, based on the first pixel data, pixel metadata, the pixel metadata associated with one or more aspects of the first pixel data; and send, to a second sensor apparatus, the pixel metadata.

In some aspects, the sensor apparatus is a first sensor apparatus and the controller is further configured to: generate, based on the second pixel data, pixel metadata, the pixel metadata associated with one or more aspects of the second pixel data; and send, to a second sensor apparatus, the pixel metadata.

In some aspects, the controller is further configured to: receive, from an orientation sensor apparatus, orientation metadata, the orientation metadata associated with an orientation of at least the sensor apparatus; and generating the second pixel data is further based on the orientation metadata.

In some aspects, the controller is further configured to input contextual data into the machine-learning model to generate the output data, the contextual data associated with one or more contexts related to the first pixel data.

In some aspects, the sensor apparatus is a first sensor apparatus; and the contextual data is sent to the first sensor apparatus from a second sensor apparatus configured to generate the contextual data.

In some aspects, the controller is further configured to generate, based on the first pixel data, the contextual data.

In some aspects, the first pixel data is first digital pixel data comprising one or more first digital pixel data values representing a first digital image.

In some aspects, the one or more features of the first pixel data include one or more alterable features; the second pixel data is pixel metadata associated with the first digital pixel data, the pixel metadata comprising at least an indication that the first pixel data includes the one or more alterable features; and sending the second pixel data includes sending the pixel metadata to the separate receiving apparatus instead of the first pixel data.

In some aspects, the controller is further configured to, in response to sending the pixel metadata to the separate receiving apparatus, send an indication to the one or more charge storage devices to prevent conversion of the charges to output the array of voltages.

In some aspects, the controller is further configured to: receive, from an orientation sensor apparatus, orientation metadata, the orientation metadata associated with an orientation of at least the sensor apparatus; determine, based on the orientation metadata, that third pixel data to be converted by the ADC will not include the one or more alterable features; and send an indication to the one or more charge storage devices to resume conversion of the charges to output the array of voltages.

In some aspects, the second pixel data is second digital pixel data comprising one or more second digital pixel data values representing a second digital image, at least a subset of the one or more second digital pixel data values being transformed second digital pixel data values associated with one or more transformed features.

In some aspects, generating the second pixel data includes transforming at least a subset of one or more first digital pixel values into the transformed second digital pixel data values.

In some aspects, each digital pixel data value of the first digital pixel data values and the second digital pixel data values includes one or more color values corresponding to a color of a pixel; and transforming at least the subset of the one or more first digital pixel data values into the transformed second digital pixel data values includes altering a subset of the one or more color values of the subset of the one or more first digital pixel data values.

In some aspects, the one or more features of the first pixel data include one or more alterable features; and generating the second pixel data includes generating the transformed second digital pixel data values associated with the one or more transformed features to replace a subset of one or more first digital pixel data values associated with the one or more alterable features.

In some aspects, sending the second pixel data to the separate receiving apparatus includes sending the one or more second digital pixel data values and not the transformed second digital pixel data values to the separate receiving apparatus.

In some examples, a method includes: operating each pixel cell of an array of pixel cells to generate a charge in response to light, and to convert the charge to output a voltage of an array of voltages; converting an array of voltages to first pixel data; inputting the first pixel data into a machine-learning model to generate output data comprising prediction data associated with one or more features of the first pixel data; generating, based on the prediction data, second pixel data, the second pixel data associated with one or more transformed features of the first pixel data; and sending, the second pixel data to a receiving apparatus.

BRIEF DESCRIPTION OF THE DRAWINGS

Illustrative embodiments are described with reference to the following figures.

FIGS. 14A, 14B, 14C, 14D, 14E, and 14I depict an example environment illustrating digital image capture and transformation techniques according to the embodiments described herein.

FIG. 14G depicts the example captured environment of FIG. 14C, as captured by an intelligent sensor array and responsively acted upon by one or more contextual modifiers operating at the intelligent sensors.

Figure 1A:
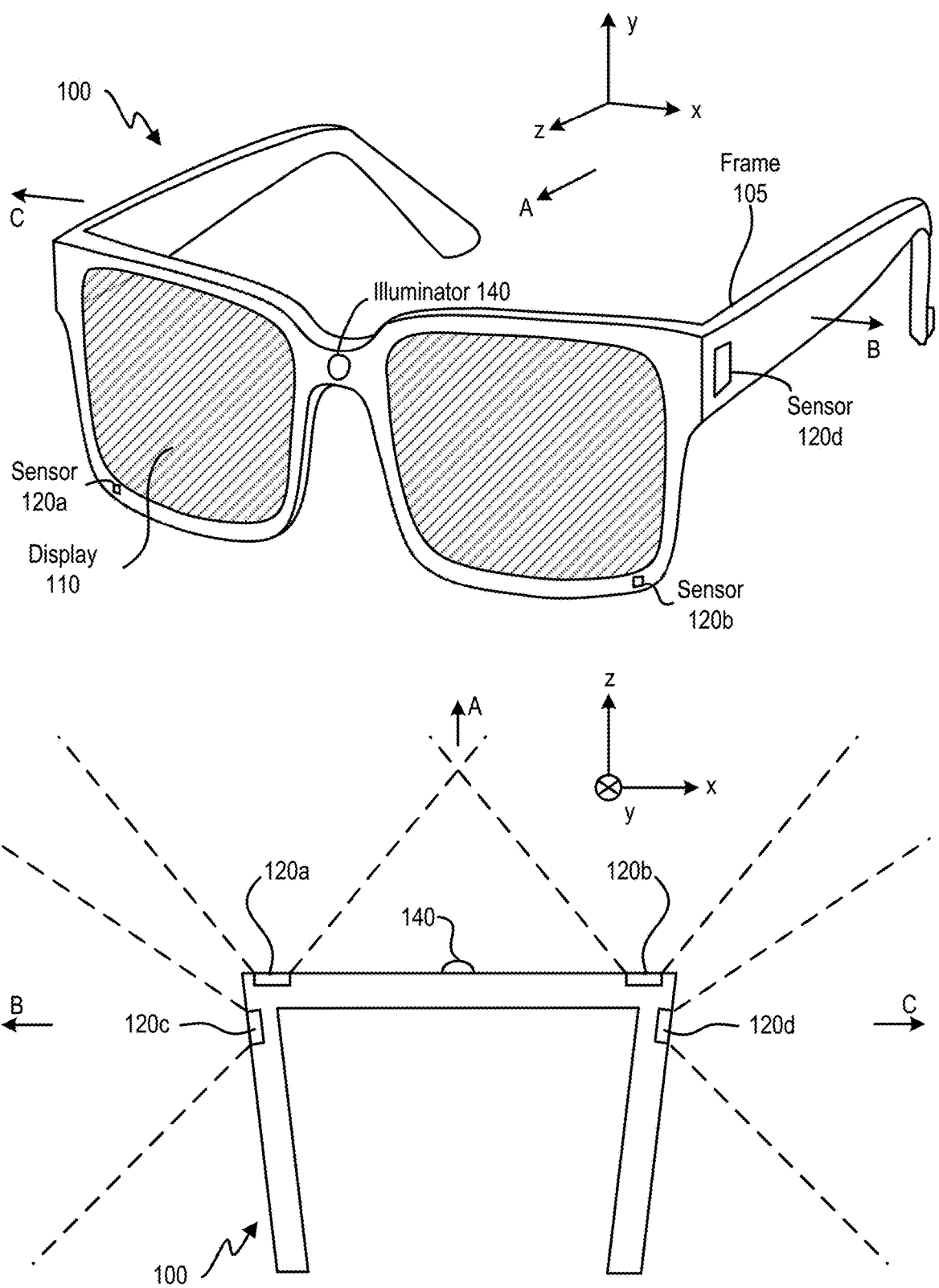
FIG. 1A and FIG. 1B are diagrams of an embodiment of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes an array of pixel cells. Each pixel cell includes a photodiode to sense incident light by converting photons into charge (e.g., electrons or holes). The charge generated by photodiodes of the array of pixel cells can then be quantized by an analog-to-digital converter (ADC) into digital values. The ADC can quantize the charge by, for example, using a comparator to compare a voltage representing the charge with one or more quantization levels, and a digital value can be generated based on the comparison result. The digital values can then be stored in a memory to generate a digital image.

The digital image data can support various wearable applications, such as object recognition and tracking, location tracking, augmented reality (AR), virtual reality (VR), etc. These and other applications may utilize extraction techniques to extract, from a subset of pixels of the digital image, aspects of the digital image (i.e., light levels, scenery, semantic regions) and/or features of the digital image (i.e., objects and entities represented in the digital image). For example, an application can identify pixels of reflected structured light (e.g., dots), compare a pattern extracted from the pixels with the transmitted structured light, and perform depth computation based on the comparison.

The application can also identify 2D pixel data from the same pixel cells that provide the extracted pattern of structured light to perform fusion of 2D and 3D sensing. To perform object recognition and tracking, an application can also identify pixels of image features of the object, extract the image features from the pixels, and perform the recognition and tracking based on the extraction results. These applications are typically executed on a host processor, which can be electrically connected with the image sensor and receive the pixel data via interconnects. The host processor, the image sensor, and the interconnects can be part of a wearable device.

Applications utilizing sensors to capture digital images may potentially capture alterable features in a digital image. As used herein, "alterable" features may mean features in a digital image that may be altered for viewing and are not limited to the example discussed herein. For example, a digital image may capture features such as bright lights, mirror reflections, infrared signals, barcodes, etc. in a digital image when active sensors are aimed at these objects in an environment. The digital images, and thus the alterable features depicted thereon, may be transferred between multiple systems after being generated by the sensor.

End-user applications may attempt to alter viewing of alterable features before they are viewed by a user of the application. For example, an AR application may analyze a digital image to determine pixel features displayed to a user. The AR application do so by depicting all or a portion of an original scene captured by sensors and overlay the original scene with new representations of the pixel features. Elements of the original scene, such as extremely bright lights, may be irritating to viewers and may disrupt their experience viewing the AR scene. The AR application may thus detect that a digital image viewable by the user contains a feature that is likely a very bright light that is undesirable to be viewed by the user because of the pattern of pixels associated with the feature. The AR application may then responsively attempt to limit the user's ability to view the feature, for example by editing the pixels associated with the detected feature to darken or filter all of or that portion of the image and make overall scene more pleasing to the user.

This approach presents several problems. An alterable feature depicted in a digital image may not be detected and edited prior to the user viewing the alterable feature. By the time the application has detected the alterable feature and edited the associated pixels, the user may have already viewed the alterable feature for some period of time. This can be highly irritating for the user and may ruin their viewing experience for a number of reasons.

Additionally, the digital image depicted in the alterable feature may be transferred multiple times between multiple systems before the digital image is edited. For example, the digital image may first be sent from a sensor system to an image compiler system, from the image compiler system to an internal storage system, from the internal storage system to an external storage system, and from the external storage system to an application system. By the time the alterable feature has been identified, multiple instances of the digital image may exist on a number of systems. To remove all instances of the alterable feature, and thus to make a more preferred altered image ubiquitous across all software and hardware storage, each instance of the digital image must be edited. This is a highly inefficient task, especially when the number of digital images being transferred is extensive.

This disclosure relates to an intelligent sensor utilizing on-sensor computing processes that can address at least some of the issues above. The intelligent sensor may include an array of pixel cells arranged in rows and columns. Each pixel cell can include one or more photodiodes to detect light and convert the light to a charge, as well as charge measurement circuits including a charge storage device (e.g., a floating diffusion, an auxiliary capacitor) to convert the charge to a voltage, and a source follower to buffer the voltage. The intelligent sensor may further include one or more ADCs to convert analog data from the pixel cells to digital image data, and a controller to further process the digital image data. The controller may further include a "modifier" subsystem for processing the digital image data and altering/preventing transfer of digital image data associated with alterable features prior to exporting the digital image to a secondary system.

In some examples the modifier subsystem is a processing subsystem within the controller for processing, generating, and/or transforming digital image data prior to sending the digital image data to a separate off-sensor system. The modifier subsystem may utilize a number of techniques to detect and remove alterable features from a digital image prior to exporting image data to the off-sensor system.

In some examples, the modifier subsystem may be configured to input the first pixel data into a machine-learning model to generate output data comprising prediction data associated with one or more features of the first pixel data. The modifier subsystem may be configured to implement a number of machine learning models/processes for transforming raw input digital image data into predictions data. In some examples, a convolutional neural network machine learning model is implemented at the modifier subsystem. The convolutional neural network machine-learning model may be configured to intake, as input, raw image data comprising one or more pixel values. The convolution neural network machine-learning model may be further configured to map the input data to various nodes of the machine learning model to further process the data. The convolution neural network machine-learning model may then output, based on the input data and the nodal configurations, output prediction data. The output prediction data may correspond to one or more detected regions of interest (ROI) predicted within the raw digital image data input to the machine learning model.

In some examples, the prediction data output from the machine-learning model may be further processed in order to detect one or more features depicted in the raw digital image data. For example, prediction data may include one or more groupings/patterns of pixels detected by the machine learning model as regions of interest. Subsequently, another system, such as a secondary machine-learning system and/or a pattern recognition system, may intake the prediction data to determine probabilities that regions of interest corresponding to the prediction data correspond to particular features of the raw digital image data. In some examples, both the prediction and the feature determination are performed by the same machine-learning model. In one example, a modifier subsystem may intake raw digital image data depicting at least one alterable feature, such as an intense light source. The modifier may input the raw digital image data to a convolutional neural network machine learning model. The convolutional neural network machine learning model may process the input data to predict that at least several regions of the digital image correspond to a bright, intense light or a light that generates pixel values that are higher is value than corresponding pixel values around the intense light. The convolutional neural network may then use these predictions to make a feature prediction, for example, that the digital image contains a bright light that is atypical of the rest of the environment and may be undesirable to show to a user in its current form.

In some examples, the machine learning models and techniques described herein may include trainable machine learning models. The machine learning models may be trained prior to utilization of the modifier subsystem to detect alterable features, and/or may be actively trained during operation of the modifier subsystem. In some further examples, an entity, such as a user or administrator may provide active feedback to the modifier subsystem to train the machine-learning model. For example, a user may implement the modifier subsystem as part of an on-sensor contextually aware modifier operating as part of an AR application. During operation of the AR application, a user may provide input to the modifier subsystem to generate training data for the modifier subsystem and the machine learning models included therein. For example, the modifier subsystem may prompt a user to confirm that a predicted features has been correctly identified within a scene. A user may provide a gesture recognizable to the AR application to signal that modifier that the prediction is correct or incorrect, such as a "thumbs-up" or "thumbs-down" in response to a query.

In some examples, the modifier subsystem may be configured to generate, based on the prediction data, second pixel data, the second pixel data associated with one or more transformed features of the first pixel data. For example, the modifier subsystem may transform a subset of the first pixel data associated with one or more features of the first pixel data into second pixel data associated with a transformed feature such that the second pixel data replaces the first pixel data. The transformation of pixel data may be associated with any method for transforming pixel data, such as vector/matrix mathematics. In some examples, transformation of the first pixel data may include applying a mathematical "filter" to the first pixel data to transform the first pixel data into second pixel data. In other examples, transformation of the first pixel data may include altering parameterized values of a subset of pixel data in the first pixel data. In this manner, pixels and groups of pixels may be individually altered without changing the composition of the entire set of first pixel data. For example, only a select number of pixel may be altered to change to pixel to a default color of "black."

In some examples, transformation of the first pixel data may include generating a new set of pixel data mirroring the first pixel data and transforming the first mirrored pixel data to create the second pixel data. In this manner, the modifier subsystem may preserve, at least in a temporary sensor memory, the first pixel data while independently generating the second pixel data. In some examples, the transformation is further based on the prediction data output by the machine learning model. For example, the machine learning model may determine the one or more features of the first pixel data. Based on the determined features, the modifier subsystem may generate the second pixel data by transforming only subsets of the first pixel data associated with the determined features. For example, if a feature of the first pixel data is determined to be an alterable features according to the prediction data, the modifier subsystem may generate black pixel values to replace pixel values of the first pixel data corresponding to the determined alterable features.

In some examples, the modifier subsystem may be configured to send from the sensor apparatus to a separate receiving apparatus, the second pixel data. The second pixel data may be associated with a transformed version of the first pixel data relating to the raw digital image data. In some examples, the second pixel data may be a digital image that is similar to the first digital image if no alterable features are detected. In other examples, the second pixel data may be a transformed digital image similar to the raw digital image, but with one or more pixel values altered according to depictions of alterable features thereon. In still other examples, the second pixel data may be metadata which is not sufficient to convey a digital image, but rather information about the raw digital image data processed by the modifier. In still other examples, the second pixel data may be an indication that the sensor on which that modifier subsystem is operating is currently not generating digital images (i.e., in an "off" position).

In some examples, the modifier subsystem is part of a first sensor apparatus, the controller is further configured to receive, from a second sensor apparatus, pixel metadata, the pixel metadata associated one or more aspects of third pixel data and generating the second pixel data is further based on the pixel metadata. In this and similar configurations, one or more intelligent sensors comprising on-sensor modifier subsystems are communicatively coupled to create an intelligent sensor array. The intelligent sensor array allows inter-sensor communication between a plurality of modifier subsystems operating on individual intelligent sensors. The modifier subsystems may be contextual modifier subsystems, capable of receiving, generating, and sending contextual data relating to an environment in which the intelligent sensors operate. In some examples, the one or more aspects of the third pixel data include one or more features of the third pixel data. For example, third pixel data may indicate one or more features detected by the second sensor apparatus during feature generation performed by an on-sensor modifier subsystem. The first sensor apparatus may then adjust its own feature generation processes according to the third pixel data.

In some examples, the pixel metadata received from a second sensor apparatus is metadata relating to one or more aspects of a digital image captured and processed by the second sensor apparatus. The metadata may relate to prediction data, features, aspects, or contexts related to an environment in which the second sensor apparatus is operating. In one example, the pixel metadata is prediction data generated by one or more machine-learning techniques utilized by a contextual modifier operating as part of the second sensor apparatus. The prediction data is sent to the contextual modifier of the first sensor apparatus to improve feature detection and transformation at the first sensor apparatus. In other examples, the pixel metadata is feature data relating to one or more features predicted within a digital image processed by the second sensor apparatus. This data provided to the first sensor apparatus from the second sensor apparatus may be contextual related to some aspect of a digital image captured by the second sensor apparatus. The contextual data may include a feature detected by the sensor apparatus (i.e., an very bright light, a barcode, etc.), an aspect of the digital image (i.e., the environment is an indoors environment), a transformation indicator (i.e. whether the second sensor apparatus has transformed a digital image to replace pixel related to a alterable feature), or any other data which may be utilized by the first sensor apparatus.

In some examples, the pixel metadata is input to the machine-learning model at the first sensor apparatus to generate the output data. For example, the contextual data may be input to the machine learning model on the first sensor apparatus to alter the function of the machine-learning model. For example, in response to receiving pixel metadata indicating that an aspect of the environment is an indoor environment, a convolutional neural network machine-learning model may adjust nodal weights of the model to favor determining regions of interest in a digital image with brighter pixel values (i.e., bright lights that do not match the indoors environment).

In some examples, the modifier subsystem is part of a first sensor apparatus and is configured to generate, based on the first and/or second pixel data, pixel metadata, the pixel metadata associated with one or more aspects of the first and/or second pixel data and send, to a second sensor apparatus, the pixel metadata. In this example, the first sensor apparatus may generate metadata based on the first and/or second pixel data or the features determined within the raw digital image data captured by the first sensor apparatus. The pixel metadata may then be exported to a second sensor apparatus to aid the second sensor apparatus and corresponding modifier subsystem in determining features thereon. For example, metadata associated with the first pixel data such as a timestamp the image is captured, the orientation of the first second apparatus when the image was captured, or an encoded representation of the raw digital image data may be sent as pixel metadata. In another example, metadata associated with the second pixel data, such as the prediction data, the determined features, aspects of the environment, contextual data, or transformation data may be sent as pixel metadata.

In some examples, the modifier subsystem is configured to receive, from an orientation sensor apparatus, orientation metadata, the orientation metadata associated with an orientation of at least the sensor apparatus; generating the second pixel data is further based on the orientation metadata. The orientation metadata may be any data relating to an orientation of a sensor or a sensor array during the operation of the sensor. In one example, the orientation information may include position data relating to a position of a sensor or sensor array at a given time. In another example, the orientation data may include one or more sets of movement data corresponding to a relative movement of a sensor or sensor array during operation of the sensor or sensor array. The orientation data may affect the machine-learning model or determination of features. For example, if a first sensor determines that a alterable features is present in an image captured by the first sensor, and a set of orientation data indicates a second sensor is rotating to face the alterable feature in the environment, the orientation data may be sent to the second sensor to alter feature determination techniques of the second sensor to be biased toward finding the alterable feature once the alterable features is within a capture range of the second sensor.

In some examples, the modifier subsystem configured to input contextual data into the machine-learning model to generate the output data, the contextual data associated with one or more contexts related to the first pixel data. The contextual data may be data relating to one or more aspects and/or features of a scene, such as known features within a scene, regions of interest within a scene, light levels of the scene, a type of environment for a scene, etc. For example, as described above, in response to receiving pixel metadata indicating that an aspect of the environment is an indoor environment, a convolutional neural network machine-learning model may adjust nodal weights of the model to favor determining regions of interest in a digital image with brighter pixel values. In some examples, the modifier subsystem is part of a first sensor apparatus and the contextual data is sent to the first sensor apparatus from a second sensor apparatus configured to generate the contextual data. For example, a contextual sensor separate from an intelligent sensor comprising a modifier subsystem may constantly track a relative light level in a scene. The contextual sensor may share this information with each sensor in a sensor array to refine feature detection techniques as the sensor level. In some examples, the modifier subsystem is configured to generate, based on the first pixel data, the contextual data. For example, the modifier subsystem may use matrix transformation techniques to determine a mean or median light value of each pixel in a pixel array.

In some examples, instead of exporting digital image data, an intelligent sensor comprising a modifier subsystem may export only metadata from the sensor to another system. In examples where a raw digital image is predicted to depict an alterable feature, the modifier subsystem may generate pixel metadata. The pixel metadata is not digital image data and a depiction of the alterable feature will therefore not be exported from the intelligent sensor. Instead, the pixel metadata may be exported, wherein the pixel metadata indicates to another system that the intelligent sensor has predicted alterable features in a captured image and has further declined to export the digital image data. In some examples, the modifier subsystem is configured to, in response to sending the pixel metadata to the separate receiving apparatus, send an indication to the one or more charge storage devices to prevent conversion of the charges to output the array of voltages. This will effectively "turn-off" the intelligent sensor until such time that it is no longer likely that a captured scene at the intelligent sensor will contain the alterable feature. For example, an application may indicate that barcodes should not be read by the intelligent sensor during operation of an AR environment. The intelligent sensor may use this indication to effectively turn-off capture features until the barcode is no longer in the visual range of the sensor in order to prevent costly barcode reading and calculation processes.

In some examples, the modifier subsystem is configured to receive, from an orientation sensor apparatus, orientation metadata, the orientation metadata associated with an orientation of at least the sensor apparatus, determine, based on the orientation metadata, that third pixel data to be converted by the ADC will not include the one or more alterable features, and send an indication to the one or more charge storage devices to resume conversion of the charges to output the array of voltages. For example, an orientation sensor may track a current orientation of the intelligent sensor. When the intelligent censor predicts the presence of an alterable feature, the orientation sensor may capture a current orientation of the intelligent sensor. When the intelligent sensor has shifted orientation such that is it no longer likely that the alterable features will be captured by the intelligent sensor, the orientation sensor may send a signal to the intelligent sensor to "turn on" and resume capturing scenes from the environment.

In some examples, the one or more features of the first pixel data include one or more alterable features and generating the second pixel data includes generating the transformed second digital pixel data values associated with the one or more transformed features to replace a subset of one or more first digital pixel data values associated with the one or more alterable features. The transformed second digital pixel data value may be altered pixel values transformed by the on-sensor modifier subsystem prior to export of a digital image data. In an example, the modifier subsystem predicts an alterable feature that is depicted on a digital image based on the first digital pixel data values. The modifier subsystem may then "mask" groupings of pixels by transforming the digital pixel data values to another value that is not indicative of the alterable features. For example, the associated pixels values may be transformed mathematically to generate new pixel values where the alterable feature was represented in the first digital pixel data values.

Transforming/masking of pixels may take numerous forms. In some examples, the associated pixels may be transformed mathematically to generate black pixels where the alterable feature was represented in the first digital pixel data values. In another example, the associated pixels may be transformed to become completely transparent (i.e., an alpha transparency value is set to zero to make the pixel fully transparent). In some examples, sending the second pixel data to the separate receiving apparatus includes sending the one or more second digital pixel data values and not the transformed second digital pixel data values to the separate receiving apparatus. For example, when exporting the transformed digital image, the modifier subsystem may send only pixel values not related to the alterable feature off-sensor. In some examples, a blurring mask is applied to one or more pixel data values to "blur" the pixels. For example, a blurring mask may be applied to a group of pixels by selecting a subset of pixel values which are adjacent to and/or near the pixel that will be masked. A weighted average of pixel values of the subset of pixel values is calculated and the weighted average is applied to the group of pixels to be masked to transform the corresponding pixel values. In some examples, the weighted average is calculated based on an average distance between the pixels to be masked and each pixel of the subset of pixels adjacent to and/or near the pixels to be masked. The blurring mask is useful to change a representation of an object in a digital image (i.e., reducing noise in the image, obscuring pixels corresponding to an object to make it unrecognizable, transforming pixels corresponding to an object to make it indistinguishable from other objects or semantic features of the digital image, etc.).

In some examples, an on-sensor controller computing system may determine whether or not a region of pixels and corresponding pixel values may be masked. For example, the on-sensor controller may determine whether a region of pixel values corresponding to an object may be effectively masked so as to prevent a viewer of the digital image from viewing the object. The determination may be made based on any information or protocols regarding the object and/or mask. For example, if a comparatively large portion of pixel values of all digital pixel values in a digital image, or all the digital values in a digital image represent an object to be moved from the digital image, the on-sensor controller may determine to prevent transmission of any image data off-sensor instead of attempting to mask the data. In another example, if a comparatively small portion of pixel values of all digital pixel values in a digital image represent an object to be moved from the digital image, the pixel values may be transformed to mask the image, and the masked image may be transferred off-sensor. If particular pixel values of particular pixels representing an object to be removed are within a threshold range of pixel values of pixels around the particular pixel (e.g., the object is a similar color to other objects around it), the controller may determine to perform a blurring mask on the particular pixel values before exporting the image off-sensor. If the particular pixel values of the particular pixels representing the object to be removed are not within the threshold range of pixel values of pixels around the particular pixels (e.g., the object clearly stands out against a background), the controller may determine to transform the particular pixel values to pixel values representing black colors before exporting the image off-sensor.

With the disclosed techniques, an image sensor may transform digital image data to exclude alterable features prior to off-sensor export of the digital image data. Removal or transformation of alterable features prior to off-sensor export prevents a user from viewing alterable features during use of applications utilizing the digital image data. The exclusion of the alterable features at the on-sensor level also prevents alterable features from being sent to, and stored in, other systems/entities. This prevents replication of the removal or transformation processes for each stored instance of the digital image data because the removal or transformation only need be done once, at the sensor level. Thus, the on-sensor removal or transformation of digital image data improves the operational flexibility and function of both an image sensor and systems that utilize it.

The disclosed techniques may include or be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 includes a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects and track the location of the user within the map. By providing image data corresponding to multiple fields of views, sensors 120a-

120d can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infrared light, ultraviolet light), and can serve various purposes. For example, illuminator 130 may project light in a dark environment (or in an environment with low intensity of infrared light, ultraviolet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infrared (IR) light sensing. The first pixel array can be overlaid with a color filter (e.g., a Bayer filter), with each pixel of the first pixel array being configured to measure intensity of light associated with a particular color (e.g., one of red, green, or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array and generate a stereoscopic image of the object based on the distances. Based on the stereoscopic image of the object, the system can determine, for example, a relative position of the object with respect to the user and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
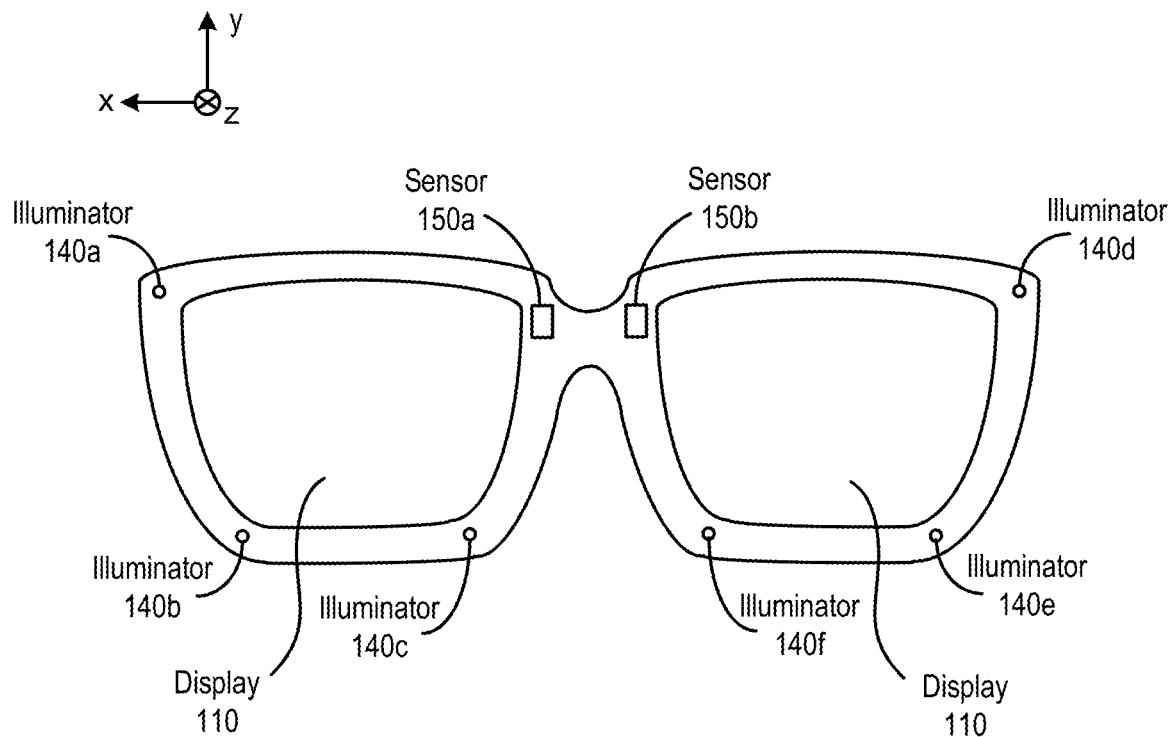

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user and may be received by sensor 150b. Sensor 150b may also include a pixel array to generate an image of the reflected pattern. Based on the images of the reflected pattern from sensors 150a and 150b, the system can determine a gaze point of the user and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b include the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
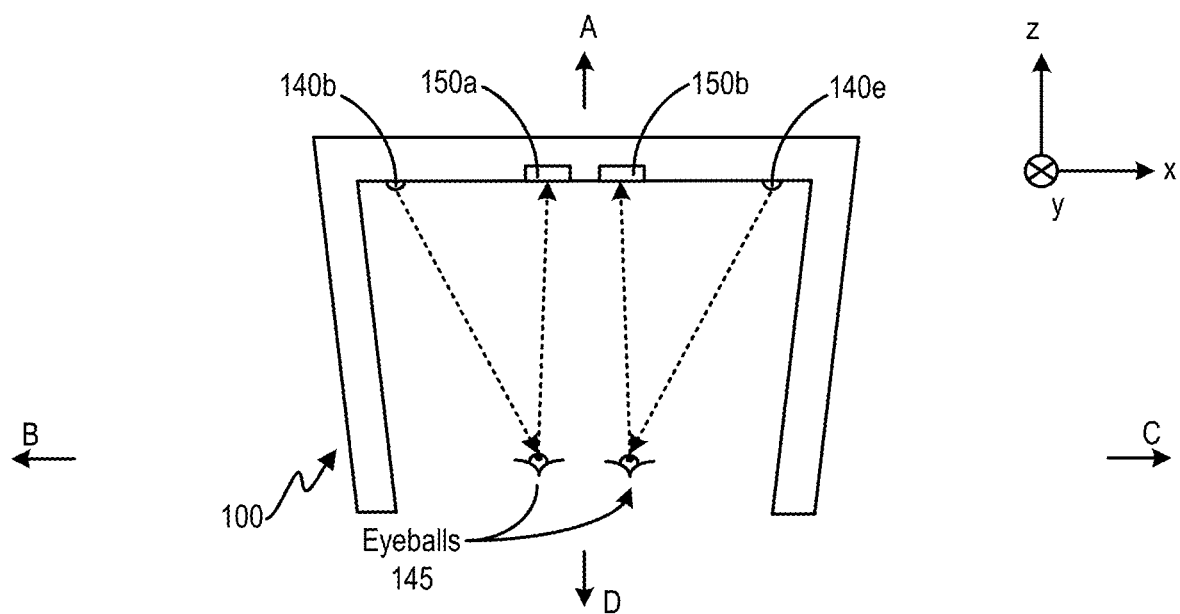
Figure 2:
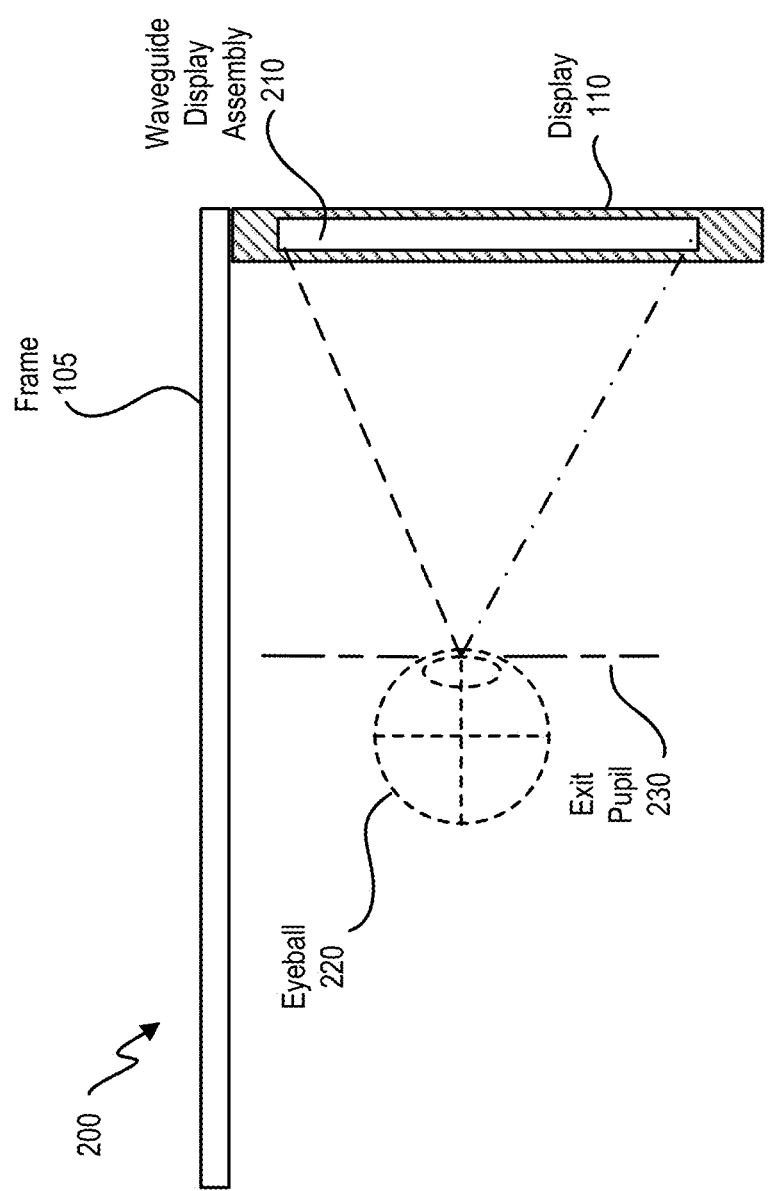
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
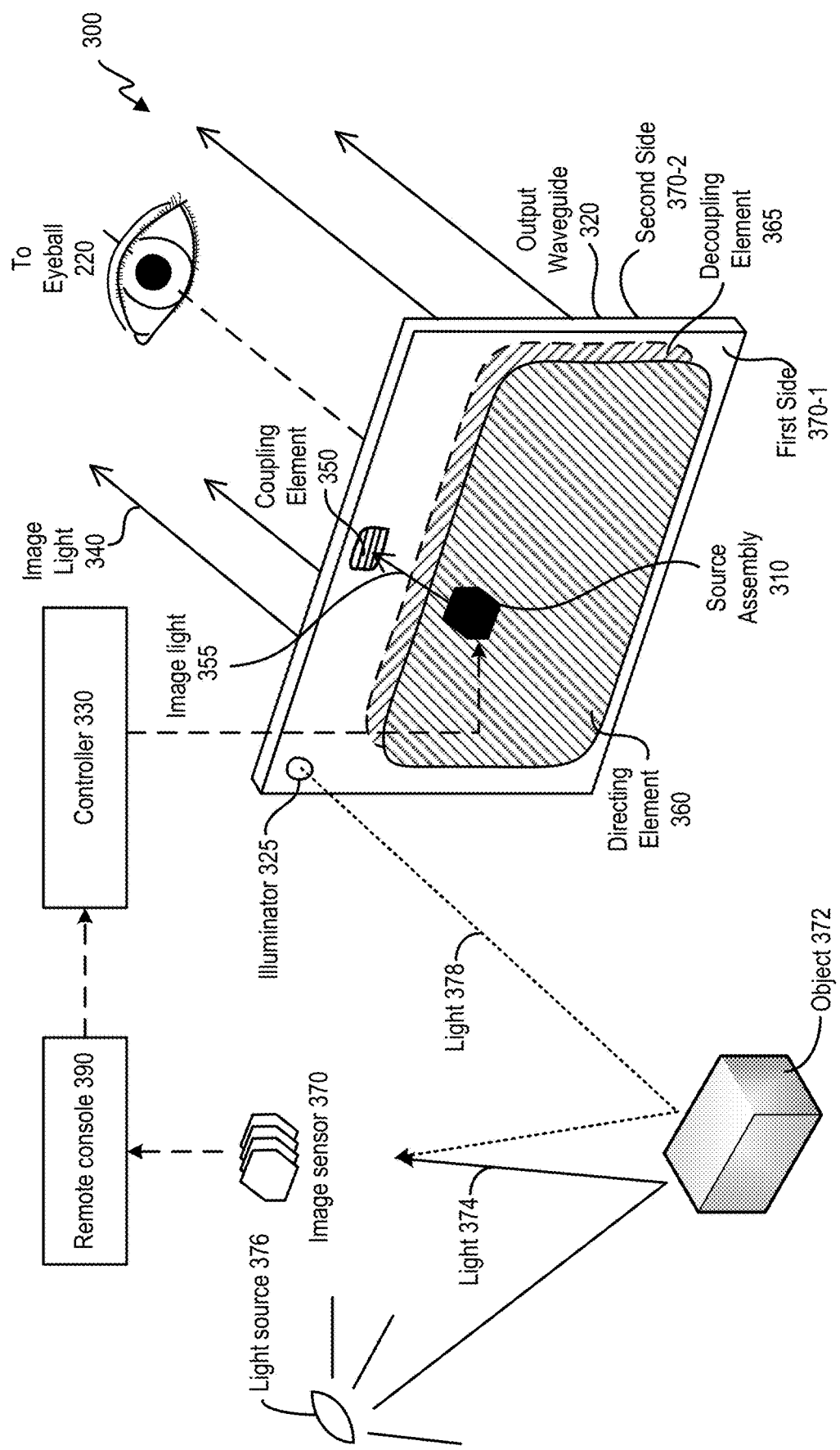
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, for example, a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, for example, a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of, for example, silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user or a gaze point of the user and determine the content of the images to be displayed to the user. The remote console can transmit instructions to controller 330 related to the determined content. Based on the instructions, controller 330 can control the generation and outputting of image light 355 by source assembly 310.

Figure 4:
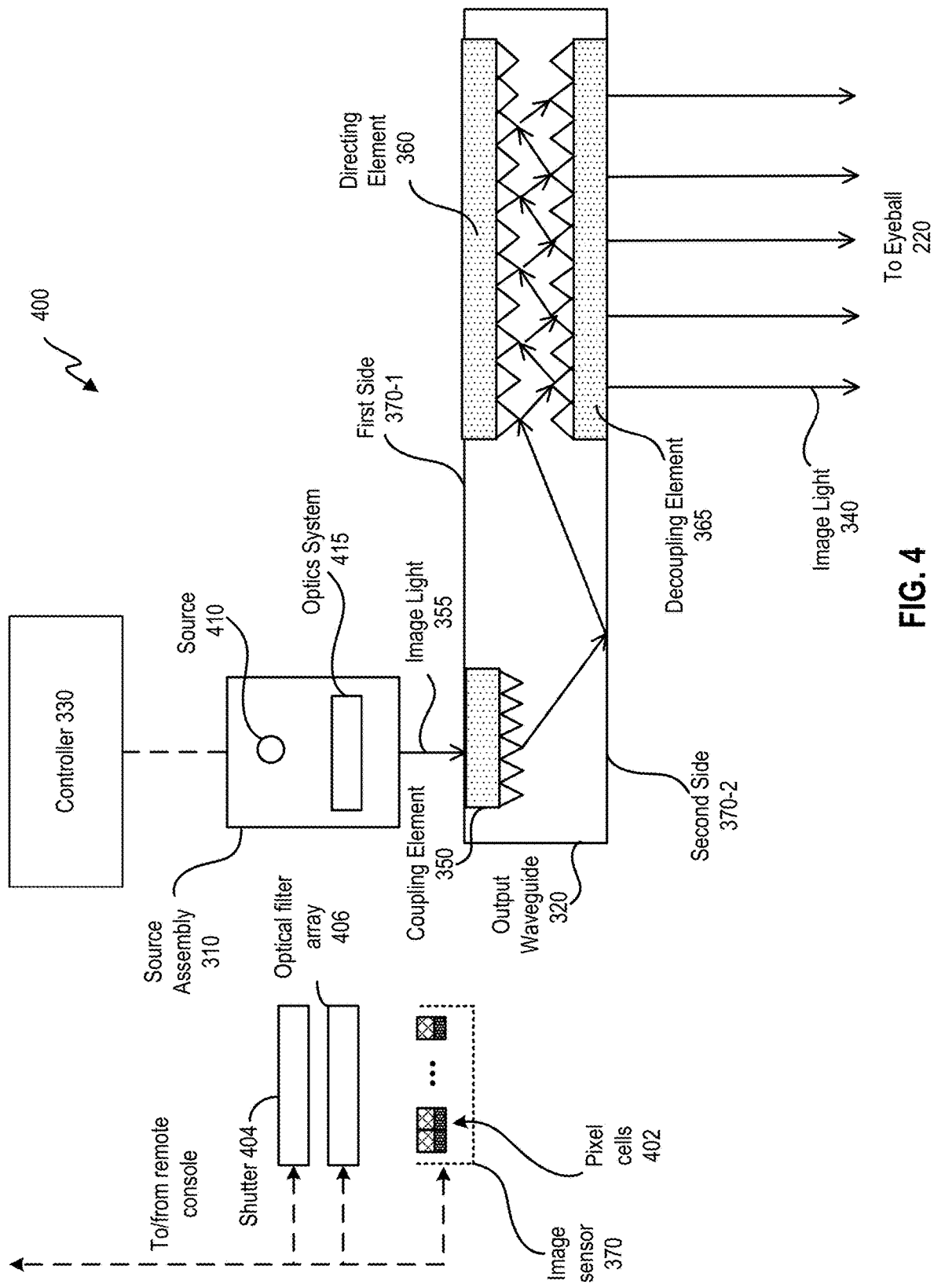
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter switch, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402 and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, for example, a laser diode, a vertical cavity surface emitting laser, and/or a light emitting diode.

Optics system 415 includes one or more optical components that condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is a diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
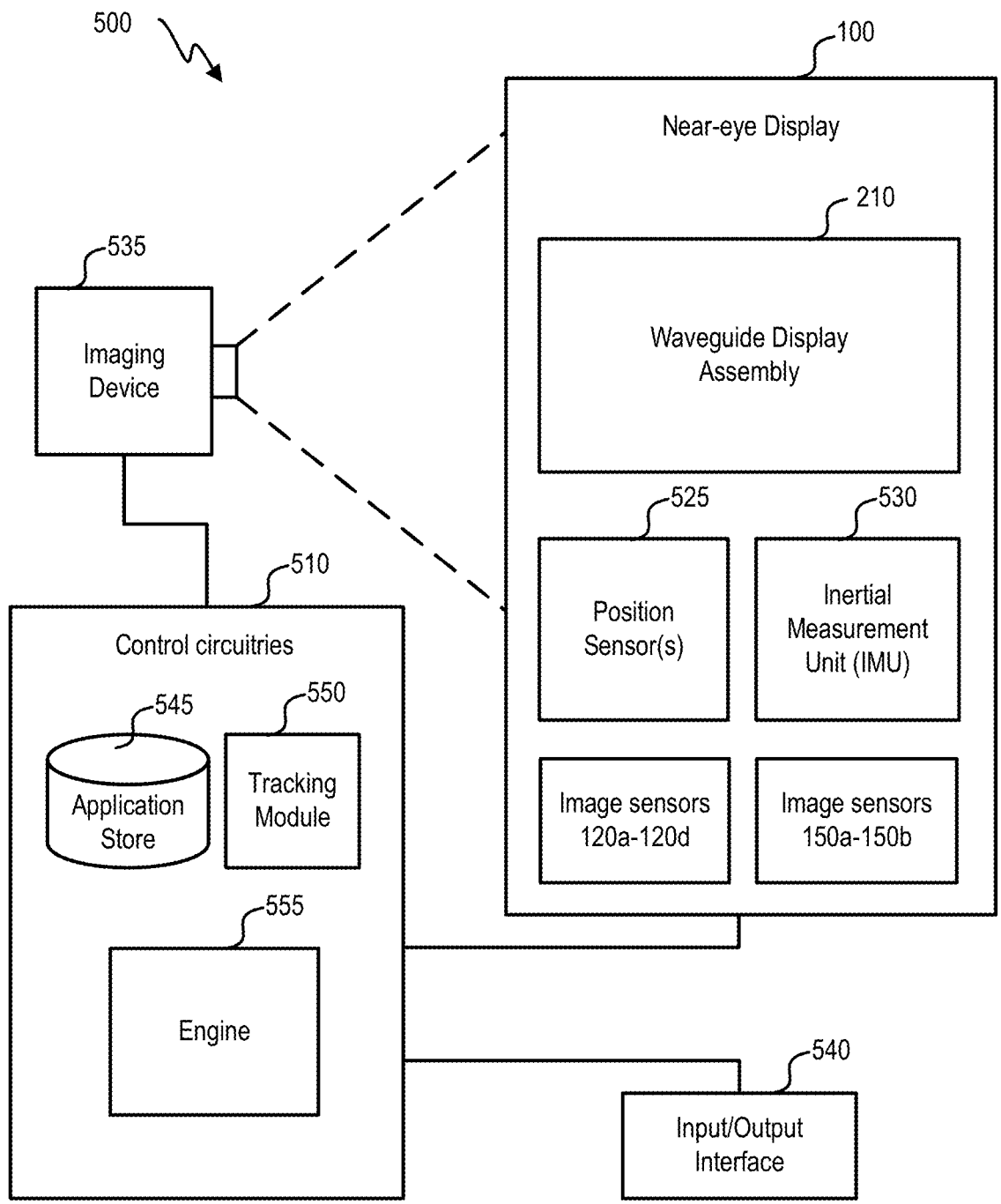
FIG. 5 is a block diagram of an embodiment of a system including the near-eye display.

FIG. 5 is a block diagram of an embodiment of a system 500 including the near-eye display 100. The system 500 includes near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6A:
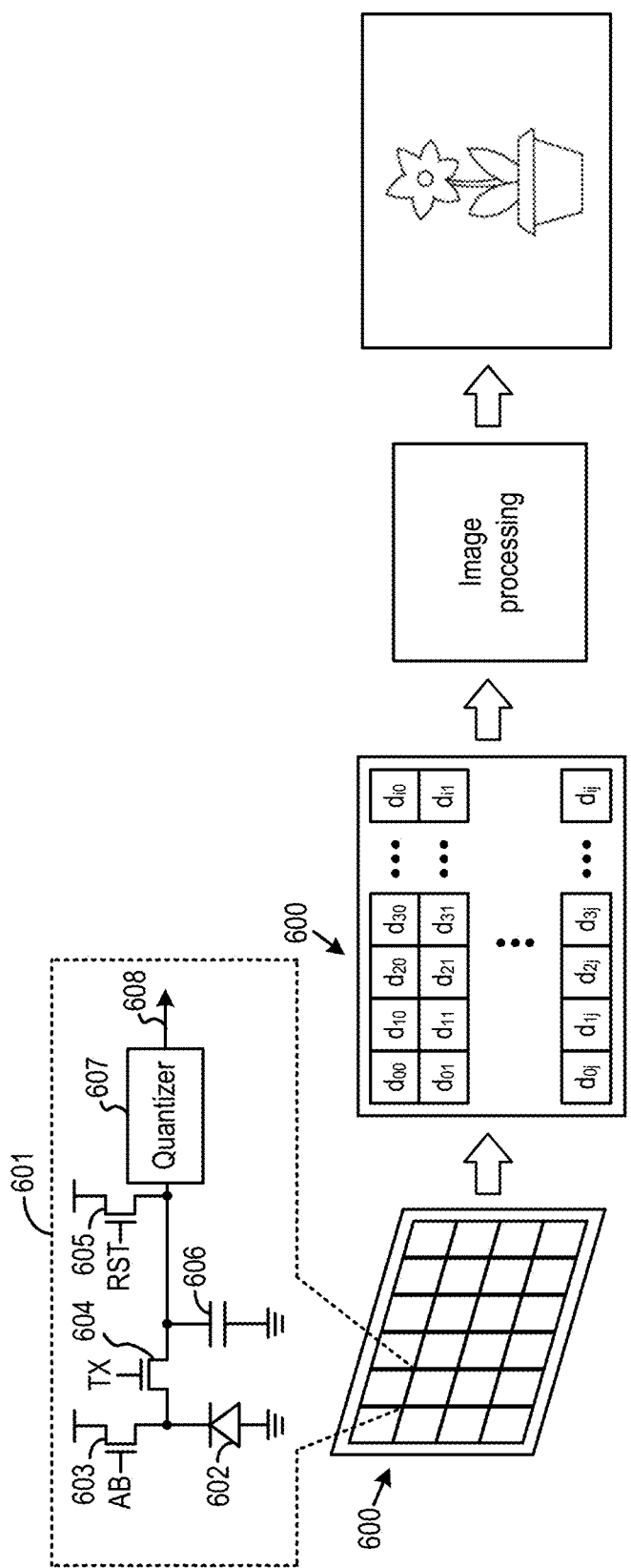
FIG. 6A, FIG. 6B, FIG. 6C, FIG. 6D, FIG. 6E, and FIG. 6F illustrate examples of an image sensor and its operations.
Figure 6B:
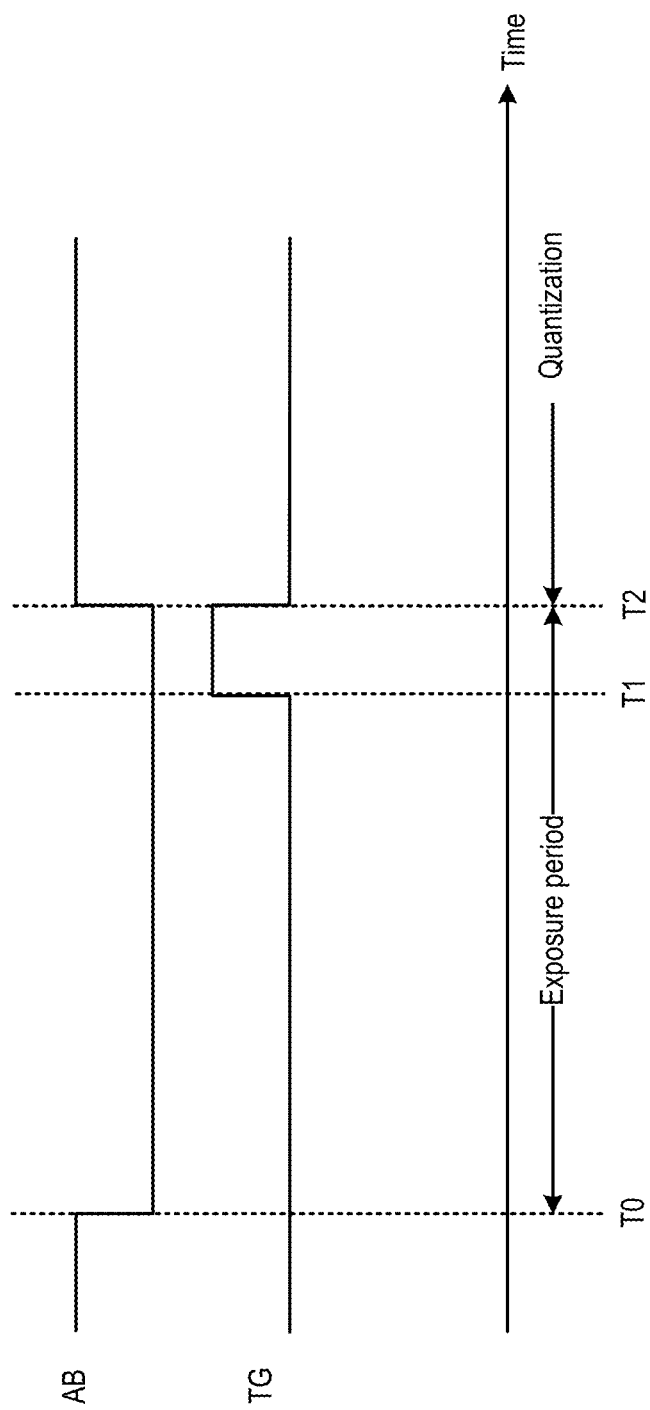

FIG. 6A, FIG. 6B, FIG. 6C, FIG. 6D, FIG. 6E, and FIG. 6F illustrate examples of an image sensor 600 and its operations. As shown in FIG. 6A, image sensor 600 can include an array of pixel cells, including pixel cell 601, and can generate digital intensity data corresponding to pixels of an image. Pixel cell 601 may be part of pixel cells 402 of FIG. 4. As shown in FIG. 6A, pixel cell 601 may include one or more photodiodes 602, an electronic shutter switch 603, a transfer switch 604, a reset switch 605, a charge storage device 606, and a quantizer 607. Quantizer 607 can be a pixel-level ADC that is accessible only by pixel cell 601. Photodiode 602 may include, for example, a P-N diode, a P-I-N diode, or a pinned diode, whereas charge storage device 606 can be a floating diffusion node of transfer switch 604. Photodiode 602 can generate and accumulate charge upon receiving light within an exposure period, and the quantity of charge generated within the exposure period can be proportional to the intensity of the light.

The exposure period can be defined based on the timing of AB signal controlling electronic shutter switch 603, which can steer the charge generated by photodiode 602 away when enabled and based on the timing of the TX signal controlling transfer switch 604, which can transfer the charge generated by photodiode 602 to charge storage device 606 when enabled. For example, referring to FIG. 6B, the AB signal can be de-asserted at time T0 to allow photodiode 602 to generate charge and accumulate at least some of the charge as residual charge until photodiode 602 saturates. T0 can mark the start of the exposure period. The TX signal can set transfer switch 604 at a partially-on state to transfer additional charge (e.g., overflow charge) generated by photodiode 602 after saturation to charge storage device 606. At time T1, the TG signal can be asserted to transfer the residual charge to charge storage device 606, so that charge storage device 606 can store all of the charge generated by photodiode 602 since the beginning of the exposure period at time T0.

At the time T2, the TX signal can be de-asserted to isolate charge storage device 606 from photodiode 602, whereas the AB signal can be asserted to steer charge generated by photodiode 602 away. The time T2 can mark the end of the exposure period. An analog voltage across charge storage device 606 at time T2 can represent the total quantity of charge stored in charge storage device 606, which can correspond to the total quantity of charge generated by photodiode 602 within the exposure period. Both TX and AB signals can be generated by a controller (not shown in FIG. 6A) which can be part of pixel cell 601. After the analog voltage is quantized, reset switch 605 can be enabled by an RST signal to remove the charge in charge storage device 606 to prepare for the next measurement.

Figure 6C:
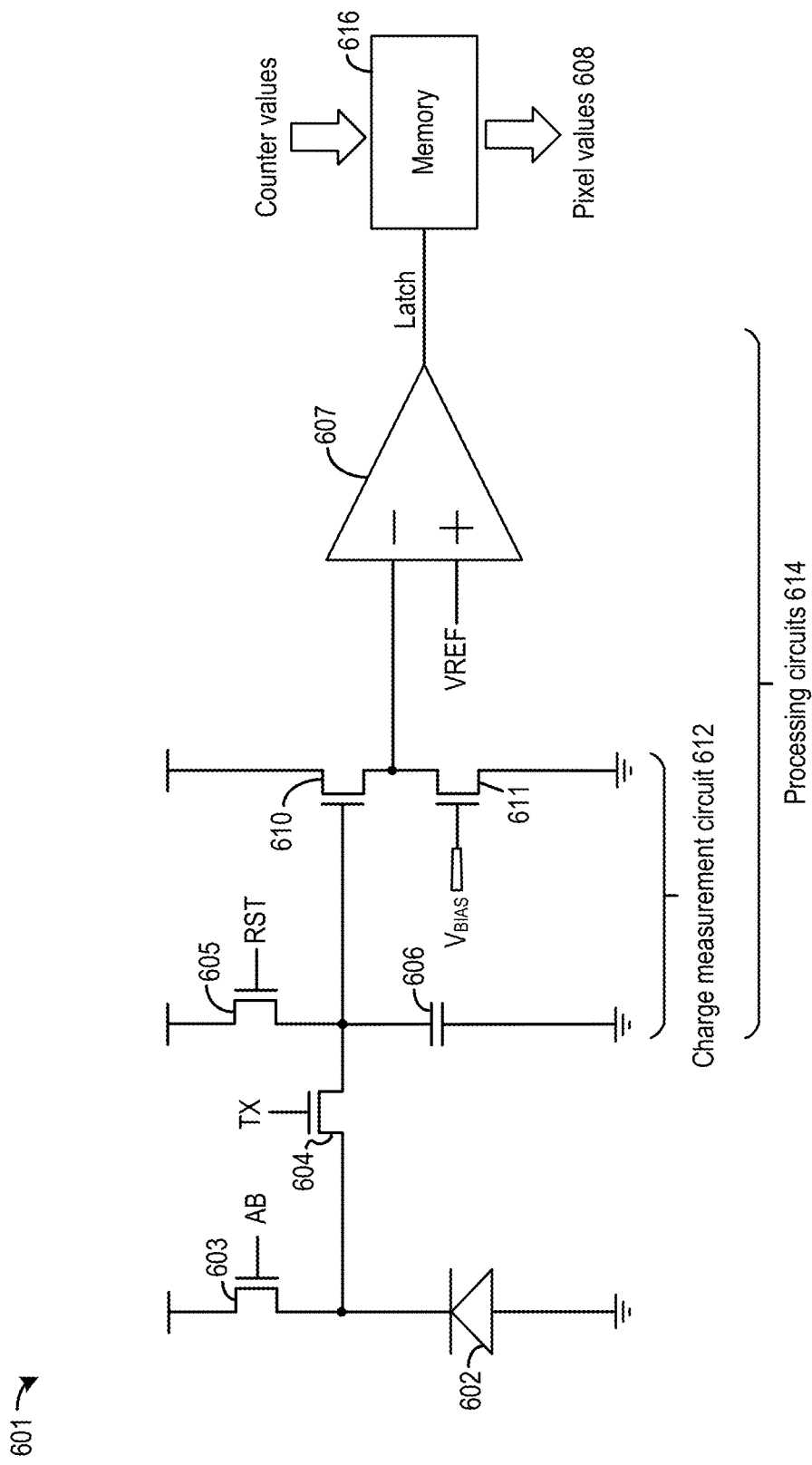

FIG. 6C illustrates additional components of pixel cell 601. As shown in FIG. 6C, pixel cell 601 can include a source follower 610 that can buffer the voltage at charge storage device 606 and output the voltage to quantizer 607. Charge storage device 606 and source follower 610 can form a charge measurement circuit 612. Source follower 610 can include a current source 611 controlled by a bias voltage $V_{BIAS}$, which sets the current that flows through source follower 610. Quantizer 607 can include a comparator. Charge measurement circuit 612 and quantizer 607 together can form a processing circuits 614. The comparator is further coupled with a memory 616 to store a quantization output as pixel value 608. Memory 616 can include a bank of memory devices, such as static random-access memory (SRAM) devices, with each memory device configured as a bit cell. The number of memory devices in the bank can be based on a resolution of the quantization output. For example, if the quantization output has a 10-bit resolution, memory 616 can include a bank of ten SRAM bit cells. In a case where pixel cell 601 includes multiple photodiodes to detect light of different wavelength channels, memory 616 may include multiple banks of SRAM bit cells.

Figure 6D:
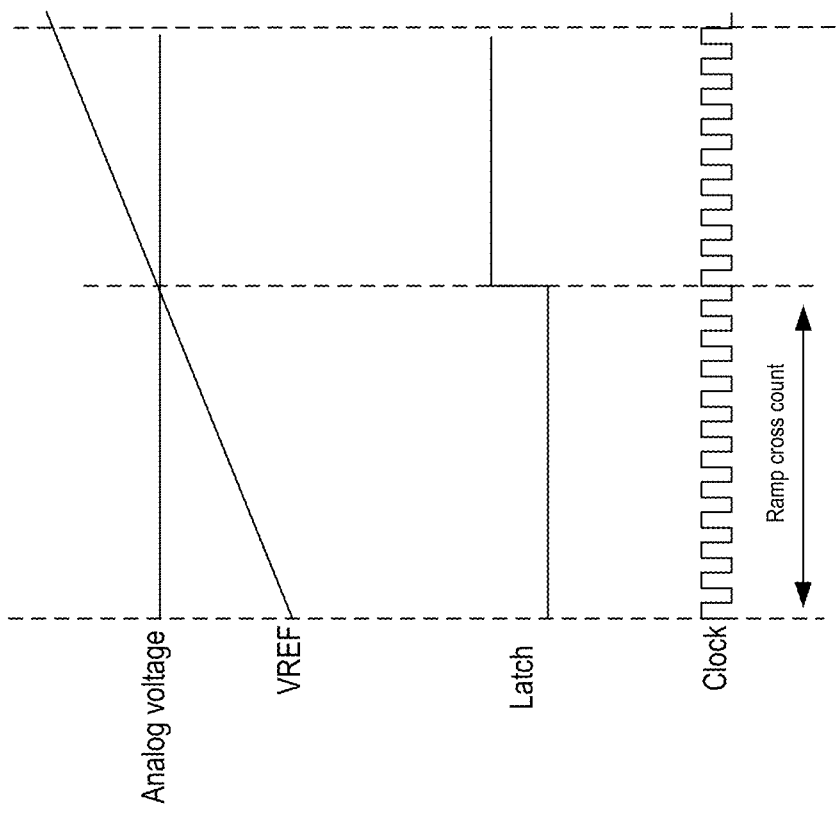

Quantizer 607 can be controlled by the controller to quantize the analog voltage after time T2 to generate a pixel value 608. FIG. 6D illustrates an example quantization operation performed by quantizer 607. As shown in FIG. 6D, quantizer 607 can compare the analog voltage output by source follower 610 with a ramping reference voltage (labelled "VREF" in FIG. 6C and FIG. 6D) to generate a comparison decision (labelled "Latch" in FIG. 6C and FIG. 6D). The time it takes for the decision to trip can be measured by a counter to represent a result of quantization of the analog voltage. In some examples, the time can be measured by a free-running counter that starts counting when the ramping reference voltage is at the start point. The free-running counter can periodically update its count value based on a clock signal (labelled "clock" in FIG. 6D) and as the ramping reference voltage ramps up (or down). The comparator output trips when the ramping reference voltage meets the analog voltage. The tripping of the comparator output can cause a count value to be stored in memory 616. The count value can represent a quantization output of the analog voltage. Referring back to FIG. 6C, the count value stored in memory 616 can be read out as pixel value 608.

In FIG. 6A and FIG. 6C, pixel cell 601 is illustrated as including processing circuits 614 (including charge measurement circuit 612 and quantizer 607) and memory 616. In some examples, processing circuits 614 and memory 616 can be external to pixel cell 601. For example, a block of pixel cells can share and take turn in accessing processing circuits 614 and memory 616 to quantize the charge generated by the photodiode(s) of each pixel cell and to store the quantization result.

Figure 6E:
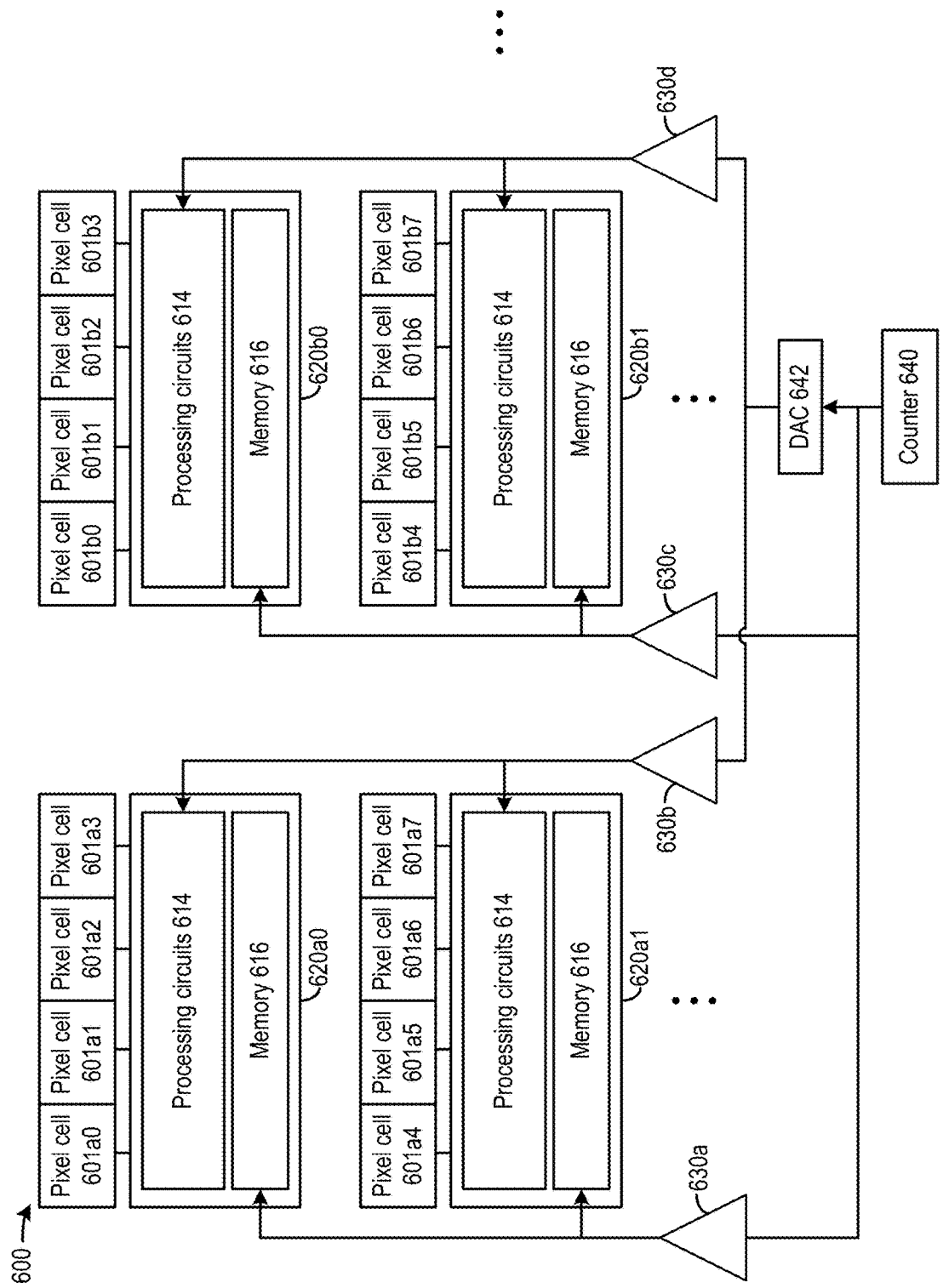
Figure 6F:
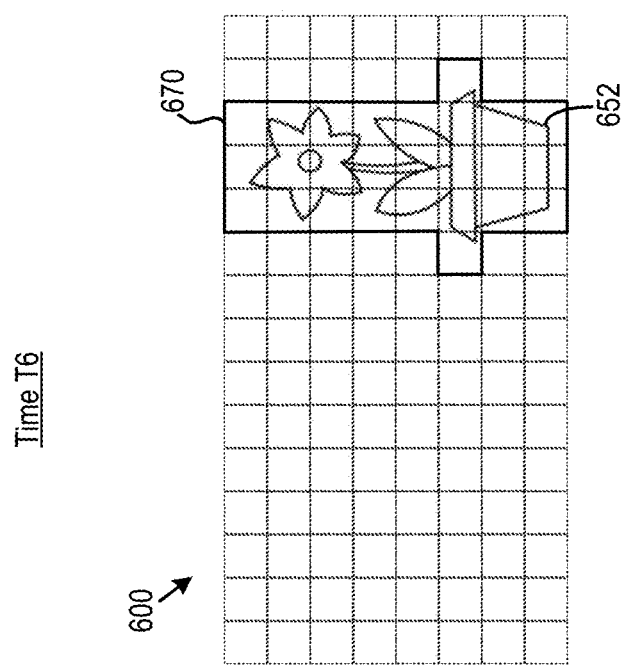
Figure 6F:
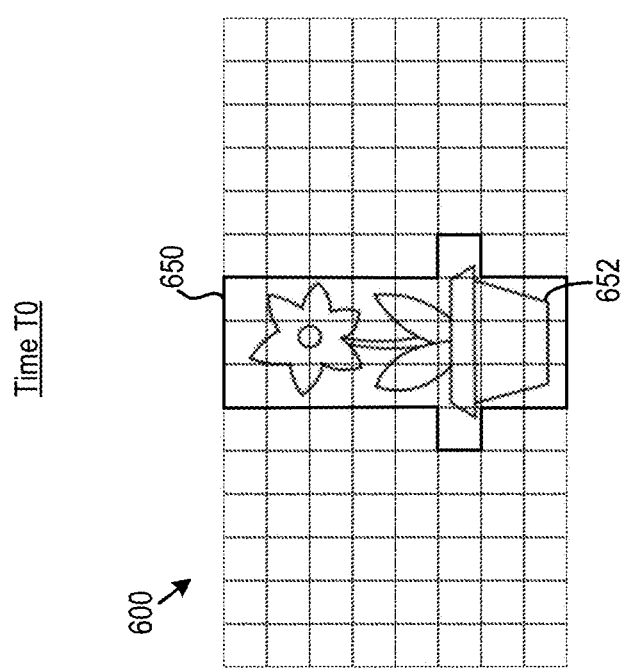

FIG. 6E illustrates additional components of image sensor 600. As shown in FIG. 6E, image sensor 600 includes pixel cells 601 arranged in rows and columns, such as pixel cells 601$a$0-$a$3, 601$a$4-$a$7, 601$b$0-$b$3, or 601$b$4-$b$7. Each pixel cell may include one or more photodiodes 602. Image sensor 600 further includes quantization circuits 620 (e.g., quantization circuit 620$a$0, $a$1, $b$0, $b$1) comprising processing circuits 614 (e.g., charge measurement circuit 612 and comparator/quantizer 607) and memory 616. In the example of FIG. 6E, a block of four pixel cells may share a block-level quantization circuit 620, which can include a block-level ADC (e.g., comparator/quantizer 607) and a block-level memory 616 via a multiplexor (not shown in FIG. 6E), where each pixel cell takes turn in accessing quantization circuit 620 to quantize the charge. For example, pixel cells 601$a$0-$a$3 share quantization circuit 620$a$0, pixel cells 601$a$4-$a$7 share quantization circuit 621$a$1, pixel cells 601$b$0-$b$3 share quantization circuit 620$b$0, whereas pixel cells 601$b$4-$b$7 share quantization circuit 620$b$1. In some examples, each pixel cell may include or has its dedicated quantization circuit.

In addition, image sensor 600 further includes other circuits, such as a counter 640 and a digital-to-analog converter (DAC) 642. Counter 640 can be configured as a digital ramp circuit to supply count values to memory 616. The count values can also be supplied to DAC 642 to generate an analog ramp, such as VREF of FIG. 6C and FIG. 6D, which can be supplied to quantizer 607 to perform the quantization operation. Image sensor 600 further includes a buffer network 630 including buffers 630$a$, 630$b$, 630$c$, 630$d$, etc. to distribute the digital ramp signals representing the counter values, and the analog ramp signal, to processing circuits 614 of different blocks of pixel cells, such that at any given time each processing circuit 614 receives the same analog ramp voltage and the same digital ramp counter value. This is to ensure that any difference in the digital values output by different pixel cells is due to differences in the intensity of light received by the pixel cells, not due to mismatches in the digital ramp signals/counter values and analog ramp signals received by the pixel cells.

The image data from image sensor 600 can be transmitted to host processor (not shown in FIG. 6A-FIG. 6E) to support different applications, such as identifying and tracking object 652 or performing depth sensing of object 652 with respect to image sensor 600. For all these applications, only a subset of pixel cells provide relevant information (e.g., pixel data of object 652), whereas the rest of pixel cells do not provide relevant information. For example, referring to FIG. 6F, at time T0 a group of pixel cells 650 of image sensor 600 receive light reflected by object 652, whereas time T6, object 652 may have shifted (e.g., due to a movement of object 652, a movement of image sensor 600, or both), and a group of pixel cells 670 of image sensor 600 receive light reflected by object 652. At both times T0 and T6, image sensor 600 can transmit only the pixel data from group of pixel cells 660 and 670, as a sparse image frame, to the host processor to reduce the volume of pixel data being transmitted. Such arrangements can allow transmission of higher resolution images at a higher frame rate. For example, a larger pixel cell array including more pixel cells can be used to image object 652 to improve image resolution, while the bandwidth and power required to provide the improved image resolution can be reduced when only a subset of the pixel cells, including the pixel cells that provide pixel data of object 652, transmit the pixel data to the host processor. Similarly, image sensor 600 can be operated to generate images at a higher frame rate, but the increases in bandwidth and power can be reduced when each image only includes pixel values output by the subset of the pixel cells. Similar techniques can be employed by image sensor 600 in the case of 3D sensing.

Figure 7A:
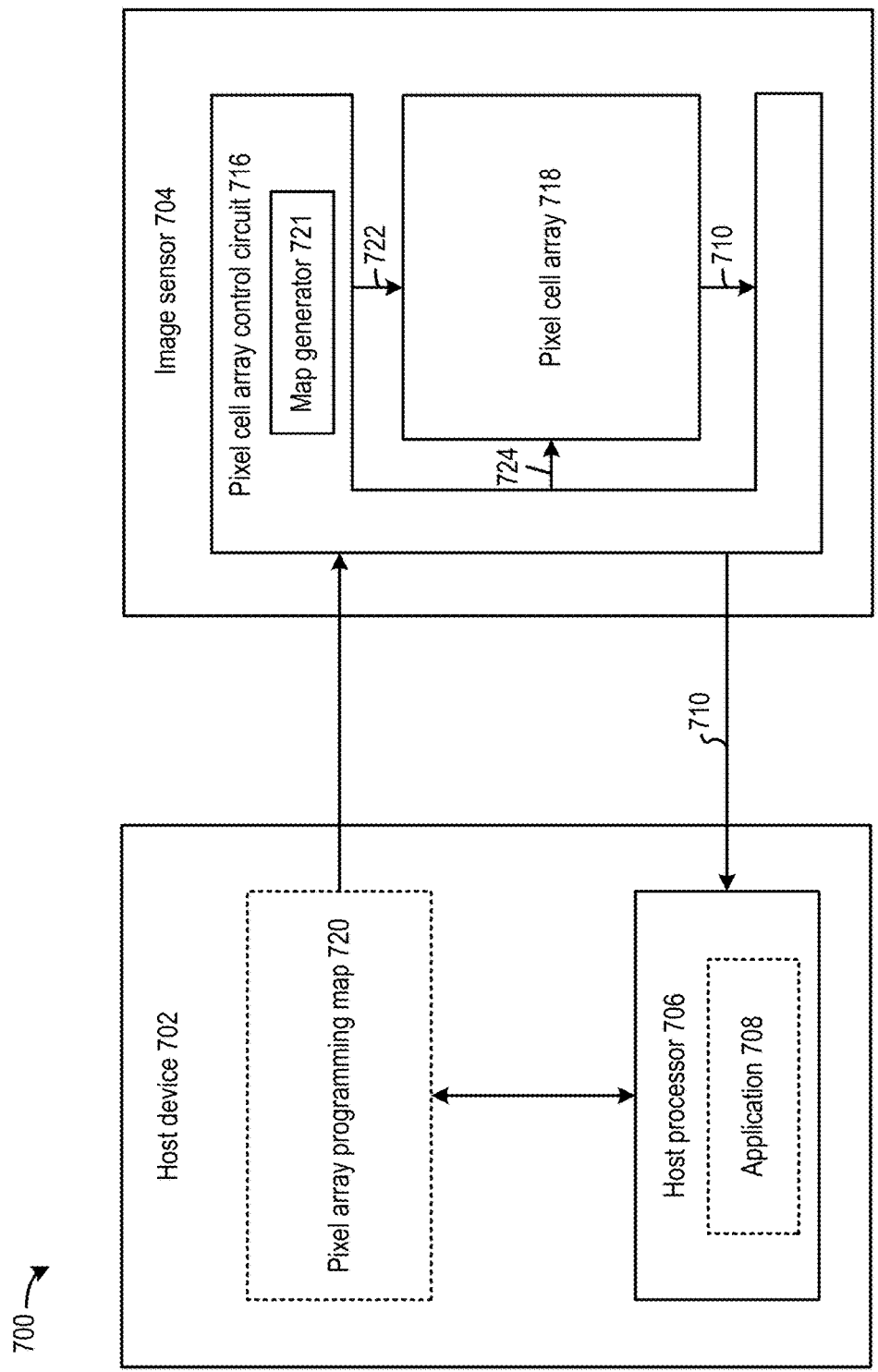
FIG. 7A, FIG. 7B, and FIG. 7C illustrate examples of an image processing system and its operations.
Figure 7B:
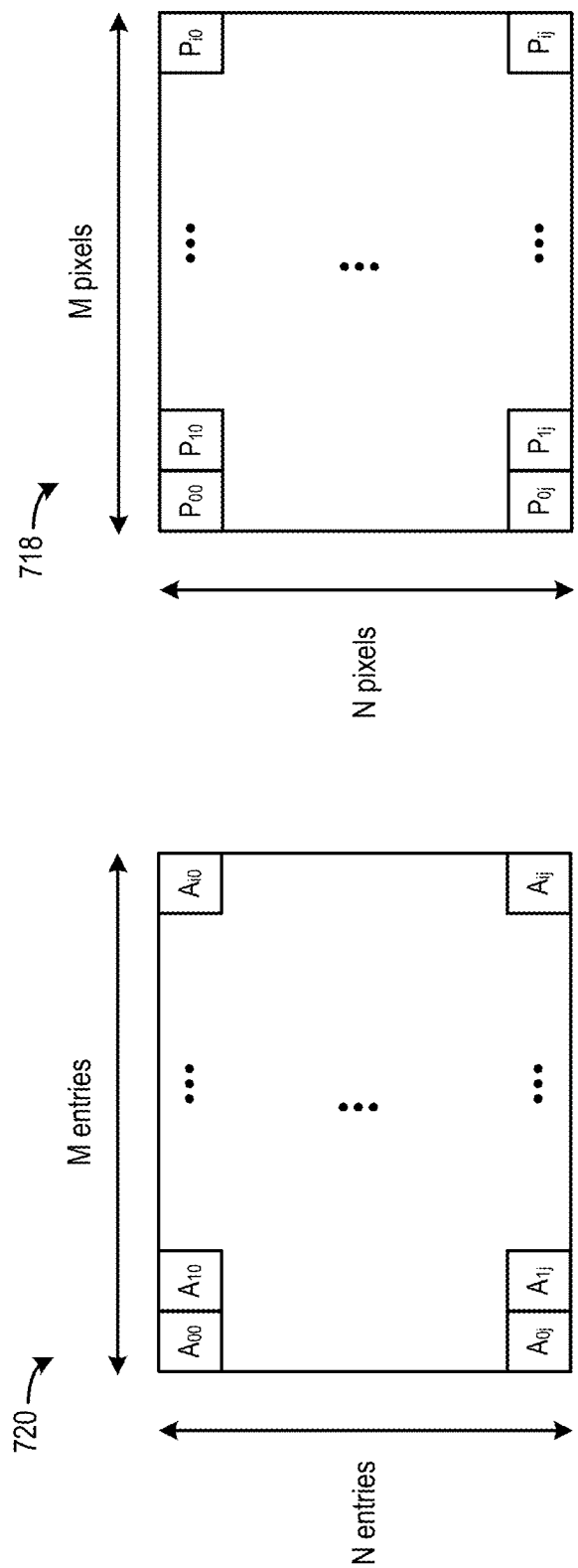
Figure 7C:
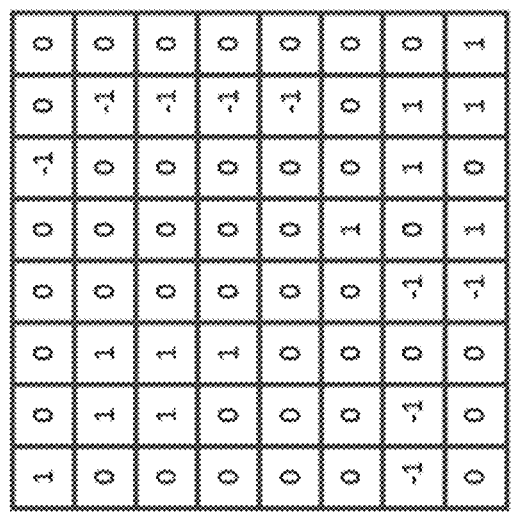
Figure 7C:
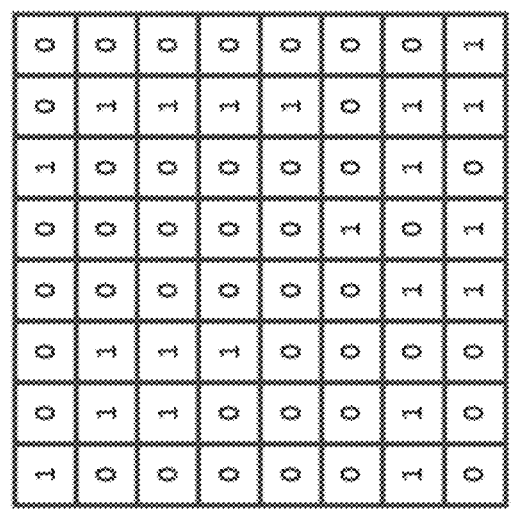

FIG. 7A, FIG. 7B, and FIG. 7C illustrate examples of an image processing system 700 and its operations. Image processing system 700 includes a host device 702 and an image sensor 704. Host device 702 can include a host processor 706 which operates an application 708 which can perform operations including, for example, fusion of 2D and 3D sensing, object recognition and tracking, or location tracking, on image 710 generated by image sensor 704. In some examples, image processing system 700 can be in a wearable device. In some examples, processing system 700 can be split into multiple separate devices. For example, host device 702 can be a personal computer (PC), a smart phone, a camera base station, or an integrated circuit such as a central processing unit (CPU), a field-programmable switch array (FPGA), or a micro controller unit (MCU). Host device 702 and image sensor 704 can be electrically connected via an interconnect (not shown in FIG. 7A), such as an interconnect compatible with the Mobile Industry Processor Interface (MIPI) standard.

Referring to FIG. 7A, image sensor 704 includes a pixel cell array control circuit 716 and a pixel cell array 718. Each pixel cell of pixel cell array 718 can include similar components as pixel cell 601 of FIG. 6A and FIG. 6C such as photodiode 602, electronic shutter switch 603, transfer switch 604, processing circuits 614, and memory 616, to perform a light measurement operation to generate pixel data. Blocks of pixel cells can also share quantization circuits 620 comprising processing circuits 614 and memory 616 as shown in FIG. 6E. Image sensor 704 further includes other circuits, such as counters 640 and DAC 642 shown in FIG. 6E. In some examples, pixel cell array 718 and pixel cell array control circuit 716 can form a stack structure to maximize the light receiving surface of image sensor 704, which allows pixel cell array 718 to include more pixel cells to improve resolution.

Each pixel cell in pixel cell array 718 may include a configuration memory, which can be part of or external to the pixel cell, to store programming data for configuring/programming the light measurement operation at each pixel cell, or at blocks of pixel cells. The configuration memory of each pixel cell can be individually addressable, which allows the light measurement operation at each pixel cell, or a block of pixel cells, to be individually programmed by pixel cell array control circuit 716 based on a pixel array programming map 720. In some examples, pixel array programming map 720 can be generated by host processor 706 as a result of the object tracking operation on image 710. In some examples, pixel cell array control circuit 716 may also include a programming map generator 721 to generate pixel array programming map 720 based on image 710. Pixel cell array control circuit 716 can extract programming data from pixel array programming map 720 and transmit the programming data in the form of control signals 722 and 724 to pixel cell array 718. Programming data can be read out from the configuration memory to configure the light measurement operation.

As to be described in detail below, the configuration of the light measurement operation at a pixel cell can include, for example, setting a power state of the different circuit components accessed/associated by the pixel cell, such as quantization circuit 620. The configuration may also include other aspects of the light measurement operation, such as setting an exposure period for the light measurement operation or setting the quantization resolution/bit depth.

Pixel array programming map 720 can include programming data targeted at each pixel cell of the array of pixel cells. FIG. 7B illustrates an example of pixel array programming map 720. As shown in FIG. 7B, pixel array programming map 720 can be include a 2D array of programming data, with each entry of programming data of the two-dimensional array targeted at a pixel cell of pixel cell array 718. For example, in a case where pixel cell array 718 has a width of M pixels (e.g., M columns of pixels) and a height of N pixels (e.g., N rows of pixels), pixel array programming map 720 also has a width of M entries (e.g., M columns of entries) and a height of N entries (e.g., N rows of entries). The programming data $A_{00}$ at entry (0, 0) of pixel array programming map 720 is targeted at pixel cell $P_{00}$ at pixel location (0, 0) of pixel cell array 718, whereas the programming data $A_{01}$ at entry (0, 1) of pixel array programming map 720 is targeted at pixel cell $P_{01}$ at pixel location (0, 1) of pixel cell array 718. In some examples, the programming data of each entry of pixel array programming map 720 can be transmitted sequentially following a pre-determined scanning pattern, such as traversing a row from left to right (e.g., $A_{00}, A_{01}, \ldots A_{0i}$), followed by the next row from left to right (e.g., $A_{10}, A_{11}, \ldots A_{1i}$), to form a stream of serial data. The programming data for each entry can be extracted and identified from the stream of serial data based on the scanning pattern and the order by which the entries are received. In some examples, pixel array programming map 720 can be sent only when certain programming data need to be updated between frames, and only the programming data that need to be updated are included in pixel array programming map 720. In some examples, each entry of pixel array programming map 720 can also target at a block of pixel cells (e.g., a 2×2 array of pixel cells, a 4×4 array of pixel cells).

Depending on the configuration operation, each entry of pixel array programming map 720 can either include binary programming data or non-binary programming data. FIG. 7C illustrates examples of pixel array programming maps 720a and 720b. As shown in FIG. 7C, pixel array programming map 720a includes binary programming data 0 and 1. In some examples, the binary programming data at each entry of pixel array programming map 720a can enable (e.g., with programming data set to 1) or disable (e.g., with programming data set to 0) the generation of pixel data at the pixel cell corresponding to the entry. The binary programming data can also set a power state of the quantization circuit 620 used by the pixel cell. For example, if the programming data indicates that the pixel cell is not to generate pixel data, the processing circuits and memory included in the quantization circuit used by the pixel cell can be powered down.

In addition, pixel array programming map 720*b* may include non-binary programming data such as −1, 0, 1, or other values. The non-binary programming data of pixel array programming map 720*b*, as shown in FIG. 7C, can be used to, for example, set an exposure period or set a quantization resolution. For example, a programming value of −1 can indicate the pixel cell and the quantization circuit being disabled during a frame period, a programming value of 0 can indicate the pixel cell and the quantization circuit operating in a low resolution mode, whereas a programming value 1 can indicate the pixel cell and the quantization circuit operating in the full resolution mode. The pixel cell can then set the power state of the processing circuits and the memory of the quantization circuit accordingly.

In some examples, pixel array programming map 720*a/b* can be generated by the application (e.g., application 708) operating at host device 702, or map generator 721 of pixel cell array control circuit 716, that consumes the pixel data from pixel cell array 718. For example, application 708/map generator 721 may identify, from an image, pixels that contain relevant information, and determine a region of interest (ROI) comprising the pixels. Pixel cells that generate pixel data corresponding to the ROI can then be identified. As an illustrative example, referring back to the example of FIG. 6F, application 708/map generator 721 may identify an ROI including the group of pixel cells 650 as providing relevant information (e.g., pixel data of object 652) in an image at time T0. Application 708/map generator 721 can then predict the change in the ROI between times T0 and T6 based on, for example, a direction and a speed of movement of object 652 with respect to image sensor 600. Application 708/map generator 721 can then predict the new image location of the ROI at time T6, which includes the group of pixel cells 670, based on the image location of the group of pixel cells 650 at time T0 and the predicted change. Based on the image location of the group of pixel cells 670 at time T6, application 708/map generator 721 can generate pixel array programming map 720*a* by setting the programming data of the entries corresponding to the group of pixel cells 670 to one, while setting the programming data of the rest of the entries to zero, so that only the group of pixel cells 670 transmits pixel data to host device 702. In some examples, the ROIs can also be used to set a non-uniform spatial sampling rate such that each pixel cell corresponding to the ROIs transmits pixel data, whereas outside the ROI, a sparsely distributed set of pixel cells is selected to transmit pixel data. The selection of which pixel cells to transmit pixel data can be encoded in pixel array programming map 720*a*.

In some examples, application 708/map generator 721 may maintain a model of an environment in which an object being tracked is located based on prior images and predict the pixel cells that are likely to provide the pixel data of the object in a current image based on an environment model. In some examples, image sensor 704, or other processing circuits that is part of the same chip as image sensor 704, may also compute fixed primitives (e.g., temporal or spatial contrast) and estimate where relevant information is occurring based on those primitives, and generate pixel array programming map 720*a* based on the estimation.

Figure 8A:
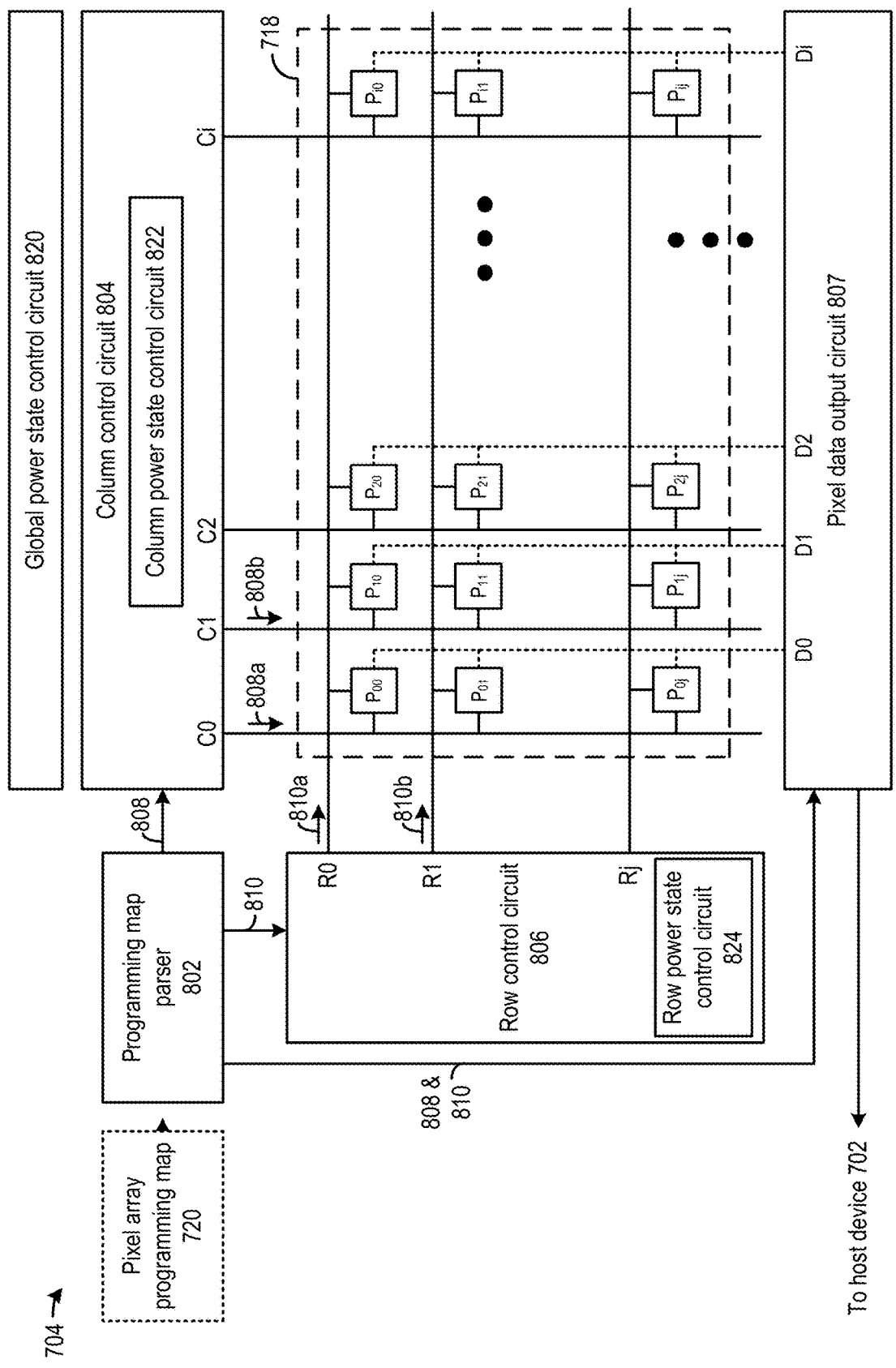
FIG. 8A, FIG. 8B, and FIG. 8C illustrate example components of the image processing system of FIGS. 7A-7C.
Figure 8B:
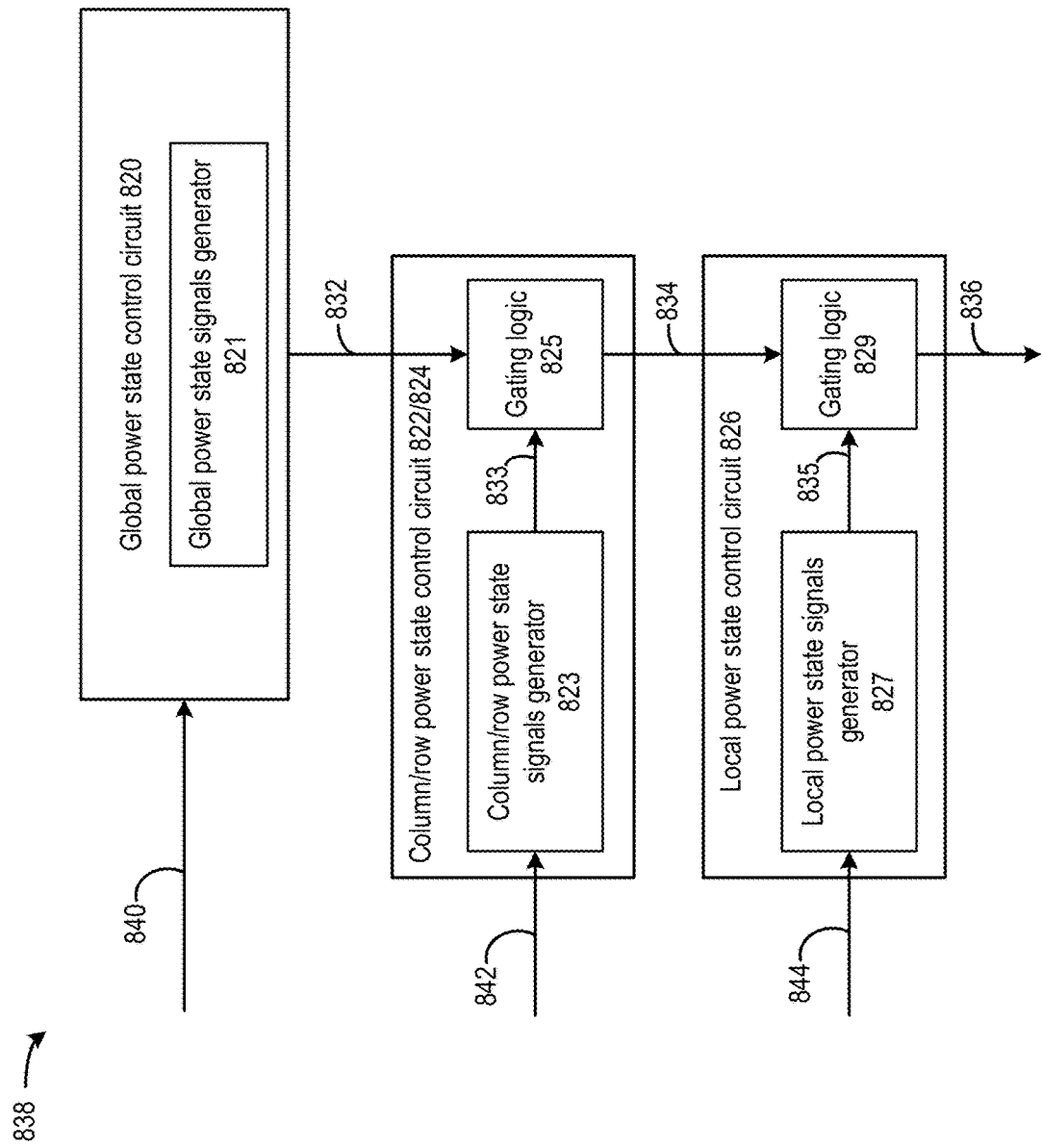
Figure 8C:
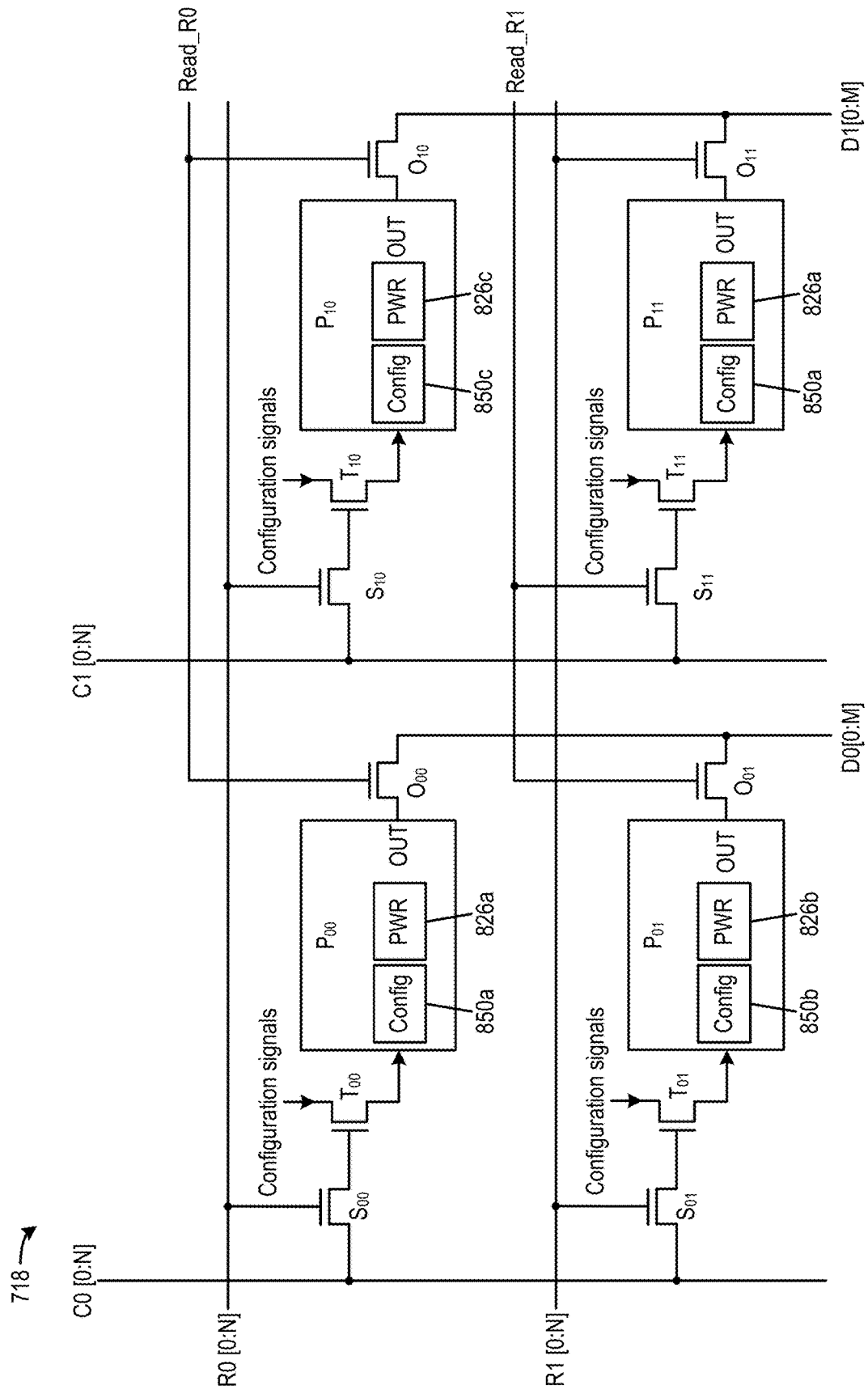

FIG. 8A, FIG. 8B, and FIG. 8C illustrate example components of pixel cell array control circuit 716 and pixel cell array 718 of image sensor 704. As shown in FIG. 8A, pixel cell array control circuit 716 can include a programming map parser 802, a column control circuit 804, a row control circuit 806, and a pixel data output circuit 807. Programming map parser 802 can parse pixel array programming map 720, which can be in a serial data stream, to identify the programming data for each pixel cell (or block of pixel cells). The identification of the programming data can be based on, for example, a pre-determined scanning pattern by which the two-dimensional pixel array programming map is converted into the serial format, as well as the order by which the programming data is received by programming map parser 802 from the serial data stream. Programming map parser 802 can create a mapping among the row addresses of the pixel cells, the column addresses of the pixel cells, and one or more configuration signals based on the programming data targeted at the pixel cells. Based on the mapping, programming map parser 802 can transmit control signals 808 including the column addresses and the configuration signals to column control circuit 804, as well as control signals 810 including the row addresses mapped to the column addresses and the configuration signals to row control circuit 806. In some examples, the configuration signals can also be split between control signals 808 and control signals 810 or sent as part of control signals 810 to row control circuit 806.

Column control circuit 804 and row control circuit 806 are configured to forward the configuration signals received from programming map parser 802 to the configuration memory of each pixel cell of pixel cell array 718. In FIG. 8A, each box labelled $P_{ij}$ (e.g., $P_{00}$, $P_{01}$, $P_{10}$, $P_{11}$) can represent a pixel cell or a block of pixel cells (e.g., a 2×2 array of pixel cells, a 4×4 array of pixel cells) and can include or can be associated with a quantization circuit 620 of FIG. 6E comprising processing circuits 614 and memory 616. As shown in FIG. 8A, column control circuit 804 drives a plurality of sets of column buses C0, C1, . . . Ci. Each set of column buses includes one or more buses and can be used to transmit control signals 722 of FIG. 7A, which can include a column selection signal and/or other configuration signals, to a column of pixel cells. For example, column bus(es) C0 can transmit a column selection signal 808*a* to select a column of pixel cells (or a column of blocks of pixel cells) $p_{00}$, $p_{01}$, . . . $p_{0j}$, column bus(es) C1 can transmit a column selection signal 808*b* to select a column of pixel cells (or blocks of pixel cells) $p_{10}$, $p_{11}$, . . . $p_{1j}$, etc.

Further, row control circuit 806 drives a plurality of sets of row buses labelled R0, R1, . . . Rj. Each set of row buses also includes one or more buses and can be used to transmit control signals 724 of FIG. 7A, which can include a row selection signal and/or other configuration signals, to a row of pixel cells, or a row of blocks of pixel cells. For example, row bus(es) R0 can transmit a row selection signal 810*a* to select a row of pixel cells (or blocks of pixel cells) $p_{00}$, $p_{10}$, . . . $p_{i0}$, row bus(es) R1 can transmit a row selection signal 810*b* to select a row of pixel cells (or blocks of pixel cells) $p_{01}$, $p_{11}$, . . . $p_{1i}$, etc. Any pixel cell (or block of pixel cells) within pixel cell array 718 can be selected based on a combination of the row selection signal and the column signal to receive the configuration signals. The row selection signals, column selection signals, and the configuration signals (if any) are synchronized based on control signals 808 and 810 from programming map parser 802, as described above. Each column of pixel cells can share a set of output buses to transmit pixel data to pixel data output module 807. For example, column of pixel cells (or blocks of pixel cells) $p_{00}, p_{01}, \ldots p_{0j}$ can share output buses $D_0$, column of pixel cells (or blocks of pixel cells) $p_{10}, p_{11}, \ldots p_{1j}$ can share output buses $D_1$, etc.

Pixel data output module 807 can receive the pixel data from the buses, convert the pixel data into one or more serial data streams (e.g., using a shift register), and transmit the data streams to host device 702 under a pre-determined protocol such as MIPI. The data stream can come from a quantization circuit 620 (e.g., processing circuits 614 and memory 616) associated with each pixel cell (or block of pixel cells) as part of a sparse image frame. In addition, pixel data output module 807 can also receive control signals 808 and 810 from programming map parser 802 to determine, for example, which pixel cell does not output pixel data or the bit width of pixel data output by each pixel cell, and then adjust the generation of serial data streams accordingly. For example, pixel data output module 807 can control the shift register to skip a number of bits in generating the serial data streams to account for, for example, variable bit widths of output pixel data among the pixel cells or the disabling of pixel data output at certain pixel cells.

In addition, pixel cell array control circuit 716 further includes a global power state control circuit 820, a column power state control circuit 822, a row power state control circuit 824, and a local power state control circuit 826 at each pixel cell or each block of pixel cells (not shown in FIG. 8A) forming hierarchical power state control circuits. Global power state control circuit 820 can be of the highest level in the hierarchy, followed by row/column power state control circuit 822/824, with local power state control circuit 826 at the lowest level in the hierarchy.

The hierarchical power state control circuits can provide different granularities in controlling the power state of image sensor 704. For example, global power state control circuit 820 can control a global power state of all circuits of image sensor 704, including processing circuits 614 and memory 616 of all pixel cells, DAC 642 and counter 640 of FIG. 6E, etc. Row power state control circuit 822 can control the power state of processing circuits 614 and memory 616 of each row of pixel cells (or blocks of pixel cells) separately, whereas column power state control circuit 824 can control the power state of processing circuits 614 and memory 616 of each column of pixel cells (or blocks of pixel cells) separately. Some examples may include row power state control circuit 822 but not column power state control circuit 824, or vice versa. In addition, local power state control circuit 826 can be part of a pixel cell or a block of pixel cells and can control the power state of processing circuits 614 and memory 616 of the pixel cell or the block of pixel cells.

FIG. 8B illustrates examples of internal components of hierarchical power state control circuits and their operations. Specifically, global power state control circuit 820 can output a global power state signal 832, which can be in the form of a bias voltage, a bias current, a supply voltage, or programming data, which sets a global power state of image sensor 704. Moreover, column power state control circuit 822 (or row power state control circuit 824) can output a column/row power state signal 834 that sets a power state of a column/row of pixel cells (or blocks of pixel cells) of image sensor 704. Column/row power state signal 834 can be transmitted as row signals 810 and column signals 808 to the pixel cells. Further, local power state control circuit 826 can output a local power state signal 836 that sets a power state of the pixel cell (or a block of pixel cells), including the associated processing circuits 614 and memory 616. Local power state signal 836 can be output to processing circuits 614 and memory 616 of the pixel cells to control their power state.

In hierarchical power state control circuits 838, an upper-level power state signal can set an upper bound for a lower-level power state signal. For example, global power state signal 832 can be an upper level power state signal for column/row power state signal 834 and set an upper bound for column/row power state signal 834. Moreover, column/row power state signal 834 can be an upper level power state signal for local power state signal 836 and set an upper bound for local power state signal 836. For example, if global power state signal 832 indicates a low power state, column/row power state signal 834 and local power state signal 836 may also indicate a low power state.

Each of global power state control circuit 820, column/row power state control circuit 822/824, and local power state control circuit 826 can include a power state signal generator, whereas column/row power state control circuit 822/824, and local power state control circuit 826 can include a gating logic to enforce the upper bound imposed by an upper-level power state signal. Specifically, global power state control circuit 820 can include a global power state signals generator 821 to generate global power state signal 832. Global power state signals generator 821 can generate global power state signal 832 based on, for example, an external configuration signal 840 (e.g., from host device 702) or a pre-determined temporal sequences of global power states.

In addition, column/row power state control circuit 822/824 can include a column/row power state signals generator 823 and a gating logic 825. Column/row power state signals generator 823 can generate an intermediate a column/row power state signal 833 based on, for example, an external configuration signal 842 (e.g., from host device 702) or a predetermined temporal sequences of row/column power states. Gating logic 825 can select one of global power state signal 832 or intermediate column/row power state signal 833 representing the lower power state as column/row power state signal 834.

Further, local power state control circuit 826 can include a local power state signals generator 827 and a gating logic 829. Low power state signals generator 827 an intermediate local power state signal 835 based on, for example, an external configuration signal 844, which can be from a pixel array programming map, a pre-determined temporal sequences of row/column power states, etc. Gating logic 829 can select one of intermediate local power state signal 835 or column/row power state signal 834 representing the lower power state as local power state signal 836.

FIG. 8C illustrates additional details of pixel cell array 718, including local power state control circuit 826 (e.g., 826a, 826b, 826c, and 826d, labelled as "PWR" in FIG. 8C) and configuration memory 850 (e.g., 850a, 850b, 850c, and 850d, labelled as "Config" in FIG. 8C) of each pixel cell (or each block of pixel cells). Configuration memory 850 can store first programming data to control a light measurement operation (e.g., exposure period duration, quantization resolution) of a pixel cell (or a block of pixel cells). In addition, configuration memory 850 can also store second programming data that can be used by local power state control circuit 826 to set the power states of processing circuits 614 and memory 616. Configuration memory 850 can be implemented as a static random-access memory (SRAM). Although FIG. 8C shows that local power state control circuit 826 and configuration memory 850 are internal to each pixel cell, it is understood that configuration memory

850 can also be external to each pixel cell, such as when local power state control circuit 826 and configuration memory 850 are for a block of pixel cells.

As shown in FIG. 8C, the configuration memory 850 of each pixel cell is coupled with column buses C and row buses R via transistors S, such as $S_{00}$, $S_{10}$, $S_{10}$, $S_{11}$, etc. In some examples, each set of column buses (e.g., C0, C1) and row buses (e.g., R0, R1) can include multiple bits. For example, in FIG. 8C, each set of column buses and row buses can carry N+1 bits. It is understood that in some examples each set of column buses and row buses can also carry a single data bit. Each pixel cell is also electrically connected with transistors T, such as $T_{00}$, $T_{10}$, $T_{10}$, or $T_{11}$, to control the transmission of configuration signals to the pixel cell (or block of pixel cells). Transistor(s) S of each pixel cell can be driven by the row and column select signals to enable (or disable) the corresponding transistors T to transmit configuration signals to the pixel cell. In some examples, column control circuit 804 and row control circuit 806 can be programmed by a single write instruction (e.g., from host device 702) to write to configuration memory 850 of multiple pixel cells simultaneously. Column control circuit 804 and row control circuit 806 can then control the row buses and column buses to write to the configuration memory of the pixel cells.

In some examples, local power state control circuit 826 can also receive configuration signal directly from transistors T without storing the configuration signals in configuration memory 850. For example, as described above, local power state control circuit 826 can receive row/column power state signal 834, which can be an analog signal such as a voltage bias signal or a supply voltage, to control the power state of the pixel cell and the processing circuits and/or memory used by the pixel cell.

In addition, each pixel cell also includes transistors O, such as $O_{00}$, $O_{10}$, $O_{10}$, or $O_{11}$, to control the sharing of the output bus D among a column of pixel cells. The transistors O of each row can be controlled by a read signal (e.g., read_R0, read_R1) to enable a row-by-row read out of the pixel data, such that one row of pixel cells output pixel data through output buses D0, D1, . . . Di, followed by the next row of pixel cells.

In some examples, the circuit components of pixel cell array 718, including processing circuits 614 and memory 616, counter 640, DAC 642, buffer network including buffers 630, etc., can be organized into a hierarchical power domain managed by hierarchical power state control circuits 838. The hierarchical power domain may include a hierarchy of multiple power domains and power sub-domains. The hierarchical power state control circuits can individually set a power state of each power domain, and each power sub-domain under each power domain. Such arrangements allow fine grain control of the power consumption by image sensor 704 and support various spatial and temporal power state control operations to further improve the power efficiency of image sensor 704.

While a sparse-image sensing operation can reduce the power and bandwidth requirement, having pixel-level ADCs (e.g., as shown in FIG. 6C) or block-level ADCs (e.g., as shown in FIG. 6E) to perform the quantization operations for the sparse-image sensing operation can still lead to inefficient use of power. Specifically, while some of the pixel-level or block-level ADCs are disabled, high speed control signals, such as clocks, analog ramp signals, or digital ramp signals, may still be transmitted to each pixel-level or block-level ADCs via buffer network 630, which can consume a substantial amount of power and increase the average power consumption for generation of each pixel. The inefficiency can be further exacerbated when the sparsity of the image frame increases (e.g., containing fewer pixels), but the high speed control signals are still transmitted to each pixel cell, such that the power consumption in transmitting the high speed control signals remains the same and the average power consumption for generation of each pixel increases due to fewer pixels being generated.

Figure 9:
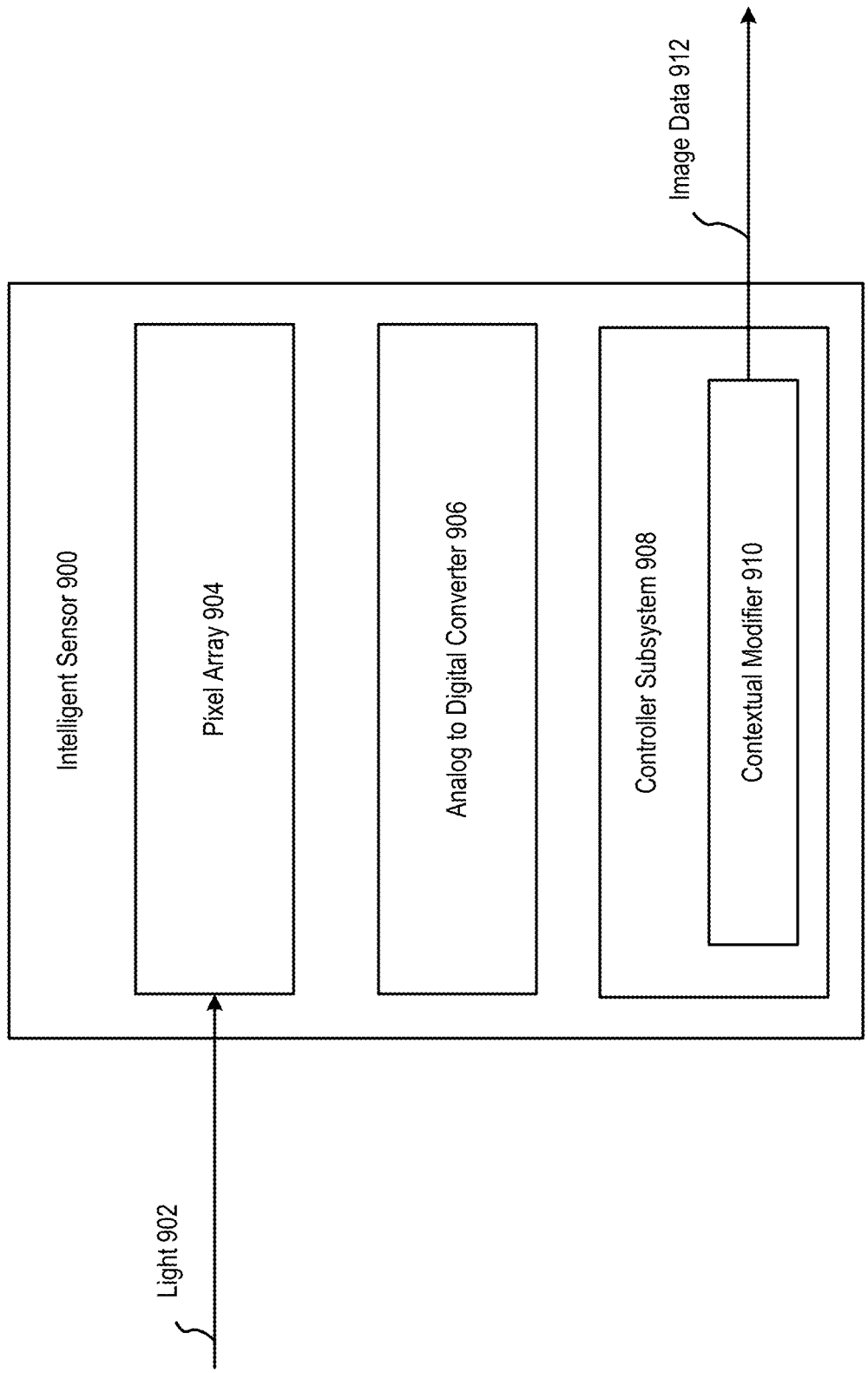
FIG. 9 illustrates an example intelligent image sensor and integrated controller subsystem.

FIG. 9 illustrates an example intelligent image sensor and integrated controller subsystem. Specifically, FIG. 9 depicts an intelligent sensor which receives, as input, light, from an environment and outputs digital image data. Intelligent sensor 900 contains pixel array 904, which may be a pixel array including an array of pixel cells. The pixel cells of pixel array 904 may each include one or more photodiodes configured to generate a charge in response to receiving light 902 as input. When the charge is generated, a charge storage device may convert the charge to output a voltage.

Intelligent sensor 900 contains analog to digital converter 906. Analog to digital converter 906 may be a system of subsystem configured to receive, as input an analog signal, such as an array of voltages generated by the charge storage devices of the pixel array, and output digital pixel data. Analog to digital converter 906 may be any entity for converting an analog signal to a digital signal and may be similar to the converters described herein.

Intelligent sensor 900 contains controller subsystem 908. Controller subsystem 908 may be a processing system built into intelligent sensor 900 configured to facilitate on-sensor processing of digital image data output by the analog to digital converter 906. Controller subsystem may be a system comprising a processor and a plurality of computer-readable instructions stored in memory, such that when the processor executes the computer-readable instructions, the processor is configured to perform the processes and methods described herein.

Controller subsystem 908 may include contextual modifier 910. As described herein, contextual modifier 910 may be a subsystem of controller subsystem 908 for facilitating removal, masking, and/or transformation of digital image data prior to export of the digital image data off-sensor. Contextual modifier 908 may use the digital image data received from analog to digital converter 908 to generate and export image data 912 to a separate system, such as an image compilation system to which the intelligent sensor 900 is communicatively coupled.

Figure 10:
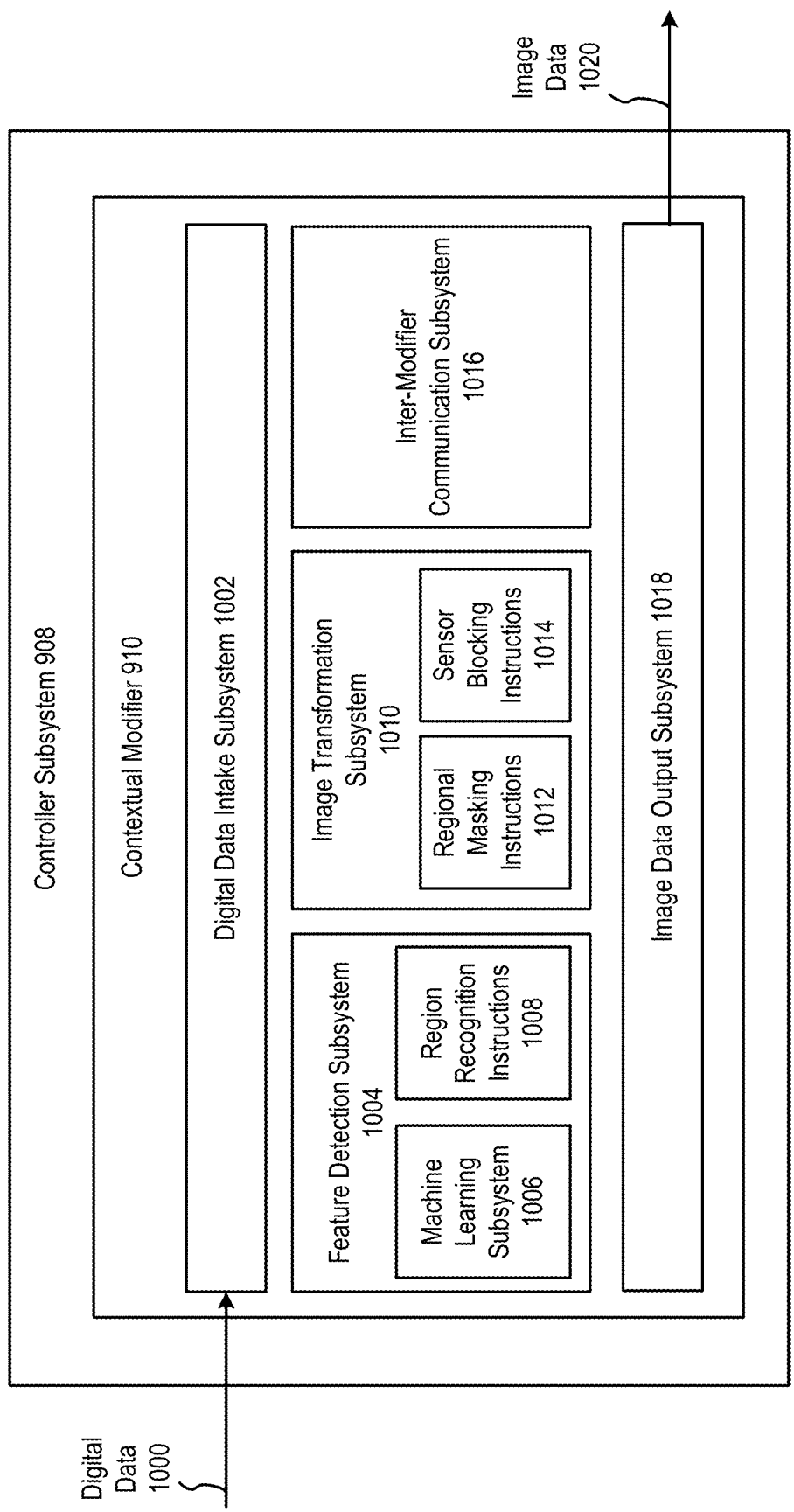
FIG. 10 illustrates an example controller system including a contextual modifier subsystem.

FIG. 10 illustrates an example controller system including a contextual modifier subsystem. Specifically, FIG. 10 depicts a controller subsystem 908 of an intelligent sensor 900 including a contextual modifier 910 and various subsystems included therein. It will be understood that the arrangement of entities depicted in FIG. 10 is depicted for the example purposes, and any arrangement including more or less entities within the controller subsystem 908 is possible.

Contextual modifier 910 contains digital data intake subsystem 1002. Digital data intake subsystem may be a subsystem configured to intake digital data 1000. For example, digital data 1000 may be received from analog to digital converter 906 after analog to digital converter 906 has converted an array of voltages to digital data 1000. Digital data intake subsystem 1002 may be communicatively coupled to any other system or subsystem present within contextual modifier 910. For example, digital data intake subsystem 1002 may be coupled to a feature detection subsystem which will analyze the digital data 1000.

Contextual modifier 910 contains feature detection subsystem 1004. Feature detection subsystem 1004 may be a subsystem within contextual modifier 910 configured to utilize digital data received at the contextual modifier 910 to detect features depicted in a corresponding digital image. Feature detection subsystem 1004 may include one or more additional subsystems for detecting features in a digital image according to the embodiments described herein.

Feature detection subsystem 1004 contains machine learning subsystem 1006. Machine learning subsystem 1006 may be a machine learning system operating within feature detection subsystem 1004. Specifically, machine learning subsystem 1006 may be configured to receive, as input, raw digital data output from an ADC. The machine learning subsystem 1006 may be further configured to output, based on the input, prediction data, the prediction data corresponding to confidence values that a particular pattern or ROI exists within the digital data. For example, digital data corresponding to a digital image may be input to the machine learning subsystem 1006 to cause output of one or more prediction values. The one or more prediction values may correspond to a likelihood or confidence that one or more regions/patterns of pixel values in the digital data correspond to regions of interest.

Feature detection subsystem contains region recognition instructions 1008. Region recognition instructions 1008 may be instructions for determining, based on the prediction data output by machine learning subsystem 1006, one or more features present in the digital data. In one example, region recognition instructions 1008 are instructions including mapping data between predicted ROIs and known shapes of features. In another example, region recognition instructions are machine-learning instructions for determining one or more features of the digital data based on input regions of interest. For example, region recognition instructions 1008 may be instructions for operating a convolutional neural network machine learning model which intake, as input, one or more regions of interest determined from prediction data and outputs feature classifications. The feature classification may be performed by a machine learning model contained in machine learning subsystem 1006. The output of feature detection subsystem 1004 digital data comprising one or more classified regions of the digital data corresponding to predicted features. [INVENTORS: Are there any additional details about the machine-learning process or additional particular machine-learning models that we should mention here?]

Contextual modifier 910 contains image transformation subsystem 1010. Image transformation subsystem 1010 may be a subsystem of contextual modifier 910 configured to remove, alter, mask, or otherwise transform a portion of an image corresponding at least to detected features of a digital image. Image transformation subsystem 1010 may receive digital data corresponding to predicted features of an image from feature detection subsystem 1004. In response to receiving the digital data, image transformation subsystem 110 may be configured to process the digital data to determine one or more transformation actions that will be taken with regard to the digital data.

Image transformation subsystem 1010 contains regional masking instructions 1012. Masking instructions 1012 may be instructions for masking at least a portion of digital data prior to export of image data off-sensor. In some examples, regional masking instructions 1012 are utilized by image transformation subsystem 1010 in response to a determination that digital data received by image transformation subsystem 1010 should mask a portion of the digital data. For example, image transformation subsystem 1010 may utilize regional masking instructions 1012 to mask digital data corresponding to a region of a digital image. The masking may be performed on a subset of the digital data corresponding to a determined feature of the image, such as an alterable feature which should not be exported off-sensor. As described herein, the contextual modifier 910 operating as part of a controller subsystem 908 may utilize regional masking instructions 1012 to mask a portion of a digital image instead of altering/preventing export of pixel data related to the digital image in entirety. A subset of the digital image and/or the entire digital image may then be exported off-sensor. As described herein, masking may be a transformation process wherein pixel values are transformed to obscure or otherwise change aspects of an object or objects depicted within the digital image.

Image transformation subsystem 1010 contains sensor blocking instructions 1014. Sensor blocking instructions 1014 may be instructions for blocking export of digital data off-sensor. In some examples, sensor blocking instructions 1014 are utilized by image transformation subsystem 1010 in response to a determination that digital data received by image transformation subsystem 1010 should be blocked in whole from off-sensor export. For example, image transformation subsystem 1010 may utilize sensor blocking instructions 1014 to turn off or otherwise block a sensor from capturing an image, such as by disabling one or more of a charge measurement circuit 612, processing circuits 614, etc.

In some examples, the contextual modifier 910 may utilize locally generated data and/or externally generated data to determine whether to mask a digital image or prevent transmission of the digital image off sensor in its entirety. For example, the contextual modifier subsystem 910 may be configured predict an environment depicted in a captured digital image. In some examples, additional intelligent sensors in communication with the contextual modifier 910 may send to the contextual modifier 910, some data relating to a predicted environment in which the sensors reside. The contextual modifier 910 may use local and/or external data from the additional sensors to automatically turn off or turn on sensor capture features when entering or exiting an alterable environmental, respectively. For example, the contextual modifier 910 may use one or more machine-learning techniques to predict that a captured scene depicted in a digital image corresponds to an alterable environment (e.g., a bathroom). The contextual modifier 910 may then shut off and prevent transmission of data off-sensor while inside of the alterable environment, rather than attempting to mask various alterable objects within the environment individually.

In some examples, the contextual modifier 910 may use supplementary information to predict the environment in which it, or a broader apparatus, resides. For example, a spatial sensor communicatively coupled to the contextual modifier 910 may determine that the contextual modifier 910 is entering a geographic location known to correspond to alterable objects, such as a bathroom. The contextual modifier 910 may utilize that information as part of the alterable environment prediction. The spatial sensor may also communicate to the contextual modifier 910 that it is leaving an alterable environment, at which point the contextual modifier may restart transmission of data off-sensor.

Contextual modifier 910 contains inter-modifier communication subsystem 1016. Inter-modifier communication subsystem 1016 may be a system or subsystem configured to facilitate communications between intelligent sensor 900 and other intelligent sensors in an intelligent sensor array. For example, inter-modifier communication subsystem 1016 may contain instructions for sending and receiving data from an intelligent sensor 900 according to an inter-modifier communication protocol.

Contextual modifier 910 contains image data output subsystem 1018. Image data output subsystem 1018 may be a subsystem within contextual modifier 910 configured to output image data 1020 to another off-sensor system. For example, image data output subsystem 1018 may be a subsystem of contextual modifier 910 configured to facilitate the transmission of image data output from image transformation subsystem 1002 to an external system, such as an image compilation system.

Figure 11:
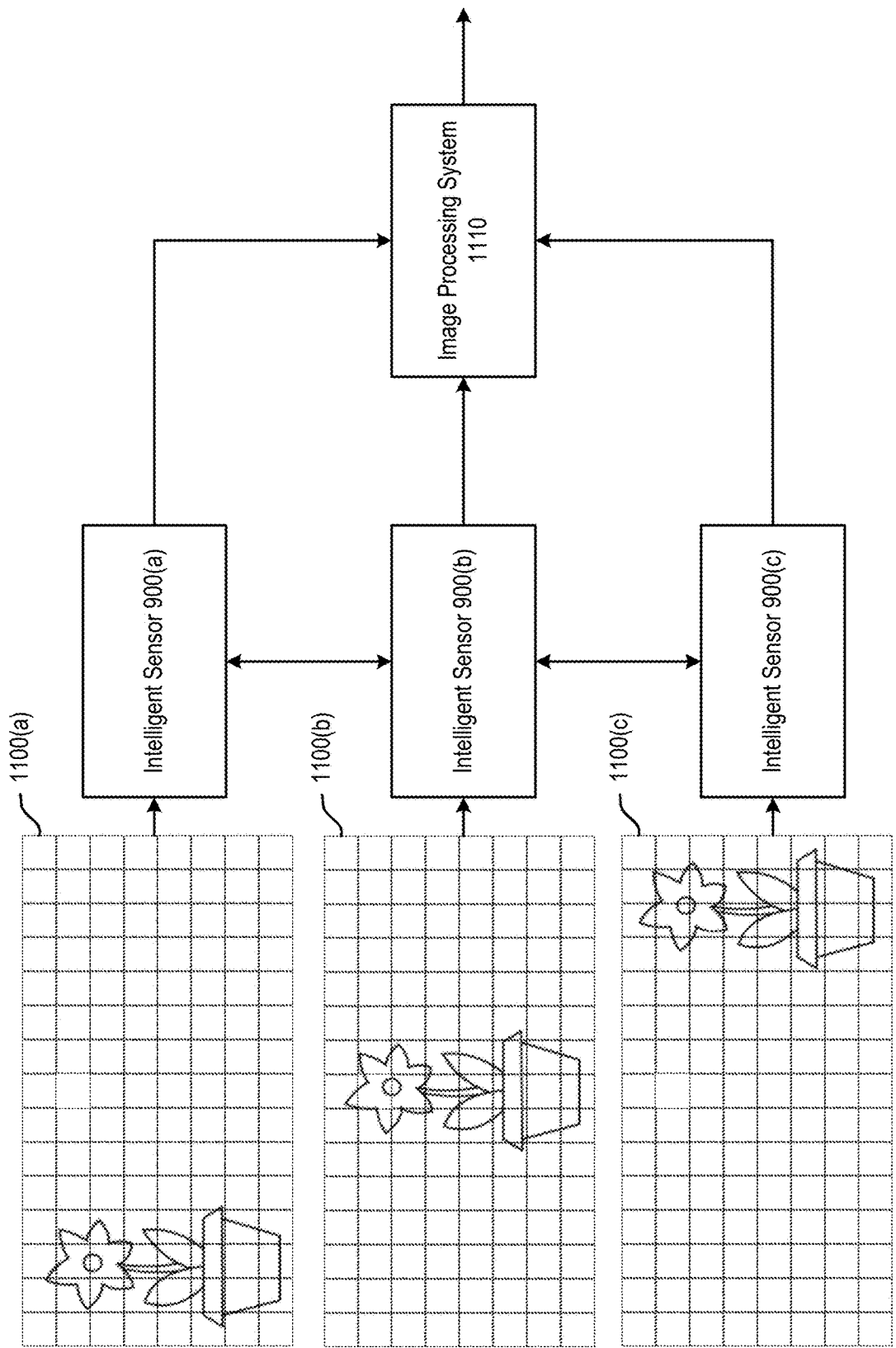
FIG. 11 is a block diagram illustrating a multi-intelligent sensor array for image capture and processing.

FIG. 11 is a block diagram illustrating a multi-intelligent sensor array for image capture and processing. Specifically, FIG. 11 depicts multiple communicatively coupled intelligent sensors. As depicted in FIG. 11, intelligent sensors 900(a)-900(c) may be in communication as part of an intelligent sensor array. Each of intelligent sensors 900(a)-900(c) may be configured to received digital images 1100(a)-1100(c) respectively through scene capture of an environment. For example, as depicted in FIG. 11, each of digital images 1100(a)-1100(c) is a digital image comprising pixel data related to different captured scenes of an environment. The particular scenes shown in digital images 1100(a)-1100(c) depict a particular feature of an environment from different orientations.

Each of intelligent sensor 900(a)-900(c) may be configured to send image data to an image processing system 1110. In some examples, image processing system 1110 may be a system for processing one or more images received from intelligent sensors 900(a)-900(c) as part of a separate process. For example, image processing system 1110 may be an image compilation system which utilizes multiple received images and compiles the received images to form a consolidated image. A consolidated image may be used in numerous applications, such as AR applications, VR applications, MR applications, etc. According to the embodiments described herein, each of intelligent sensors 900(a)-900(c) are configured with an on-sensor contextual modifier subsystem to prevent transmission of an image depicting an alterable feature to image processing system 1110.

Figure 12:
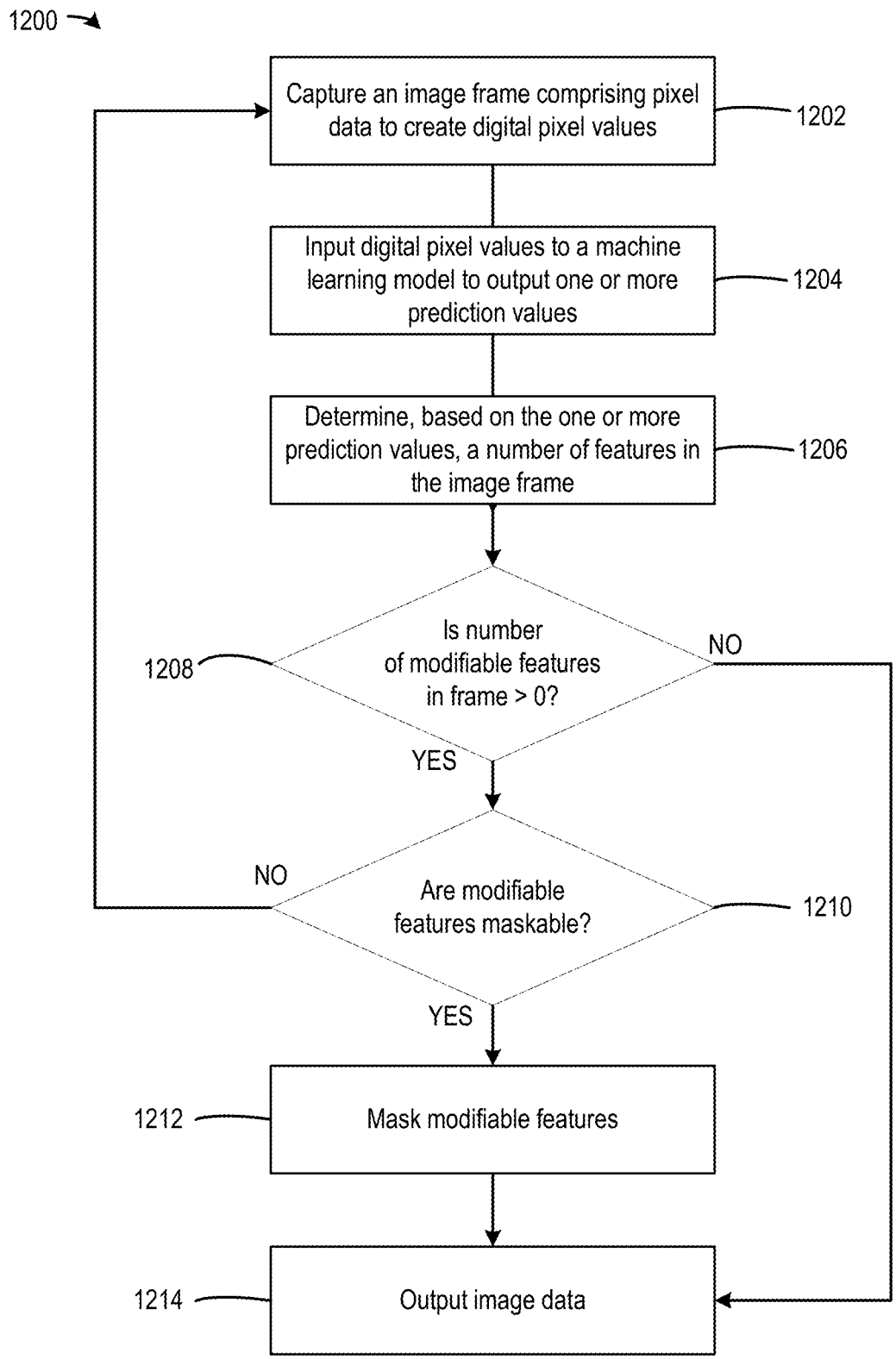
FIG. 12 illustrates and example process for capturing and transforming a digital image for output by an on-sensor controller.

FIG. 12 illustrates an example process for capturing and transforming a digital image for output by an on-sensor controller. Specifically, FIG. 12 depicts a flowchart for implementing an on-sensor controller modifier according to the embodiments described herein. Process 1200 may begin at block 1202 by capturing an image frame comprising pixel data to create digital pixel values. In some embodiments, capturing the image frame includes utilizing one or more photodiodes configured to generate a charge in response to light that can be stored by a charge storage device as an array of voltages. The array of voltages may be input to an ADC to generate the digital pixel values corresponding to the captured image frame.

At block 1204, the digital pixel values are input to a machine-learning model to output one or more prediction values generally as described above with respect to FIG. 10. In some embodiments, the digital pixel values are an array of pixel values corresponding to a digital image. The machine-learning model may intake an array of pixel values as input to cause outputting one or more prediction values corresponding to predictions regarding the captured image frame. For example, an array of pixel values may be mapped to nodes within a convolutional neural network machine learning model. The nodes of the machine-learning model may then be used to generate prediction data regarding regions of interest identified within the array of pixel values.

At block 1206, a number of features in the image frame are determined using the prediction values. In some embodiments, the output prediction values of the machine-learning model are used to identify regions of interest and classify the regions according to predicted features. In some embodiments, the machine-learning model employed in block 1204 may be further configured to utilize determined prediction values to classify one or more features of the captured image frame. For example, a multi-layer machine-learning model may first generate prediction values based on an input array of pixel values. The generated prediction values may further be mapped to nodes of the multi-layer machine-learning model to determine one or more predicted features of the captured image frame.

At decision block 1208, it is determined whether the number of determined alterable features in the image frame is greater than zero. For example, the predicted features generated in block 1206 may be further used to classify the predicted features as alterable or non-alterable features. A captured image frame may contain one or more alterable features, one or more of which may be altered or blocked from export from the intelligent sensor to improve digital image representations of a scene. Alternatively, a captured image frame may contain multiple features, none of which are classified as alterable features. Determination of the number of alterable features may be performed by a subsystem of a contextual modifier. For example, the subsystem may contain one or more mappings of known features to a designation of alterable or not alterable. The contextual modifier or a subsystem included thereon may count the number of alterable-classified features within the captured image frame. If the number of alterable features is zero, the process 1200 proceeds to block 1214.

If the number of alterable features is non-zero, the process 1200 proceeds to block 1210. At decision block 1210, it is determined if the alterable features are maskable from the image. The determination may be based on one or more aspects of the predicted feature within the captured image frame. For example, a protocol may dictate that certain alterable features, for example, barcodes, are maskable through a blurring operation at associated pixels. Another protocol may dictate that other features are not maskable because application of a mask would still render the captured image frame undesirable to a user. In some examples, the protocol may dictate that certain alterable features are maskable by setting one or more pixel values to 0. If it is determined that an alterable features is not maskable, the process 1200 proceeds to block 1202, where a new image frame is captured.

If it is determined that the alterable features in the captured image frame are maskable, the process 1200 proceeds to block 1212. At block 1212, the alterable features are masked. The masking may include transformation of pixel values or other aspects of the pixel data to mask the alterable feature. Once the alterable features have been masked, at block 1214, the masked image data is output, e.g., to an image processing system 1110.

In various embodiments, a user or administrator of a contextual modifier subsystem may provide an alterability configuration to the modifier. The alterability configuration may be a set of instructions or protocols for which features are defined as alterable objects. In this manner, the contextual modifier subsystem may determine alterable features based on a variable configuration, and any two intelligent sensors utilizing different configurations may not predict alterable features in the same manner.

In various embodiments, rules regarding an environment may be automatically sent to and applied by a contextual modifier subsystem as part of feature determination processes. For example, if a contextual modifier subsystem determines that a context of an environment indicates that an environment is outdoors, the contextual modifier may automatically export digital image data to another system because it is unlikely that brightly lit outdoor features are alterable features because on an end-use (such as an application) of the intelligent sensor.

In various embodiments, a contextual modifier subsystem operating as part of a sensor array may sample images captured by the sensor on a rotating basis with other sensors in the sensor array. For example, in a sensor array consisting of two sensors, each modifier subsystem of each sensor may sample captured images in an alternating format. Each modifier subsystem may communicate with other modifier subsystems in a rotating sampling format to preserve power consumption of the sensors while maintaining a significant portion of the functionalities described herein.

Figure 13:
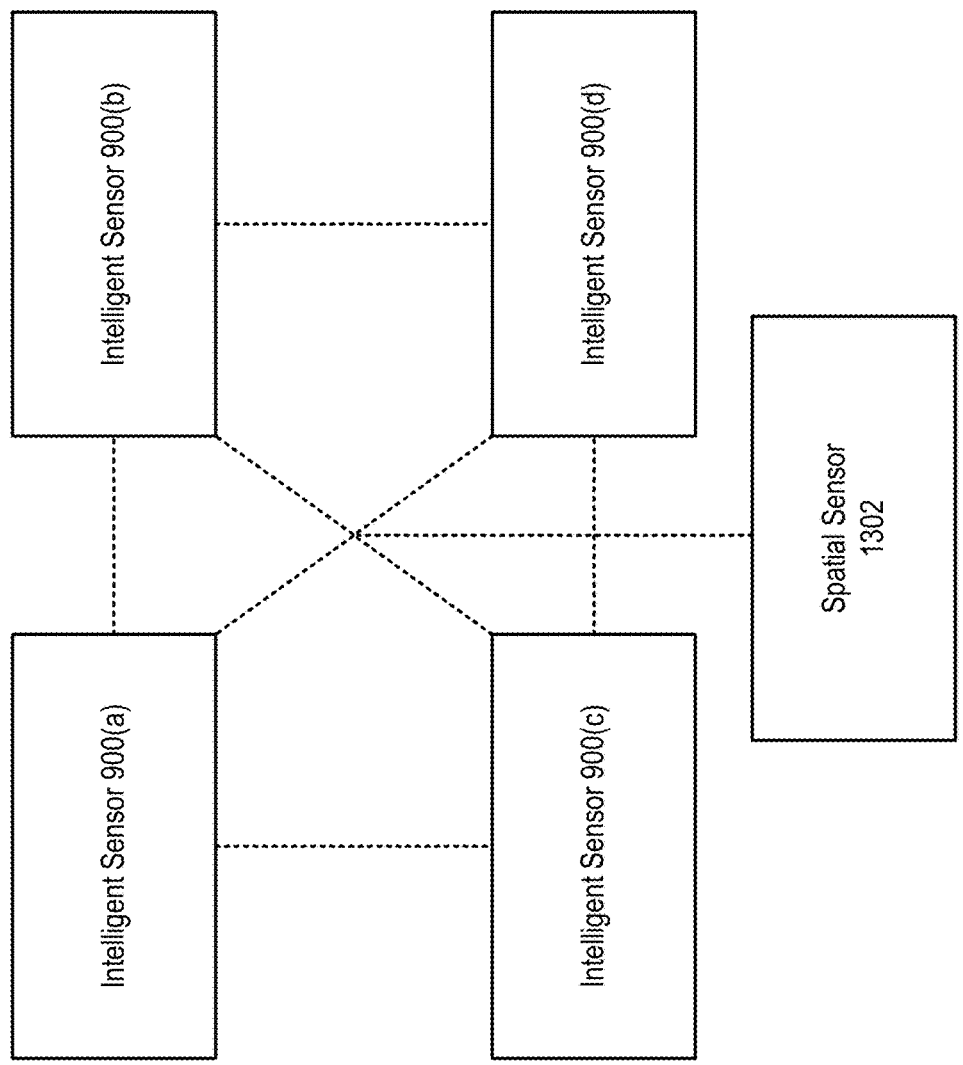
FIG. 13 is a block diagram illustrating a multi-intelligent sensor array including a spatial sensor.

FIG. 13 is a block diagram illustrating an intelligent sensor array including a spatial sensor. Specifically, FIG. 13 depicts an arrangement of intelligent sensors 900(a)-900(d) as part of an intelligent sensor array 1300 including a spatial sensor 1302 for providing contextual information to the sensor array. As depicted in FIG. 13, each of intelligent sensors 900(a)-900(d) in communicatively coupled to each other intelligent sensor in the intelligent sensor array 1300. Each intelligent sensor is further communicatively coupled to spatial sensor 1302.

Spatial sensor 1302 may be any sensor or spatial system configured to generate contextual data for utilization by intelligent sensor array 1300. In some examples, spatial sensor 1302 is an orientation sensor configured to track and determine a relative location, orientation, and/or movement of the sensor array 1300. In other examples, spatial sensor 1302 is a leader intelligent sensor, the leader intelligent sensor designed to be output main image data. In still other examples, spatial sensor 1302 is a radar sensor configured to utilize light-based radar techniques to determine a relative distance between the intelligent sensor array 1300 and one or more features of an environment. In still other examples, spatial sensor 1302 is an environmental sensor configured to determine one or more aspects of an environment. Spatial sensor may also be any combination of the systems described herein and may generate contextual data which may be sent to one or more contextual modifiers of intelligent sensors 900(a)-900(d) of the intelligent sensor array 1300 to improve feature determination and transformation processes.

FIGS. 14A-14I depict an example environment illustrating digital image capture and transformation techniques according to the embodiments described herein. Specifically, FIGS. 14A-14I depict multiple example embodiments of image capture and transformation using all, or a subset of, the intelligent sensor array 1300 depicted in FIG. 13.

Figure 14B:
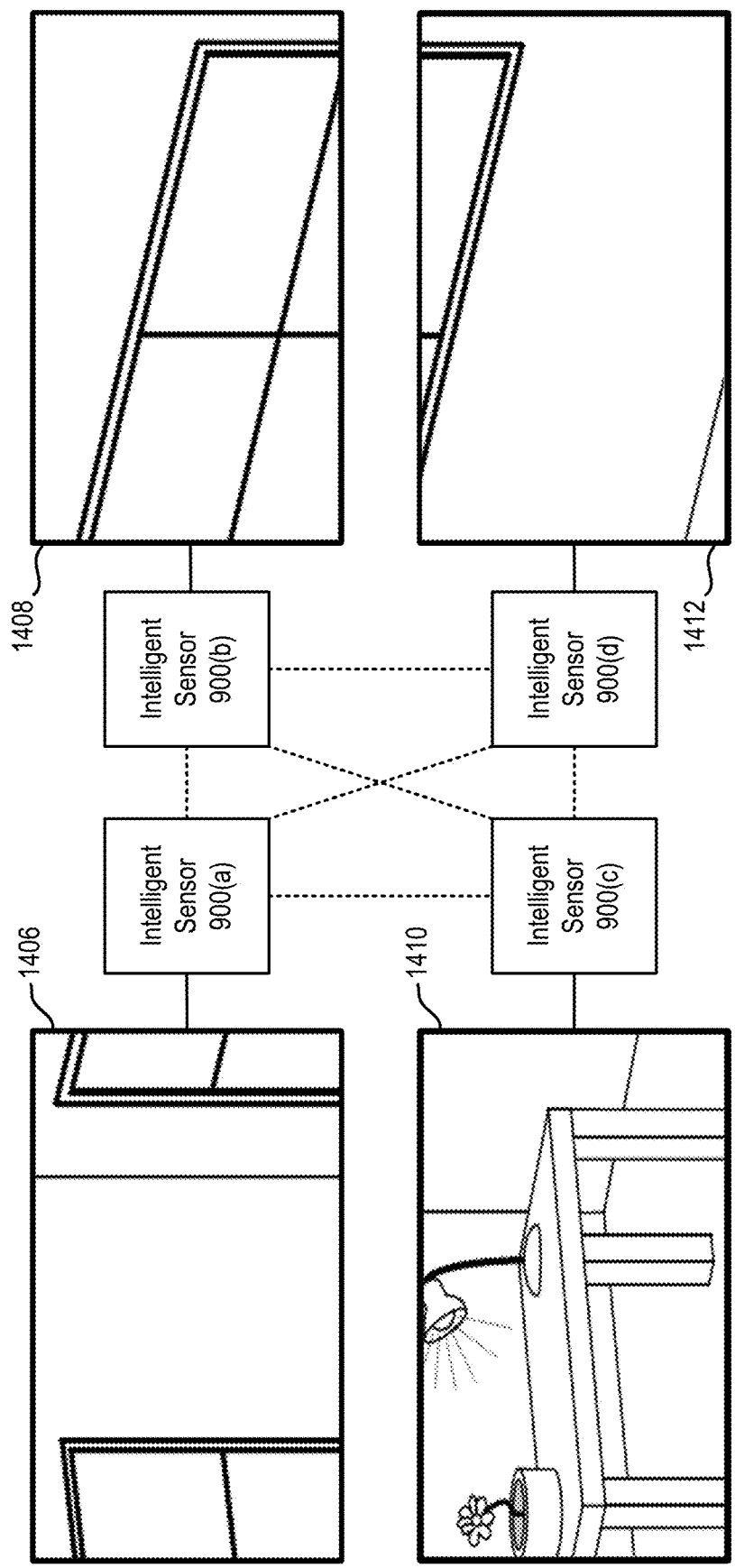

FIG. 14A depicts an example environment from which images may be captured by an intelligent sensor. Environment 1400 depicted in FIG. 14A depicts multiple aspects and features of an environment. Among the features depicted in environment 1400 is a potted plant 1402 and a bright lamp 1404. A potted plant 1402 may be a feature that is not alterable in many examples, including those depicted in FIGS. 14A-14I. A bright lamp 1404 may be a feature that is alterable in many examples, including those depicted in FIGS. 14A-14I.

FIG. 14B depicts the example environment 1400 of FIG. 14A, as captured by an intelligent sensor array. For example, each of intelligent sensors 900(a)-900(d) may capture scenes 1406-1412 respectively. As depicted in FIG. 14B, each of scenes 1406 is an image-based subset of the environment 1400 as captured by a respective intelligent sensor. For example, each of scene 1406-1412 are different scenes because each of intelligent sensors 900(a)-900(d) corresponds to a different relative orientation in the intelligent sensor array 1300.

Figure 14C:
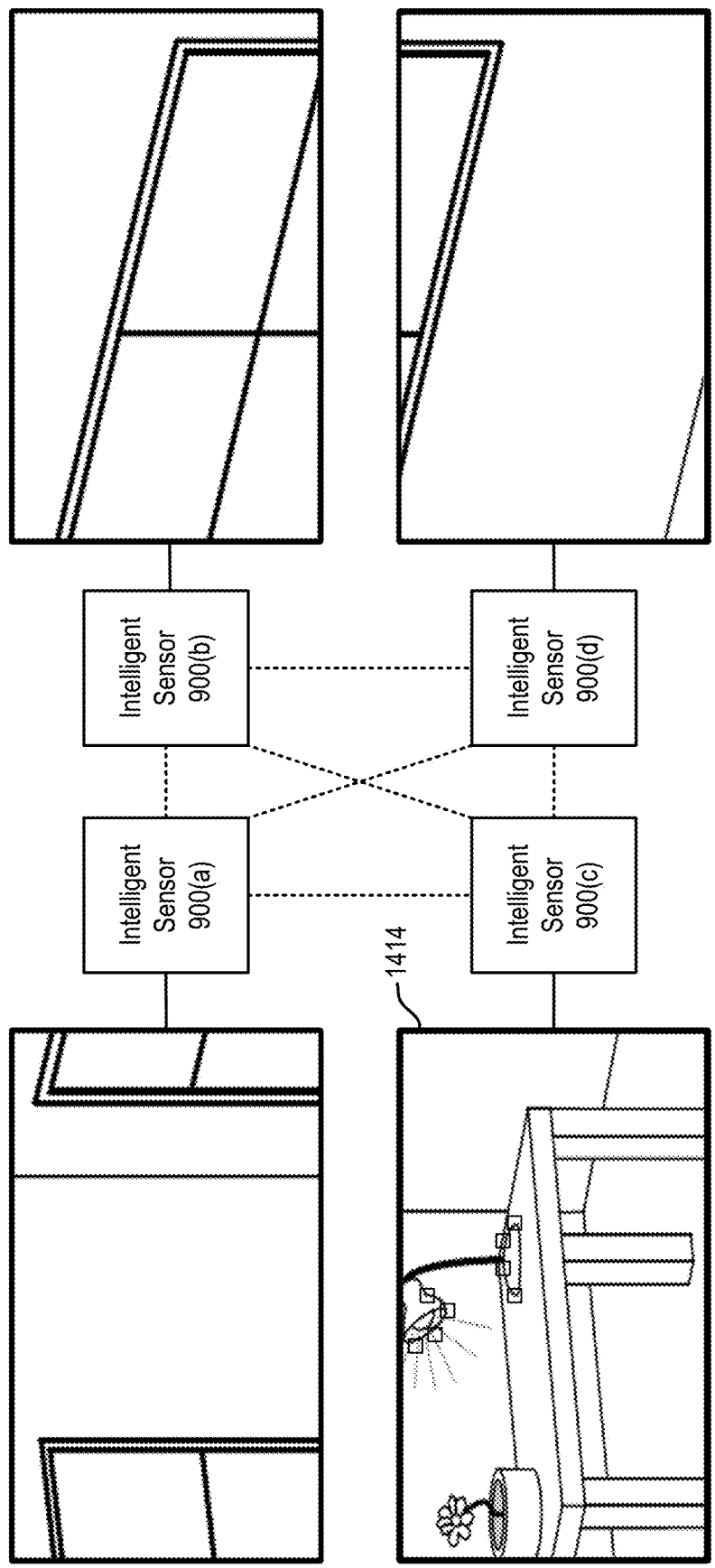

FIG. 14C depicts the example captured environment of FIG. 14B, as captured by an intelligent sensor array. For example, feature prediction image 1414 may correspond to a predicted feature recognition image as processed by intelligent sensor 900(c). The feature prediction image 1414 may correspond to a result of inputting digital image 1410 into a machine learning algorithm facilitated by a contextual modifier operating on intelligent sensor 900(c). As depicted in FIG. 14C, the bright lamp 1404 has been identified as a feature of interest based on multiple regions of interest determined on feature prediction image 1414. For example, the machine learning algorithm may determine that the contours of the object detected are likely to be a lamp, and/or the brightness values of pixels around the object may indicate it is a bright light source.

Figure 14D:
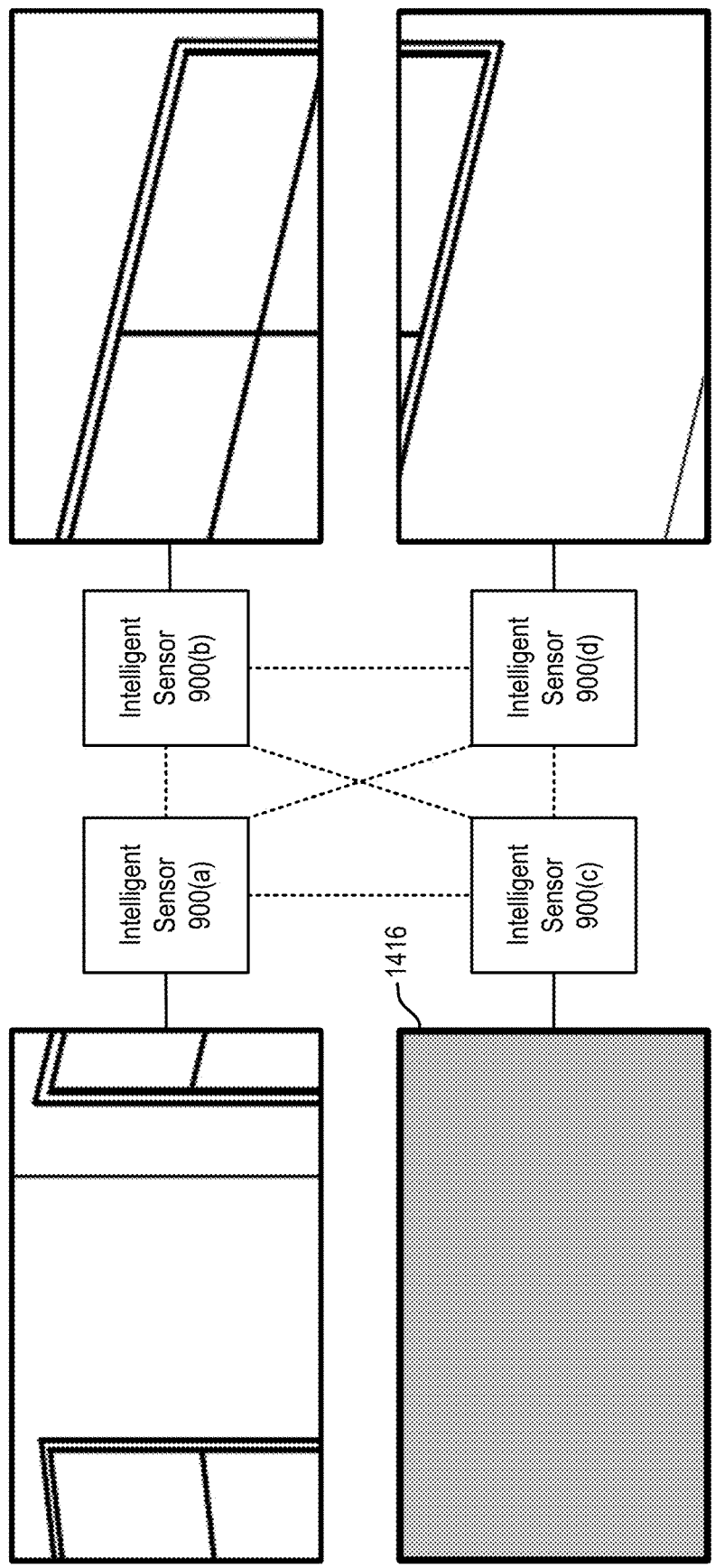

FIG. 14D depicts the example captured environment of FIG. 14C, as captured by an intelligent sensor array 1300 and responsively acted upon by one or more contextual modifiers operating at the intelligent sensors 900(a)-900(d). For example, blank scene 1416 may correspond to a null digital image as processed by intelligent sensor 900(c). The blank scene 1416 may correspond to a result of detecting the bright lamp 1404 in the scene and subsequently turning off the intelligent sensor 900(c) The blank scene 1416 may alternatively correspond to a result of detecting the bright lamp 1404 and subsequently transforming all pixels in the digital image captured by intelligent sensor 900(c) into uniformly colored pixels to remove the pattern of pixel values corresponding to the bright lamp 1404. This prevents the image of the bright lamp from being exported off-sensor and may improve user experiences by eliminating an otherwise irritating bright light.

Figure 14E:
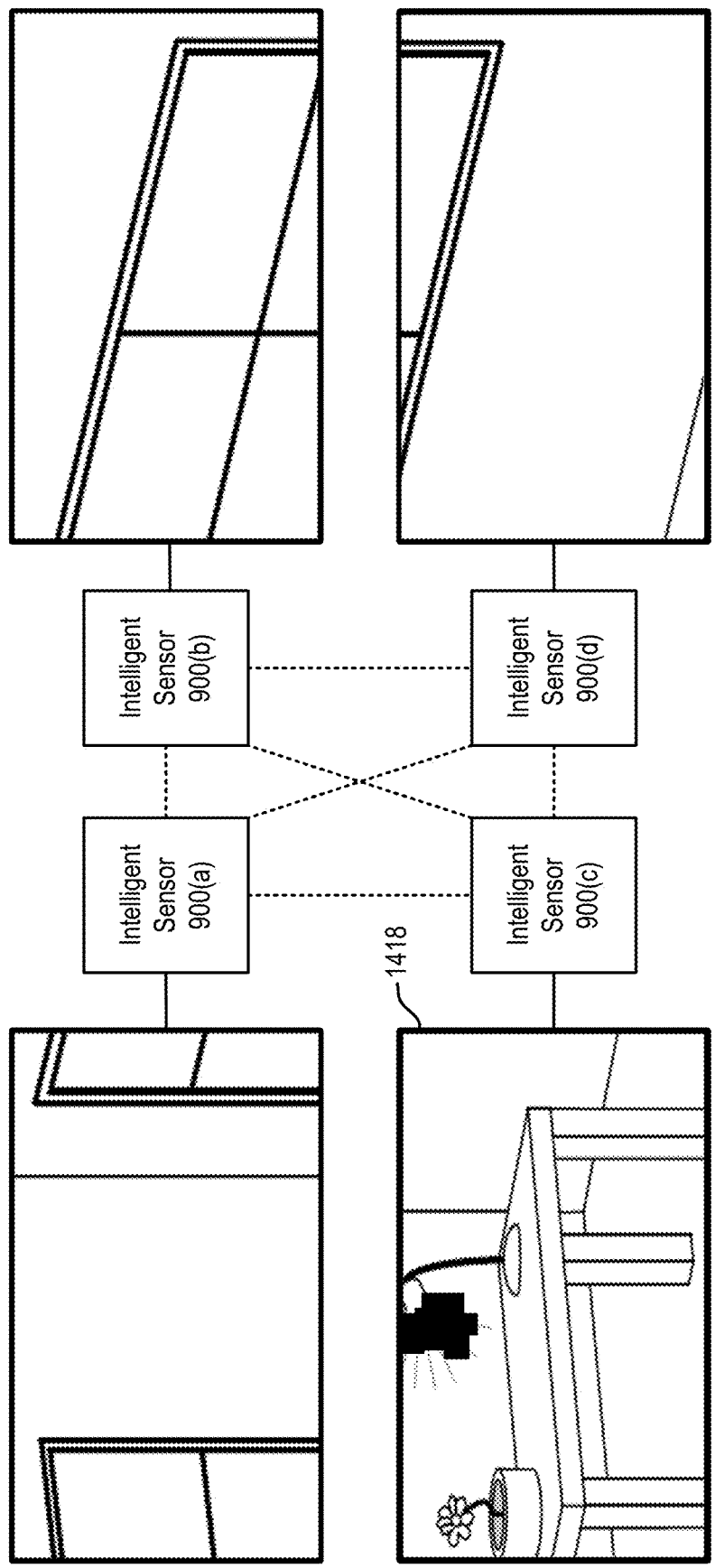

FIG. 14E depicts the example captured environment of FIG. 14C, as captured by an intelligent sensor array and responsively acted upon by one or more contextual modifiers operating at the intelligent sensors array 1300. For example, masked scene 1418 may correspond to a masked digital image as processed by intelligent sensor 900(c). The masked scene 1418 may correspond to a result of detecting the bright lamp 1404 and subsequently masking one or more regions/pixels in the digital image which are associated with the bright lamp 1404. The masked scene 1418 may be transformed by changing pixel values associated with the alterable feature to one or more different pixel values. For example, the associated pixels in masked scene 1418 of FIG. 14E are depicted as censored with solid black pixel values. Alternatively, the pixels associated with and around the alterable features may be blurred according to image transformation techniques. For example, as depicted in FIG. 14E, even though the machine learning algorithm has determined the features to correspond to a lamp, the algorithm has determined only to mask the bright light emanating from the lamp and not the entire lamp itself. This may represent the prediction that it is not the lamp that a user would prefer to alter, but rather only the bright light emanating from the lamp.

Figure 14F:
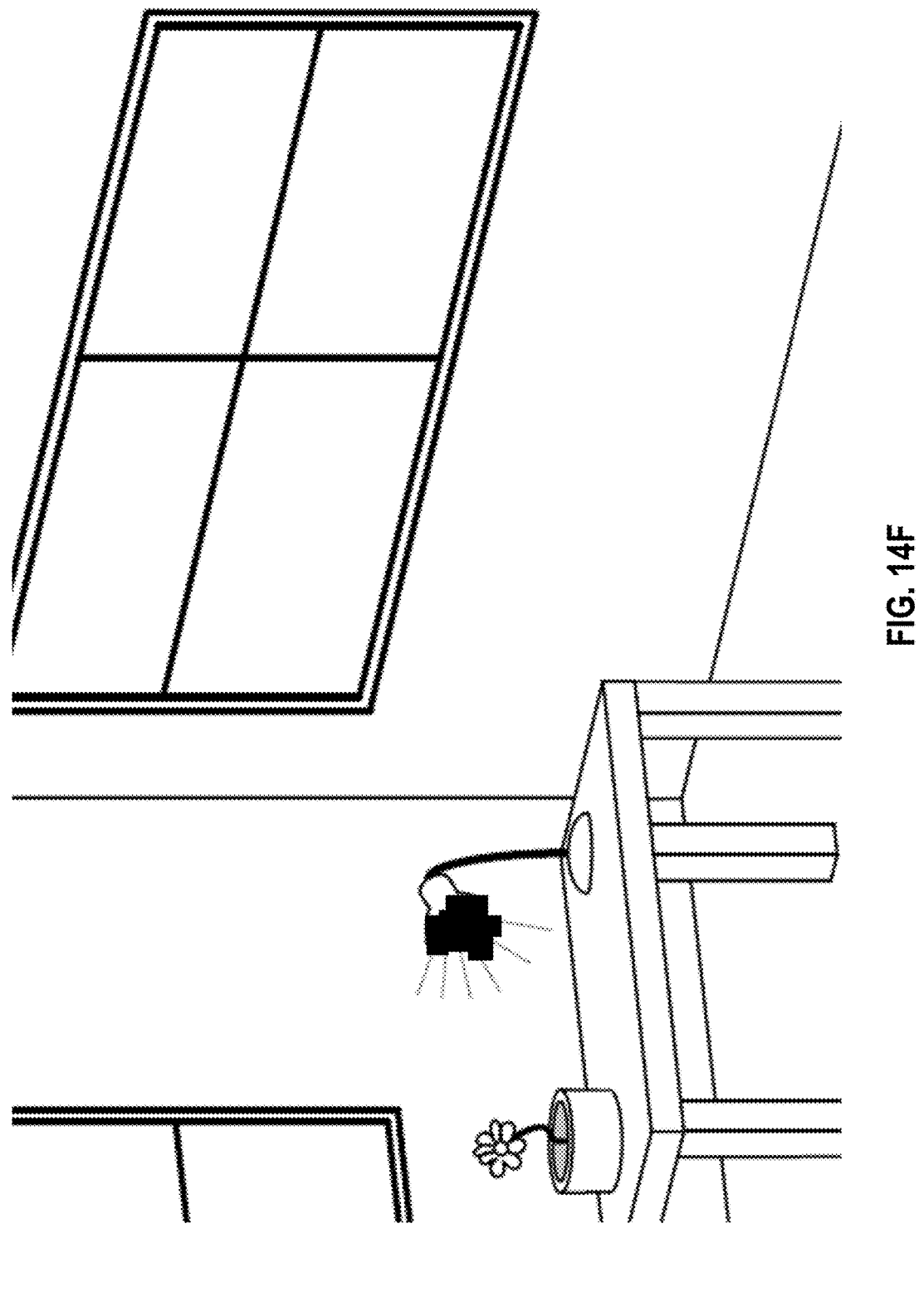
FIG. 14F depicts a consolidated image of an environment scene based on the scenes depicted in FIG. 14E

FIG. 14F depicts a consolidated image of an environment scene based on the scenes depicted in FIG. 14E. More specifically, FIG. 14F depicts an example consolidated masked digital image 1420 of the environment 1400 comprising the masking of the alterable feature depicted in masked scene 1418. For example, output masked digital image 1420 may correspond to a digital image formed from multiple scenes captured by the intelligent sensors 900(*a*)-900(*d*) and subsequently compiled by an image processing system 1110.

FIG. 14G depicts the example captured environment of FIG. 14C, as captured by an intelligent sensor array and responsively acted upon by one or more contextual modifiers operating at the intelligent sensors 900(*a*)-900(*d*). FIG. 14G further includes a spatial sensor 1422, such as an orientation sensor and/or a contextual sensor which tracks an orientation of the intelligent sensor array comprising intelligent sensors 900(*a*)-900(*d*). Spatial sensor 1422 may include thereon spatial data 1424. Spatial data 1424 may be some data related to a spatial location of the intelligent sensor array within the environment 1400, include the past, present, and future positions of the sensors, as well as movement vectors actively measured by the spatial sensor 1422.

Figure 14H:
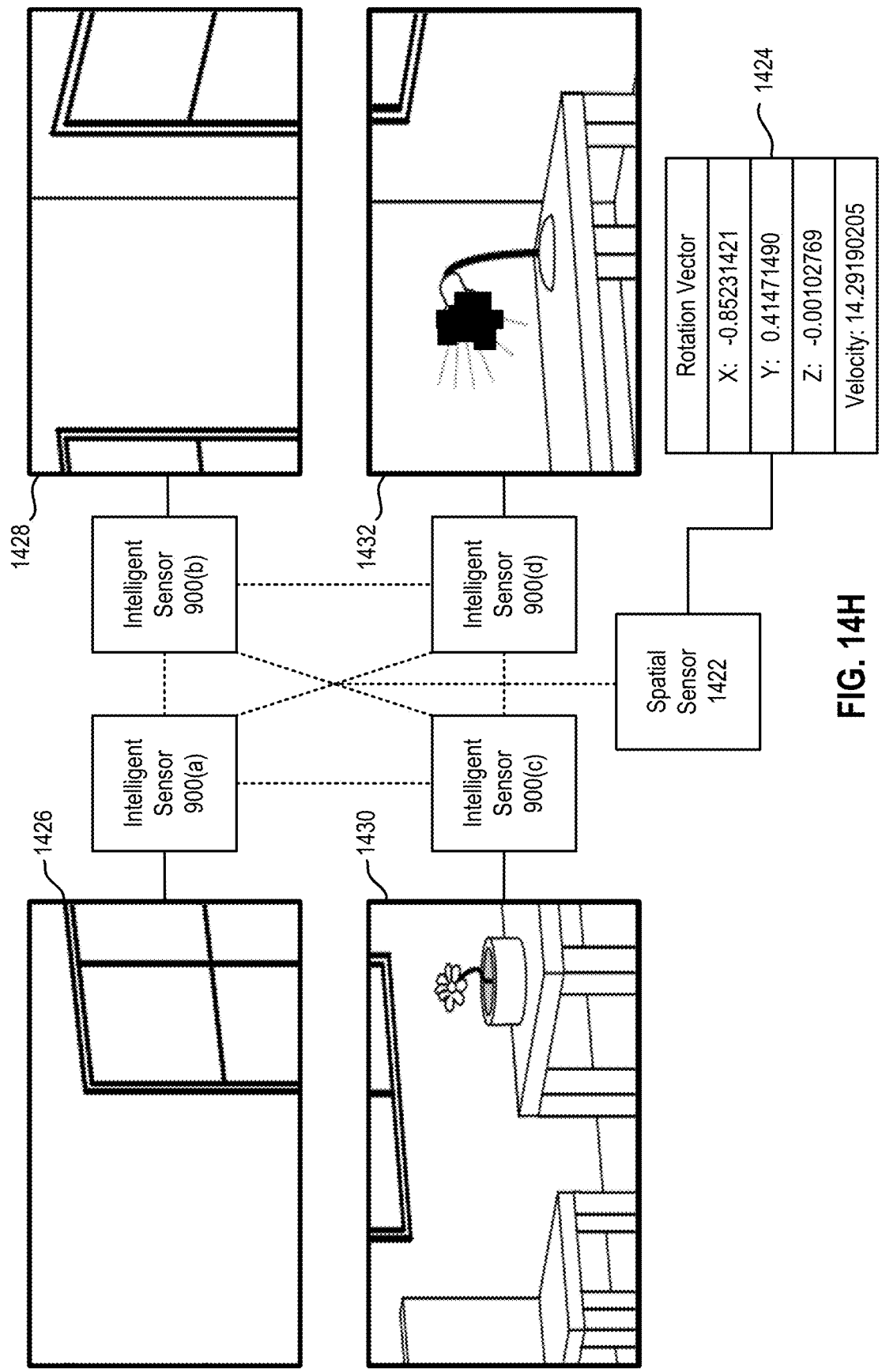
FIG. 14H depicts the example captured environment of FIG. 14G subsequent to a movement of the intelligent sensor array as predicted by spatial sensor.

FIG. 14H depicts the example captured environment of FIG. 14G subsequent to a movement of the intelligent sensor array as predicted by spatial sensor 1302. FIG. 14H further includes new scenes 1426-1432 corresponding respectively to intelligent sensors 900(*a*)-900(*d*). As discussed herein spatial data 1426 from spatial sensor 1422 may be used by contextual modifiers included on intelligent sensors 900(*a*)-900(*d*) to alter the manner in which a scene is transformed. For example, intelligent sensor 900(*d*) may utilize scene metadata from intelligent sensor 900(*c*) and spatial data 1426 to determine that the bright lamp 1404 will be depicted in scene 1432 subsequent to a rotation of the sensor array. Intelligent sensor may then responsively detect the bright lamp 1404 in scene 1432 and mask the associated pixels without performing a full analysis of prediction data alone.

Figure 14I:
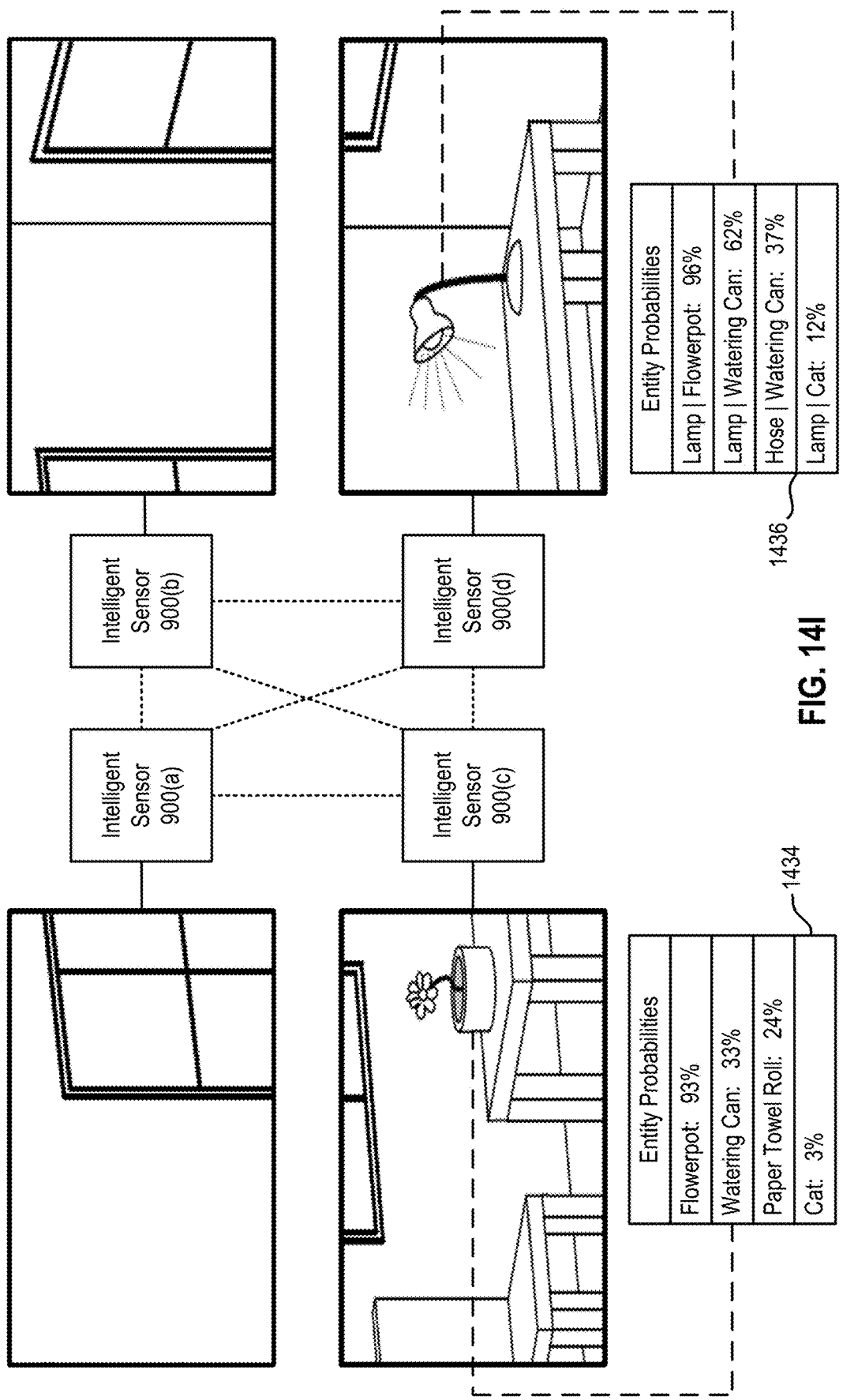

FIG. 14I depicts an alternative example captured environment of FIG. 14G in which no spatial data is present. As depicted in FIG. 14I, each of scenes 1426-1432 are shown with the respective capturing intelligent sensors 900(*a*)-900(*d*). Scenes 1430 and 1432 depict scenes including the potted plant 1402 and bright lamp 1404 as captured by intelligent sensor 900(*c*) and 900(*d*) respectively. Intelligent sensor 900(*c*) may utilize a contextual modifier to determine a probability that potted plant 1402 is a type of feature depicted in scene 1430, as reflected in probabilities table 1434. Intelligent sensor 900(*c*) may then sent these probabilities via image metadata to intelligent sensor 900(*d*). Intelligent sensor 900(*d*) may use the image metadata to determine a probability that the bright lamp 1404 is a type of features depicted in scene 1432, given that the feature in scene 1430 is likely a potted plant, as reflected in probabilities table 1434. As depicted in FIG. 14I, probability table 1436 comprising a probability value that the detected feature is a bright lamp 1404 given that another detected features in the scene is a potted plant 1402. Intelligent sensor 900(*d*) may then turn off sensing, or otherwise mask the image in response.

In some embodiments an intelligent sensor may send a metadata indication to another intelligent sensor in the sensor array that the intelligent sensor has transformed an image based on predicted alterable features of an image. The indication may be used to alter confidence values of the other intelligent sensors feature determination. In various embodiments, thresholds may be used to determine whether a feature is an alterable feature. For example, only features corresponding to a confidence value above a threshold of confidence may be predicted to be present in an image frame. The thresholds employed by the intelligent sensor may be set locally at the intelligent sensor or sent to the intelligent sensor from another system.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may include a general-purpose computing device selectively activated or reconfigured by a computer program stored in the computer. Such a computer program may be stored in a non-transitory, tangible computer-readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may include information resulting from a computing process, where the information is stored on a non-transitory, tangible computer-readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A sensor apparatus comprising:
an array of pixel cells, each pixel cell of the array of pixel cells including one or more photodiodes configured to generate a charge in response to light, and a charge storage device of one or more charge storage devices to convert the charge to output a voltage of an array of voltages;
one or more analog-to-digital converters (ADC) configured the convert the array of voltages to first pixel data; and
a controller configured to:
receive the first pixel data from the ADC;
input the first pixel data into a machine-learning model to generate output data comprising prediction data associated with one or more features of the first pixel data;
generate, based on the prediction data, second pixel data, the second pixel data associated with one or more transformed features of the first pixel data; and
send, from the sensor apparatus to a separate receiving apparatus, the second pixel data.

2. The apparatus of claim 1, wherein:
the sensor apparatus is a first sensor apparatus;
the controller is further configured to receive, from a second sensor apparatus, pixel metadata, the pixel metadata associated one or more aspects of third pixel data; and
generating the second pixel data is further based on the pixel metadata.

3. The apparatus of claim 2, wherein the pixel metadata is input to the machine-learning model to generate the output data.

4. The apparatus of claim 2, wherein the one or more aspects of the third pixel data comprise one or more features of the third pixel data.

5. The apparatus of claim 1, wherein the sensor apparatus is a first sensor apparatus and the controller is further configured to:
generate, based on the first pixel data, pixel metadata, the pixel metadata associated with one or more aspects of the first pixel data; and
send, to a second sensor apparatus, the pixel metadata.

6. The apparatus of claim 1, wherein the sensor apparatus is a first sensor apparatus and the controller is further configured to:
generate, based on the second pixel data, pixel metadata, the pixel metadata associated with one or more aspects of the second pixel data; and
send, to a second sensor apparatus, the pixel metadata.

7. The apparatus of claim 1, wherein:
the controller is further configured to receive, from an orientation sensor apparatus, orientation metadata, the orientation metadata associated with an orientation of at least the sensor apparatus; and
generating the second pixel data is further based on the orientation metadata.

8. The apparatus of claim 1, wherein the controller is further configured to input contextual data into the machine-learning model to generate the output data, the contextual data associated with one or more contexts related to the first pixel data.

9. The apparatus of claim 8, wherein:
the sensor apparatus is a first sensor apparatus; and
the contextual data is sent to the first sensor apparatus from a second sensor apparatus configured to generate the contextual data.

10. The apparatus of claim 8, wherein the controller is further configured to generate, based on the first pixel data, the contextual data.

11. The apparatus of claim 1, wherein the first pixel data is first digital pixel data comprising one or more first digital pixel data values representing a first digital image.

12. The apparatus of claim 11, wherein:
the one or more features of the first pixel data comprise one or more alterable features;
the second pixel data is pixel metadata associated with the first digital pixel data, the pixel metadata comprising at least an indication that the first pixel data comprises the one or more alterable features; and
sending the second pixel data comprises sending the pixel metadata to the separate receiving apparatus instead of the first pixel data.

13. The apparatus of claim 12, wherein the controller is further configured to, in response to sending the pixel metadata to the separate receiving apparatus, send an indication to the one or more charge storage devices to prevent conversion of the charges to output the array of voltages.

14. The apparatus of claim 13, wherein the controller is further configured to:
receive, from an orientation sensor apparatus, orientation metadata, the orientation metadata associated with an orientation of at least the sensor apparatus;
determine, based on the orientation metadata, that third pixel data to be converted by the ADC will not include the one or more alterable features; and
send an indication to the one or more charge storage devices to resume conversion of the charges to output the array of voltages.

15. The apparatus of claim 11, wherein the second pixel data is second digital pixel data comprising one or more second digital pixel data values representing a second digital image, at least a subset of the one or more second digital pixel data values being transformed second digital pixel data values associated with one or more transformed features.

16. The apparatus of claim 15, wherein generating the second pixel data comprises transforming at least a subset of one or more first digital pixel values into the transformed second digital pixel data values.

17. The apparatus of claim 16, wherein:
each digital pixel data value of the first digital pixel data values and the second digital pixel data values comprises one or more color values corresponding to a color of a pixel; and
transforming at least the subset of the one or more first digital pixel data values into the transformed second digital pixel data values comprises altering a subset of the one or more color values of the subset of the one or more first digital pixel data values.

18. The apparatus of claim 15, wherein:
the one or more features of the first pixel data comprise one or more alterable features; and
generating the second pixel data comprises generating the transformed second digital pixel data values associated with the one or more transformed features to replace a subset of one or more first digital pixel data values associated with the one or more alterable features.

19. The apparatus of claim 15, wherein sending the second pixel data to the separate receiving apparatus comprises sending the one or more second digital pixel data values and not the transformed second digital pixel data values to the separate receiving apparatus.

20. A method comprising:
operating each pixel cell of an array of pixel cells to generate a charge in response to light, and to convert the charge to output a voltage of an array of voltages;
converting an array of voltages to first pixel data;
inputting the first pixel data into a machine-learning model to generate output data comprising prediction data associated with one or more features of the first pixel data;
generating, based on the prediction data, second pixel data, the second pixel data associated with one or more transformed features of the first pixel data; and
sending, the second pixel data to a receiving apparatus.

* * * * *